(12) United States Patent
Maeda et al.

(10) Patent No.: US 9,853,005 B2
(45) Date of Patent: Dec. 26, 2017

(54) SEMICONDUCTOR DEVICE AND METHOD OF MANUFACTURING THE SAME

(71) Applicant: Renesas Electronics Corporation, Kawasaki-shi (JP)

(72) Inventors: Takehiko Maeda, Takasaki (JP); Akira Yajima, Hitachinaka (JP); Satoshi Itou, Hitachinaka (JP); Fumiyoshi Kawashiro, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/792,461

(22) Filed: Jul. 6, 2015

(65) Prior Publication Data

US 2016/0013142 A1 Jan. 14, 2016

(30) Foreign Application Priority Data

Jul. 9, 2014 (JP) .................................. 2014-141591
May 22, 2015 (JP) .................................. 2015-104883

(51) Int. Cl.
*H01L 23/48* (2006.01)
*H01L 23/00* (2006.01)

(52) U.S. Cl.
CPC .............. *H01L 24/05* (2013.01); *H01L 24/03* (2013.01); *H01L 24/08* (2013.01); *H01L 24/48* (2013.01);
(Continued)

(58) Field of Classification Search
CPC ......... H01L 24/03; H01L 24/05; H01L 24/08; H01L 24/48; H01L 24/85
(Continued)

(56) References Cited

U.S. PATENT DOCUMENTS 8,063,489 B2 * 11/2011 Shigihara ................ H01L 24/05
257/741
8,076,780 B2 * 12/2011 Saigoh ................ H01L 23/3157
257/760
(Continued)

FOREIGN PATENT DOCUMENTS

JP H 09-74097 A 3/1997
JP 2001-196413 A 7/2001
(Continued)

*Primary Examiner* — Hung Vu
(74) *Attorney, Agent, or Firm* — McGinn IP Law Group, PLLC

(57) ABSTRACT

An improvement is achieved in the reliability of a semiconductor device. Over a semiconductor substrate, an interlayer insulating film is formed and, over the interlayer insulating film, a pad is formed. Over the interlayer insulating film, an insulating film is formed so as to cover the pad. In the insulating film, an opening is formed to expose a part of the pad. The pad is a pad to which a copper wire is to be electrically coupled and which includes an Al-containing conductive film containing aluminum as a main component. Over the Al-containing conductive film in a region overlapping the opening in plan view, a laminated film including a barrier conductor film, and a metal film over the barrier conductor film is formed. The metal film is in an uppermost layer. The barrier conductor film is a single-layer film or a laminated film including one or more layers of films selected from the group consisting of a Ti film, a TiN film, a Ta film, a TaN film, a W film, a WN film, a TiW film, and a TaW film. The metal film is made of one or more metals selected from the group consisting of Pd, Au, Ru, Rh, Pt, and Ir.

6 Claims, 42 Drawing Sheets

(52) U.S. Cl.
CPC ............ *H01L 24/85* (2013.01); *H01L 24/45* (2013.01); *H01L 2224/02166* (2013.01); *H01L 2224/04042* (2013.01); *H01L 2224/05124* (2013.01); *H01L 2224/05553* (2013.01); *H01L 2224/05582* (2013.01); *H01L 2224/05644* (2013.01); *H01L 2224/05664* (2013.01); *H01L 2224/05666* (2013.01); *H01L 2224/05669* (2013.01); *H01L 2224/05676* (2013.01); *H01L 2224/05678* (2013.01); *H01L 2224/05684* (2013.01); *H01L 2224/45144* (2013.01); *H01L 2224/45147* (2013.01); *H01L 2224/48463* (2013.01); *H01L 2224/48799* (2013.01); *H01L 2924/181* (2013.01)

(58) Field of Classification Search
USPC ............... 257/666, 676, 751, 761, 762, 784
See application file for complete search history.

(56) References Cited

U.S. PATENT DOCUMENTS

| | | |
|---|---|---|
| 2001/0008311 A1 | 7/2001 | Harada et al. |
| 2002/0027289 A1 | 3/2002 | Kurihara et al. |
| 2010/0133688 A1 | 6/2010 | Shigihara et al. |

FOREIGN PATENT DOCUMENTS

| | | |
|---|---|---|
| JP | 2002-076051 A | 3/2002 |
| JP | 2010-157683 A | 7/2010 |
| JP | 2013-004781 A | 1/2013 |

* cited by examiner

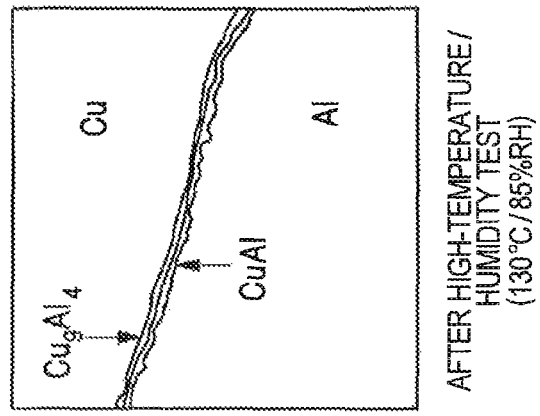
FIG. 23A · FIG. 23B · FIG. 23C
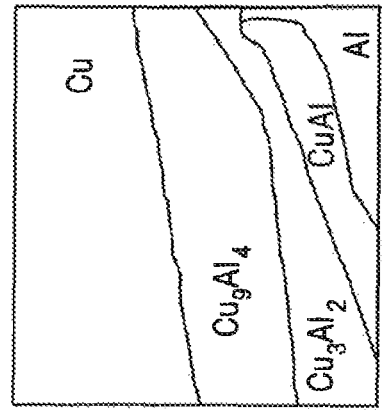
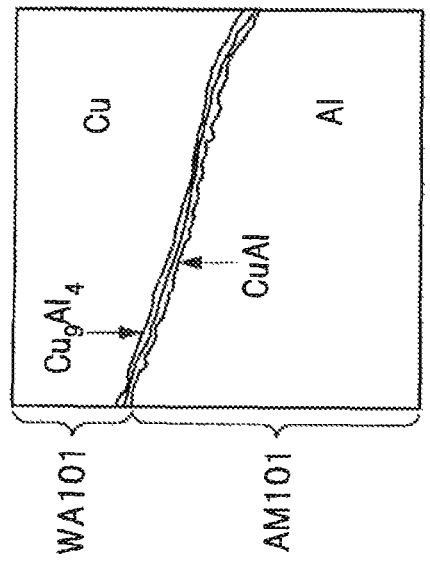

AFTER ASSEMBLY

AFTER HIGH-TEMPERATURE STORAGE TEST (240°C)

AFTER HIGH-TEMPERATURE / HUMIDITY TEST (130°C / 85%RH)

SEMICONDUCTOR DEVICE AND METHOD OF MANUFACTURING THE SAME

CROSS-REFERENCE TO RELATED APPLICATION

The disclosures of Japanese Patent Application No. 2014-141591 filed on Jul. 9, 2014 and No. 2015-104883 filed on May 22, 2015 including the specification, drawings and abstract are incorporated herein by reference in its entirety.

TECHNICAL FIELD OF THE INVENTION

The present invention relates to a semiconductor device and a method of manufacturing the same and can be used appropriately for a semiconductor device having, e.g., a pad and a method of manufacturing the same.

BACKGROUND OF THE INVENTION

A semiconductor device is manufactured by forming a semiconductor element such as a MISFET in a semiconductor substrate, forming a multilayer wiring structure having a plurality of wiring layers over the semiconductor substrate, and forming a passivation film in the uppermost layer thereof. The semiconductor device has a pad for wire bonding. The pad is exposed from an opening provided in the passivation film. Examples of a wire coupled to the pad include a gold wire and a copper wire.

Japanese Unexamined Patent Publication No. 2013-4781 (Patent Document 1) describes a technique related to a semiconductor device which can be electrically coupled using a bonding wire containing copper as a main component.

Japanese Unexamined Patent Publication No. 2002-76051 (Patent Document 2) describes a technique related to a bonding pad structure in a semiconductor device.

Japanese Unexamined Patent Publication No. Hei 9(1997)-74097 (Patent Document 3) describes a technique related to a method of forming a barrier metal.

SUMMARY OF THE INVENTION

In a semiconductor device having a pad also, it is desired to maximally improve the performance thereof.

Other problems and novel features of the present invention will become apparent from a statement in the present specification and the accompanying drawings.

Further, when a temperature variation ratio of any of the plurality of resistance components and the electrostatic capacity components is large, it is difficult to maintain a constant time constant over the entire range of an assumed temperature range for the display to be used and it is hard to ensure reliability of the display.

According to an embodiment, in a semiconductor device having a pad to which a copper wire is to be electrically coupled, the pad includes an Al-containing conductive film containing aluminum as a main component. In a region to which the copper wire is to be coupled, a first laminated film including a first conductor film, and a second conductor film over the first conductor film is formed over the Al-containing conductive film. The second conductor film is in an uppermost layer. The first conductor film is a single-layer film or a laminated film including one or more layers of films selected from the group consisting of a titanium film, a titanium nitride film, a tantalum film, a tantalum nitride film, a tungsten film, a tungsten nitride film, a titanium-tungsten film, and a tantalum-tungsten film. The second conductor film is made of one or more metals selected from the group consisting of palladium, gold, ruthenium, rhodium, platinum, and iridium.

According to the embodiment, a semiconductor device includes a semiconductor chip having a pad, a copper wire electrically coupled to the pad of the semiconductor chip, and a sealing resin portion sealing therein the semiconductor chip, and the copper wire. The pad includes an Al-containing conductive film containing aluminum as a main component. Between the copper wire and the Al-containing conductive film, a first laminated film including a first conductor film, and a second conductor film over the first conductor film is interposed. The copper wire is bonded to the second conductor film. The first conductor film is a single-layer film or a laminated film including one or more layers of films selected from the group consisting of a titanium film, a titanium nitride film, a tantalum film, a tantalum nitride film, a tungsten film, a tungsten nitride film, a titanium-tungsten film, and a tantalum-tungsten film. The second conductor film is made of one or more metals selected from the group consisting of palladium, gold, ruthenium, rhodium, platinum, and iridium.

According to the embodiment, a method of manufacturing a semiconductor device includes the steps of: (a) providing a semiconductor substrate; (b) forming, over a main surface the semiconductor substrate, a first insulating film; and (c) forming, over the first insulating film, an Al-containing conductive film containing aluminum as a main component. The method of manufacturing the semiconductor device further includes the steps of: (d) patterning the Al-containing conductive film to form a pad; (e) forming, over the first insulating film, a second insulating film so as to cover the pad therewith; (f) forming an opening in the second insulating film; and (g) electrically coupling a copper wire to the pad exposed from the opening. The method of manufacturing the semiconductor device further includes the steps of: (h) after the step (c) and before the step (g), forming a first conductor film over the Al-containing conductive film; and (i) after the step (h) and before the step (g), forming a second conductor film over the first conductor film. The first conductor film is a single-layer film or a laminated film including one or more layers of films selected from the group consisting of a titanium film, a titanium nitride film, a tantalum film, a tantalum nitride film, a tungsten film, a tungsten nitride film, a titanium-tungsten film, and a tantalum-tungsten film. The second conductor film is made of one or more metals selected from the group consisting of palladium, gold, ruthenium, rhodium, platinum, and iridium.

According to the embodiment, the reliability of the semiconductor device can be improved.

BRIEF DESCRIPTIONS OF THE DRAWINGS

FIGS. 23A to 23C are cross-sectional views each showing the vicinity of a region where the copper wire is coupled to the pad in the semiconductor device in the first studied example;

DESCRIPTIONS OF THE PREFERRED EMBODIMENTS

Figure 1:
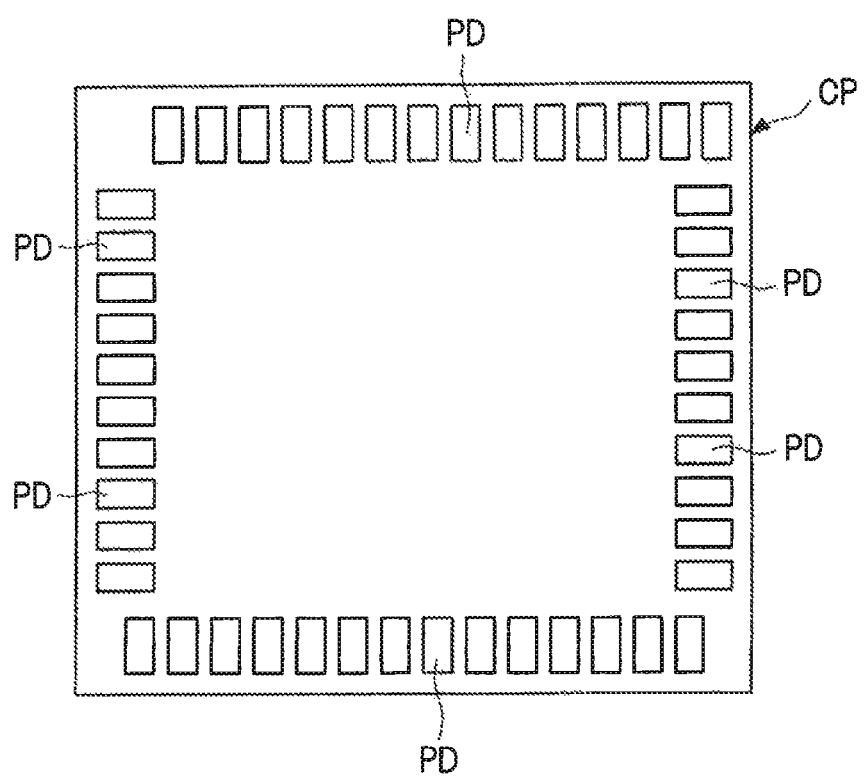
FIG. 1 is an overall plan view of a semiconductor device in an embodiment.

In the following embodiments, if necessary for the sake of convenience, each of the embodiments will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others. Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

The embodiments of the present invention will be described below in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

First Embodiment

<About Overall Structure of Semiconductor Chip>

Referring to the drawings, a semiconductor device in the present embodiment will be described.

FIG. 1 is an overall plan view of a semiconductor device (semiconductor chip) CP in the present embodiment. FIG. 1 shows an overall plan view of the upper surface side of the semiconductor device CP.

The semiconductor device (semiconductor chip) CP in the present embodiment has an upper surface as one main surface, and a back surface (lower surface) opposite to the upper surface. FIG. 1 shows the upper surface of the semiconductor device CP. It is assumed that, in the semiconductor device CP, the main surface formed with pads PD is referred to as the upper surface of the semiconductor device CP and the main surface opposite to the main surface (i.e., upper surface) formed with the pads PD is referred to as the back surface of the semiconductor device CP.

As shown in FIG. 1, the semiconductor device CP has the plurality of pads (pad electrodes, electrode pads, or bonding pads) PD on the upper surface side thereof. The pads PD function as terminals for the external coupling of the semiconductor device CP. The pads PD are wire bonding pads. When a semiconductor package or the like is manufactured using the semiconductor device CP, wires (corresponding to wires WA described later) are electrically coupled to the pads PD.

The two-dimensional shape of the semiconductor device CP is a quadrilateral, more specifically a rectangle. However, the corner portions of the rectangle may also be rounded off. As shown in FIG. 1, at the upper surface of the semiconductor device CP, the plurality of pads PD are arranged along the outer periphery thereof. In the case in FIG. 1, the plurality of pads PD are arranged (aligned) at the upper surface of the semiconductor device CP along the fourth sides thereof. However, the arrangement of the pads PD is not limited thereto. There may also be a case where the plurality of pads PD are arranged (aligned) along three, two, or one side thereof. In the case in FIG. 1, the pads are aligned in one row, but the alignment of the pads is not limited thereto. The pads can also be aligned in, e.g., two rows or in a staggered arrangement. Also, the number of the pads PD included in the semiconductor device CP can be changed as necessary.

<About Semiconductor Package Structure>

Figure 2:
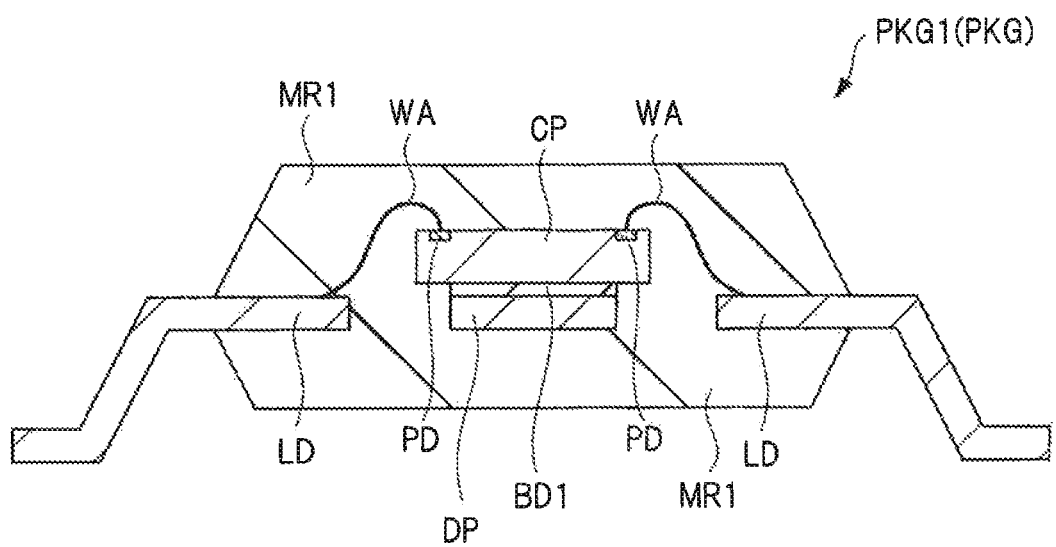
FIG. 2 is a cross-sectional view showing an example of a semiconductor device (semiconductor package) obtained by packaging the semiconductor device (semiconductor chip) in FIG. 1.
Figure 3:
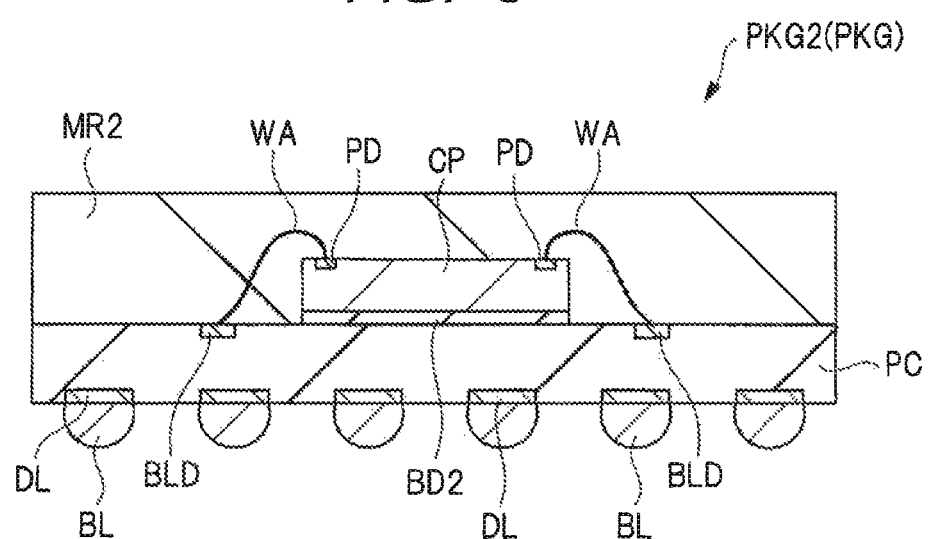
FIG. 3 is a cross-sectional view showing another example of the semiconductor device (semiconductor package) obtained by packaging the semiconductor device (semiconductor chip) in FIG. 1.

FIG. 2 is a cross-sectional view schematically showing an example of a semiconductor device (semiconductor package) PKG obtained by packaging the semiconductor device (semiconductor chip) CP in the present embodiment. FIG. 3 is a cross-sectional view showing another example. It is assumed that the semiconductor device PKG shown in FIG. 2 is designated by a reference numeral PKG1 and referred to as a semiconductor device PKG1, and the semiconductor device PKG shown in FIG. 3 is designated by a reference numeral PKG2 and referred to as a semiconductor device PKG2.

The semiconductor device (semiconductor package) PKG1 shown in FIG. 2 is a semiconductor package manufactured using a lead frame. The semiconductor device PKG1 has the semiconductor device (semiconductor chip) CP, a die pad (chip mounting portion) DP supporting or mounting thereon the semiconductor device CP, a plurality of leads LD, the plurality of wires (bonding wires) WA electrically coupling the plurality of leads LD to the plurality of pads PD in the upper surface of the semiconductor device CP, and a sealing portion MR1 sealing therein the semiconductor device CP, the die pad DP, the leads LD, the wires WA, and the pads PD.

The sealing portion (resin sealing portion) MR1 is a sealing resin portion and made of a resin material such as, e.g., a thermosetting resin material or the like. The sealing portion MR1 can also contain a filler or the like. By the sealing portion MR1, the semiconductor device CP, the plurality of leads LD, and the plurality of wires WA are sealed and electrically and mechanically protected.

The semiconductor device CP is mounted (placed) over the upper surface of the die pad DP such that the upper surface of the semiconductor device CP faces upward. The back surface of the semiconductor device CP is bonded and fixed to the upper surface of the die pad DP via a bonding material (die bond material or adhesive) BD1. The semiconductor device CP is sealed in the sealing portion MR1 and is not exposed from the sealing portion MR1.

Each of the leads (lead portions) LD is formed of a conductor and preferably made of a metal material such as copper (Cu) or a copper alloy. Each of the leads LD includes an inner lead portion as the portion of the lead LD which is located in the sealing portion MR1, and an outer lead portion as the portion of the lead LD which is located outside the sealing portion MR1. The outer lead portion protrudes from a side surface of the sealing portion MR1 to the outside of the sealing portion MR1.

The outer lead portion of each of the leads LD has been subjected to bending such the lower surface of the outer lead portion in the vicinity of the end portion thereof is located slightly below the lower surface of the sealing portion MR1. The outer lead portion of the lead LD functions as the external terminal of the semiconductor device PKG1.

The individual pads PD in the upper surface of the semiconductor device CP are electrically coupled to the respective inner lead portions of the individual leads LD via the wires (bonding wires) WA each serving as a conductive coupling member. That is, one of the both end portions of each of the wires WA is coupled to one of the pads PD of the semiconductor device CP, while the other end portion thereof is coupled to the upper surface of the inner lead portion of one of the leads LD. Note that, as will be described later in detail, the end portion of the wire WA coupled to the pad PD is actually coupled (bonded) to a metal film ME1 described later. Each of the wires WA has electrical conductivity and is specifically a copper (Cu) wire containing copper (Cu) as a main component. The wire WA is sealed in the sealing portion MR1 and is not exposed from the sealing portion MR1.

The semiconductor device (semiconductor package) PKG2 shown in FIG. 3 is a semiconductor package manufactured using a wiring substrate. The semiconductor device PKG2 has the semiconductor device (semiconductor chip) CP, a wiring substrate PC mounting (supporting) thereon the semiconductor device CP, the plurality of wires WA electrically coupling the plurality of pads PD in the upper surface of the semiconductor device CP to a plurality of coupling terminals BLD in the wiring substrate PC which correspond thereto, and a sealing portion MR2 covering the upper surface of the wiring substrate PC including the semiconductor device CP and the wires WA. The semiconductor device PKG2 further has a plurality of solder balls BL which are provided as external terminals in an area array arrangement at the lower surface of the wiring substrate PC.

The wiring substrate PC has an upper surface and a lower surface as main surfaces opposite to each other. The semiconductor device CP is mounted (placed) over the upper surface of the wiring substrate PC such that the upper surface of the semiconductor device CP faces upward. The back surface of the semiconductor device CP is bonded and fixed to the upper surface of the wiring substrate PC via a bonding material (die bond material or adjective) BD2. The semiconductor device CP is sealed in the sealing portion MR2 and is not exposed from the sealing portion MR2.

In the upper surface of the wiring substrate PC, the plurality of coupling terminals (bonding leads) BLD are provided while, in the lower surface of the wiring substrate PC, a plurality of conductive lands DL are provided. The plurality of coupling terminals BLD in the upper surface of the wiring substrate PC are individually electrically coupled to the plurality of conductive lands DL in the lower surface of the wiring substrate PC. The wires of the wiring substrate PC include the wires in the upper surface of the wiring substrate PC, via wires in the wiring substrate PC, internal wires in the wiring substrate PC, and the wires in the lower surface of the wiring substrate PC. To the respective conductive lands DL, solder balls BL are coupled (formed) as projecting electrodes. As a result, at the lower surface of the wiring substrate PC, the plurality of solder balls BL are arranged in an array configuration to be able to function as the external terminals of the semiconductor device PKG2.

The pads PD in the upper surface of the semiconductor device CP are electrically coupled to the respective coupling terminals BLD in the upper surface of the wiring substrate PC via wires (bonding wires) WA as conductive coupling members. That is, one of the both end portions of each of the wires WA is coupled to one of the pads PD in the semiconductor device CP, while the other end portion thereof is coupled to one of the coupling terminals BLD. Note that, as will be described later in detail, the end portion of the wire WA coupled to the pad PD is actually coupled (bonded) to the metal film ME1 described later. As described above, the wires WA are copper (Cu) wires each containing copper (Cu) as a main component. Each of the wires WA is sealed in the sealing portion MR2 and is not exposed from the sealing portion MR2.

Similarly to the foregoing sealing portion MR1, the sealing portion (sealing resin portion) MR2 is a resin sealing portion and made of a resin material such as, e.g., a thermosetting resin material or the like. The sealing portion MR2 may also contain a filler or the like. By the sealing portion MR2, the semiconductor device CP and the plurality of wires WA are sealed and electrically and mechanically protected.

Figure 4:
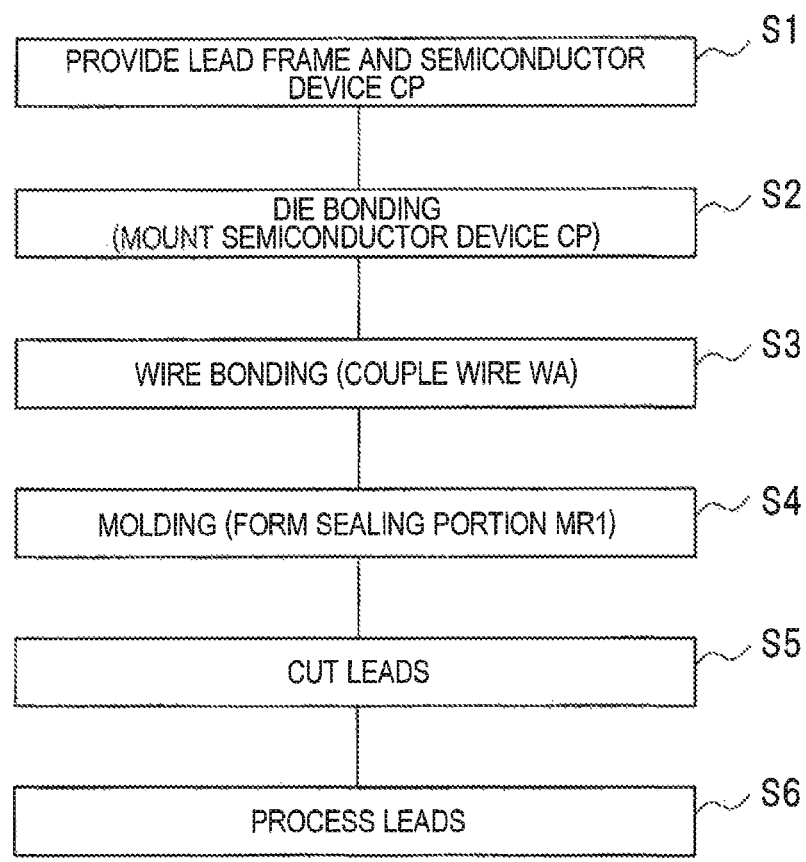
FIG. 4 is a process flow chart showing the manufacturing process of the semiconductor device shown in FIG. 2.
Figure 5:
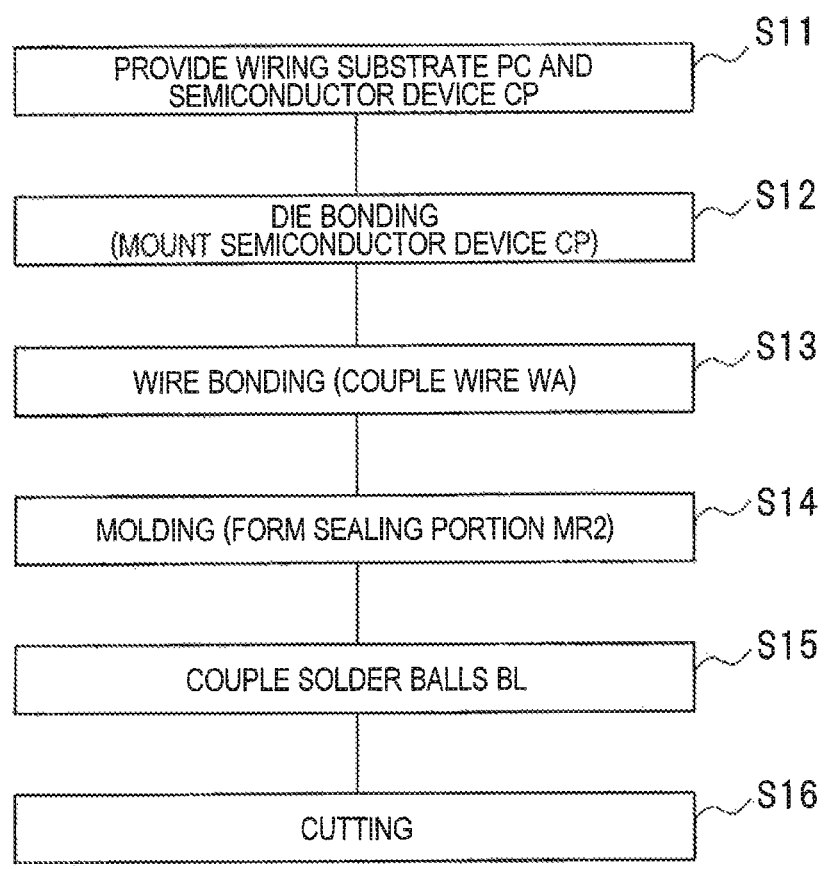
FIG. 5 is a process flow chart showing the manufacturing process of the semiconductor device shown in FIG. 3.

Next, a description will be given of the manufacturing process of the semiconductor device PKG1 shown in FIG. 2 and the manufacturing process of the semiconductor device PKG2 shown in FIG. 3. FIG. 4 is a process flow chart showing the manufacturing process of the semiconductor device PKG1 shown in FIG. 2. FIG. 5 is a process flow chart showing the manufacturing process of the semiconductor device PKG2 shown in FIG. 3.

First, a description will be given of the manufacturing process of the semiconductor device PKG1 shown in FIG. 2 with reference to FIGS. 2 and 4.

To manufacture the semiconductor device PKG1, first, the lead frame and the semiconductor device (semiconductor chip) CP are provided (Step S1 in FIG. 4). The lead frame integrally has a framework, the plurality of leads LD coupled to the framework, and the die pad DP connected to the framework via a plurality suspension leads. In Step S1, it may be possible to provide the lead frame first and then provide the semiconductor device CP, provide the semiconductor device CP first and then provide the lead frame, or simultaneously provide the lead frame and the semiconductor device CP.

Next, by performing a die bonding step, the semiconductor device CP is mounted over the die pad DP of the lead frame via the bonding material BD1 and bonded thereto (Step S2 in FIG. 4).

Next, by performing a wire bonding step, the plurality of pads PD of the semiconductor device CP are individually electrically coupled to the plurality of leads LD (the inner lead portions thereof) of the lead frame via the plurality of wires (bonding wires) WA (Step S3 in FIG. 4). One end portion of each of the wires WA is coupled to one of the pads PD (specifically, the metal film ME1 described later) of the semiconductor device CP, while the other end portion thereof is coupled to the upper surface of the inner lead portion of one of the leads LD. In wire bonding, the semiconductor device CP is heated to a predetermined temperature.

Next, resin sealing is performed by a mold step (resin molding step) to seal the semiconductor device CP and the plurality of wires WS coupled thereto in the sealing portion (sealing resin portion) MR1 (Step S4 in FIG. 4). By the mold step in Step S4, the sealing portion MR1 sealing therein the semiconductor device CP, the die pad DP, the inner lead portions of the plurality of leads LD, the plurality of wires WA, and the suspension leads is formed.

Next, the outer lead portions of the leads LD exposed from the sealing portion MR1 are subjected to plating as necessary. Then, outside the sealing portion MR1, the leads LD and the suspension leads are cut at predetermined positions to be separated from the framework of the lead frame (Step S5 in FIG. 4).

Next, the outer lead portions of the leads LD protruding from the sealing portion MR1 are subjected to bending (lead processing or lead forming) (Step S6 in FIG. 4).

In this manner, the semiconductor device PKG1 shown in FIG. 2 is manufactured.

Next, a description will be given of the manufacturing process of the semiconductor device PKG2 shown in FIG. 3 with reference to FIGS. 3 and 5.

To manufacture the semiconductor device PKG2, first, the wiring substrate PC and the semiconductor device (semiconductor chip) CP are provided (Step S11 in FIG. 5). At this stage, a plurality of the wiring substrates PC may also be connected integrally in an array configuration. In Step S11, it may also be possible to provide the wiring substrate PC first and then provide the semiconductor device CP, provide the semiconductor device CP first and then provide the wiring substrate PC, or simultaneously provide the wiring substrate PC and the semiconductor device CP.

Next, by performing a die bonding step, the semiconductor device (semiconductor chip) CP is mounted over the wiring substrate PC via the bonding material BD2 and bonded thereto (Step S12 in FIG. 5).

Next, by performing a wire bonding step, the plurality of pads PD of the semiconductor device CP are individually electrically coupled to the plurality of coupling terminals BLD of the wiring substrate PC on which the semiconductor device CP is mounted via the plurality of wires (bonding wires) WA (Step S13 in FIG. 5). One end portion of each of the wires WS is coupled to one of the pads PD (specifically, the metal wire ME1 described later) of the semiconductor device CP, while the other end portion thereof is coupled to one of the coupling terminals BLD. In wire bonding, the semiconductor device CP is heated to a predetermined temperature.

Next, resin sealing is performed by a mold step (resin molding step) to form the sealing portion (sealing resin portion) MR2 over the upper surface of the wiring substrate PC so as to cover the semiconductor device CP and the wires WS therewith and seal the semiconductor device CP and the wires WS in the sealing portion MR2 (Step S14 in FIG. 5).

Next, to the respective conductive lands DL at the lower surface of the wiring substrate PC, the solder balls BL are coupled (Step S15 in FIG. 5).

Then, in the case where the plurality of wiring substrates PC are integrally connected in an array configuration, a wiring mother substrate in which the plurality of wiring substrates PC are integrally connected in the array configuration is subjected to cutting (dicing) to be divided into the individual wiring substrates PC (Step S16 in FIG. 5). At this time, there may also be a case where the sealing portion MR2 is cut together with the wiring mother substrate.

In this manner, the semiconductor device PKG2 shown in FIG. 3 is manufactured.

<About Internal Structure of Semiconductor Chip>

Figure 6:
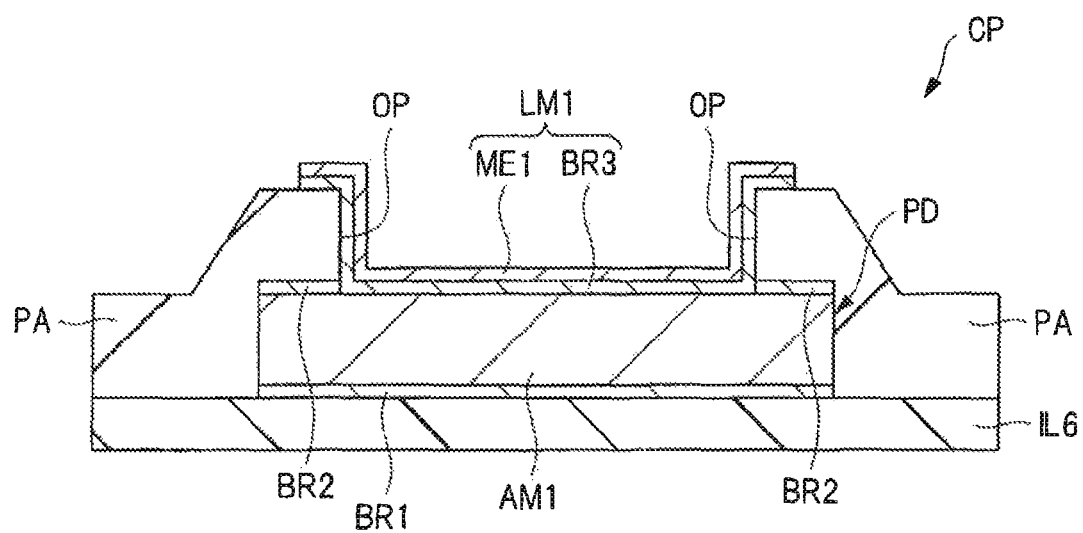
FIG. 6 is a main-portion cross-sectional view of the semiconductor device in the embodiment.

FIG. 6 is a main-portion cross-sectional view of the semiconductor device (semiconductor chip) CP in the present embodiment and shows a cross section traversing the pad PD. Note that, in FIG. 6, the illustration of the structure located below the interlayer insulating film IL6 is omitted.

As shown in FIG. 6, the pad PD is formed over the interlayer insulating film IL6. Over the interlayer insulating film IL6, an insulating film (passivation film) PA is formed so as to cover a part of the pad PD. The pad PD is partly exposed from an opening OP provided in the insulating film PA. That is, the opening OP is an opening for the pad PD and formed so as to be included in the pad PD in plan view. Accordingly, the two-dimensional size (plane area) of the opening OP is smaller than the two-dimensional size (plane area) of the pad PD. The pad PD has the portion (i.e., portion overlapping the opening OP in plan view) exposed from the opening OP and the portion (i.e., portion not overlapping the opening OP in plan view) covered with the insulating film PA.

The insulating film PA is in the uppermost layer of the semiconductor device (semiconductor chip) CP and can function as a surface protective film. That is, the insulating film PA is a passivation film. The two-dimensional shape of each of the pad PD and the opening OP is, e.g., a quadrilateral (more specifically, a square). As the insulating film PA, a single-layer insulating film or a laminated insulating film in which a plurality of insulating films are laminated can be used. In another form, it is also possible to further provide another insulating film over the insulating film PA. However, the state where the pad PD is partly exposed from the opening OP is maintained.

The pad PD is an aluminum pad formed mainly of aluminum (Al). Specifically, the pad PD is formed of a laminated film including a barrier conductor film (barrier conductive film) BR1, an Al-containing conductive film AM1 over the barrier conductor film BR1, and a barrier conductor film (barrier conductive film) BR2 over the Al-containing conductive film AM1. Note that, in the portion of the pad PD which is located under the insulating film PA, the barrier conductor film BR2 is formed over the Al-containing conductive film AM1. By contrast, in the portion of the pad PD which is exposed from the opening OP of the insulating film PA, the barrier conductor film BR2 is not formed over the Al-containing conductive film AM1. This is because the portion of the barrier conductor film BR2 which was exposed from the opening OP of the insulating film PA has been removed.

The Al-containing conductive film AM1 is a conductive film containing Al (aluminum) and preferably made of a conductive material film (conductive material film showing metal conduction) containing aluminum (Al) as a main component (base). As the Al-containing conductive film AM1, an aluminum film (pure aluminum film) can be used, but the Al-containing conductive film AM1 is not limited thereto. As the Al-containing conductive film AM1, a compound film or an alloy film containing aluminum (Al) as a main component (base) can also be used. For example, a compound film or an alloy film between Al (aluminum) and Si (silicon), a compound film or an alloy film between Al (aluminum) and Cu (copper), or a compound film or an alloy film between Al (aluminum), Si (silicon), and Cu (copper) can be used appropriately as the Al-containing conductive film AM1. The composition ratio (content) of Al (aluminum) in the Al-containing conductive film AM1 is higher than 50 at % (i.e., rich in Al), or more preferably not less than 98 at %.

Each of the barrier conductor films BR1 and BR2 is a conductive film (preferably conductive film showing metal conduction). Of the barrier conductor films BR1 and BR2, the barrier conductor film BR1 has the function of improving adhesion to an underlay (e.g., interlayer insulating film IL6) and preventing peeling. Accordingly, it is desirable that the barrier conductor film BR1 has excellent adhesion to an underlay (e.g., interlayer insulating film IL6) and excellent adhesion to the Al-containing conductive film AM1 formed over the barrier conductor film BR1. As the barrier conductor film BR1, a laminated film including, e.g., a titanium (Ti) film, a titanium nitride (TiN) film, and a titanium (Ti) film which are successively laminated in ascending order can be used appropriately. Besides, e.g., a single-layer titanium (Ti) film, a single-layer titanium nitride (TiN) film, a laminated film including a titanium (Ti) film and a titanium nitride (TiN) film, or the like can be used as barrier conductor film BR1.

The barrier conductor film BR2 has the function of improving adhesion to the insulating film PA and preventing peeling. Accordingly, it is desirable that the barrier conductor film BR2 has excellent adhesion to the underlying Al-containing conductive film AM1 and excellent adhesion to the insulating film PA formed over the barrier conductor film BR2. The barrier conductor film BR2 can also function as an antireflection film in a photolithographic step. When the function of the barrier conductor film BR2 as the antireflection film is insufficient, it is also possible to form a BARC (Bottom Anti-Reflective Coating) under a photoresist layer (photoresist layer for forming a photoresist pattern RP1 described later) in the photolithographic step.

As the barrier conductor film BR1, a titanium nitride (TiN) film can be used appropriately. Besides, e.g., a titanium (Ti) film, a tantalum (Ta) film, a tantalum nitride (TaN) film, a tungsten (W) film, a tungsten nitride (WN) film, a titanium-tungsten (TiW) film, or a tantalum-tungsten (TaW) film can be used as the barrier conductor film BR2.

The Al-containing conductive film AM1 can also function as the main conductor film of the pad PD. The thickness of the Al-containing conductive film AM1 is larger (thicker) than the thickness of each of the barrier conductor films BR1 and BR2. Since the pad PD is formed mainly of the Al-containing conductive film AM1, the pad PD can be regarded as an aluminum pad.

Over the inner surface (inner wall) of the opening OP of the insulating film PA including the upper surface of the pad PD exposed from the opening OP of the insulating film PA, a laminated film (laminated film pattern) LM1 including a barrier conductor film BR3, and the metal film ME1 over the barrier conductor film BR3 is formed. The laminated film LM1 is formed to extend over the pad PD exposed at the bottom portion of the opening OP in the insulating film PA, the side surface (side wall) of the opening OP in the insulating film PA, and the insulating film PA around the opening OP. The outer periphery of the laminated film LM1 is located over the insulating film PA around the opening OP. From the portion of the pad PD which is exposed from the opening OP, the barrier conductor film BR2 over the Al-containing conductive film AM1 has been removed. Consequently, at the bottom portion of the opening OP of the insulating film PA, a state is observed where the barrier conductor film BR3 of the laminated film LM1 is formed over the Al-containing conductive film AM1 of the pad PD (so as to come in contact with the Al-containing conductive film AM1).

What is important is that, over the pad PD (which is the Al-containing conductive film AM1 included in the pad PD) exposed from the opening OP of the insulating film PA, the laminated film LM1 including the barrier conductor film BR3, and the metal film ME1 over the barrier conductor film BR3 is formed.

The metal film ME1 is a film (outermost film) with which a copper wire (corresponding to the foregoing wire WA) comes into contact when the copper wire is electrically coupled to the pad PD by wire bonding. When the top surface of the metal film ME1 is oxidized, the copper wire is less likely to be bonded to the metal film ME1. Accordingly, the metal film ME1 is made preferably of a metal resistant to oxidation, particularly preferably of a precious metal. To allow easy bonding of the copper wire to the metal film ME1, it is desirable that the front end portion (ball-shaped front end portion) of the hard copper wire easily digs into the metal film ME1 to be firmly attached thereto. Therefore, the metal film ME1 is preferably made of a relatively soft metal. To enhance the bonding strength of the copper wire, the metal film ME1 is preferably made of a metal which can be bonded to copper (Cu) forming the copper wire and form an intermetallic compound (or solid solution). Preferably, the intermetallic compound (or solid solution) resulting from the reaction between the metal film ME1 and copper (Cu) forming the copper wire is resistant to corrosion. That is, it is desirable to choose a material for the metal film ME1 such that, even in such a high-temperature environment as in a high-temperature storage test, an intermetallic compound (or solid solution) susceptible to corrosion is not generated by the reaction between the metal film ME1 and copper (Cu) forming the copper wire.

Note that halogen ions such as Cl (chlorine) ions or Br (bromine) ions (or a halide such as chloride or bromide), sulfate ions containing S (sulfur) (or sulfide), or the like may be contained in a sealing resin (corresponding to the foregoing sealing portion MR1 or MR2). Accordingly, it is desirable to choose a material for the metal film ME1 such that an intermetallic compound (or solid solution) which is susceptible to corrosion by such ions (or compounds) as may be contained in the sealing resin is not generated by the reaction between the metal film ME1 and copper (Cu)

forming the copper wire. In the case in each of first and second studied examples described later, when a high-temperature storage test is performed, an intermetallic compound which is susceptible to such ions (or compound) as may be contained in the sealing resin is formed in the vicinity of the region to which the copper wire is bonded. Consequently, defective bonding of the copper wire is likely to occur.

In view of these features, the metal film ME1 is made of one or more metals selected from the group consisting of palladium (Pd), gold (Au), ruthenium (Ru), rhodium (Rh), platinum (Pt), and iridium (Ir). Accordingly, as the metal film ME1, a palladium film (Pd), a gold film (Au), a ruthenium film (Ru), a rhodium film (Rh), a platinum film (Pt), or an iridium film (Ir) can be used. However, as the metal film ME1, an alloy film made of two or more metals selected from the group consisting of palladium (Pd), gold (Au), ruthenium (Ru), rhodium (Rh), platinum (Pt), and iridium (Ir) can also be used. Most preferably, the metal film ME1 is a palladium (Pd) film.

By using a palladium (Pd) film as the metal film ME1, the strength of bonding of the copper wire to the metal film ME1 is easily enhanced. In the case where the copper wire is coupled to the palladium film as the metal film ME1, even when the semiconductor chip CP is stored at a high temperature for a long time, an intermetallic compound (i.e., Pd—Cu intermetallic compound) formed between the palladium film and the copper wire is less likely to grow due to the low growth speed thereof and the state of bonding of the copper wire is less likely to be changed. Therefore, even when the semiconductor chip CP is stored at a high temperature for a long time, the strength of bonding to the metal film ME1 is easily maintained. As a result, when a high-temperature storage test is performed, defective coupling of the copper wire is less likely to occur. Accordingly, to maximally improve the coupling reliability of the copper wire, the palladium (Pd) film is most preferably used as the metal film ME1.

The barrier conductor film BR3 is preferably made of a material which enhances the adhesion (adhesiveness) thereof to the metal film ME1 formed over the barrier conductor film BR3. The barrier conductor film BR3 is also preferably made of a material which enhances the adhesion (adhesiveness) thereof to an underlying film (which is the Al-containing conductive film AM1 herein). The barrier conductor film BR3 is also preferably made of a material which can prevent aluminum (Al) forming the Al-containing conductive film AM1 from being diffused through the barrier conductor film BR3 into the metal film ME1. The barrier conductor film BR3 is also preferably made of a material which can prevent copper (Cu) forming the wire WA from being diffused through the barrier conductor film BR3 into the Al-containing conductive film AM1. That is, the barrier conductor film BR3 is preferably made of a material which can prevent the diffusion of Al forming the Al-containing conductive film AM1 and prevent Al forming the Al-containing conductive film AM1 from reacting with Cu forming the copper wire even when placed in a high-temperature environment such as in a high-temperature storage test. The barrier conductor film BR3 is also preferably made of a material which is less likely to be bonded to aluminum (Al) forming the Al-containing conductive film AM1 and form an intermetallic compound (or solid solution).

In view of these features, the barrier conductor film BR3 is a single-layer film or a laminated film including one or more layers of films selected from the group consisting of a titanium (Ti) film, a titanium nitride (TiN) film, a tantalum (Ta) film, a tantalum nitride (TaN) film, a tungsten (W) film, a tungsten nitride (WN) film, a titanium-tungsten (TiW) film, and a tantalum-tungsten (TaW) film.

Preferably, the barrier conductor film BR3 includes a titanium (Ti) film and the metal film ME1 is formed over the titanium (Ti) film. Most preferably, the barrier conductor film BR3 is a titanium (Ti) film. A titanium film has an excellent barrier property (diffusion preventing function) against Al as well as excellent adhesion to a palladium film. Accordingly, a palladium film as the metal film ME1 is preferably formed over a titanium film (so as to come in contact with the titanium film).

Therefore, as a combination of the barrier conductor film BR3 and the metal film ME1, a combination of a titanium (Ti) serving as the barrier conductor film BR3 and a palladium (Pd) film serving as the metal film ME1 is most preferred. The combination not only is adequate from the viewpoint described above, but also particularly increases the adhesion between the barrier conductor film BR3 and the metal film ME1 and allows easy processing.

Next, a cross-sectional structure of the semiconductor device CP including the structure located below the interlayer insulating film IL6 will be described with reference to FIGS. 7 and 8.

Figure 7:
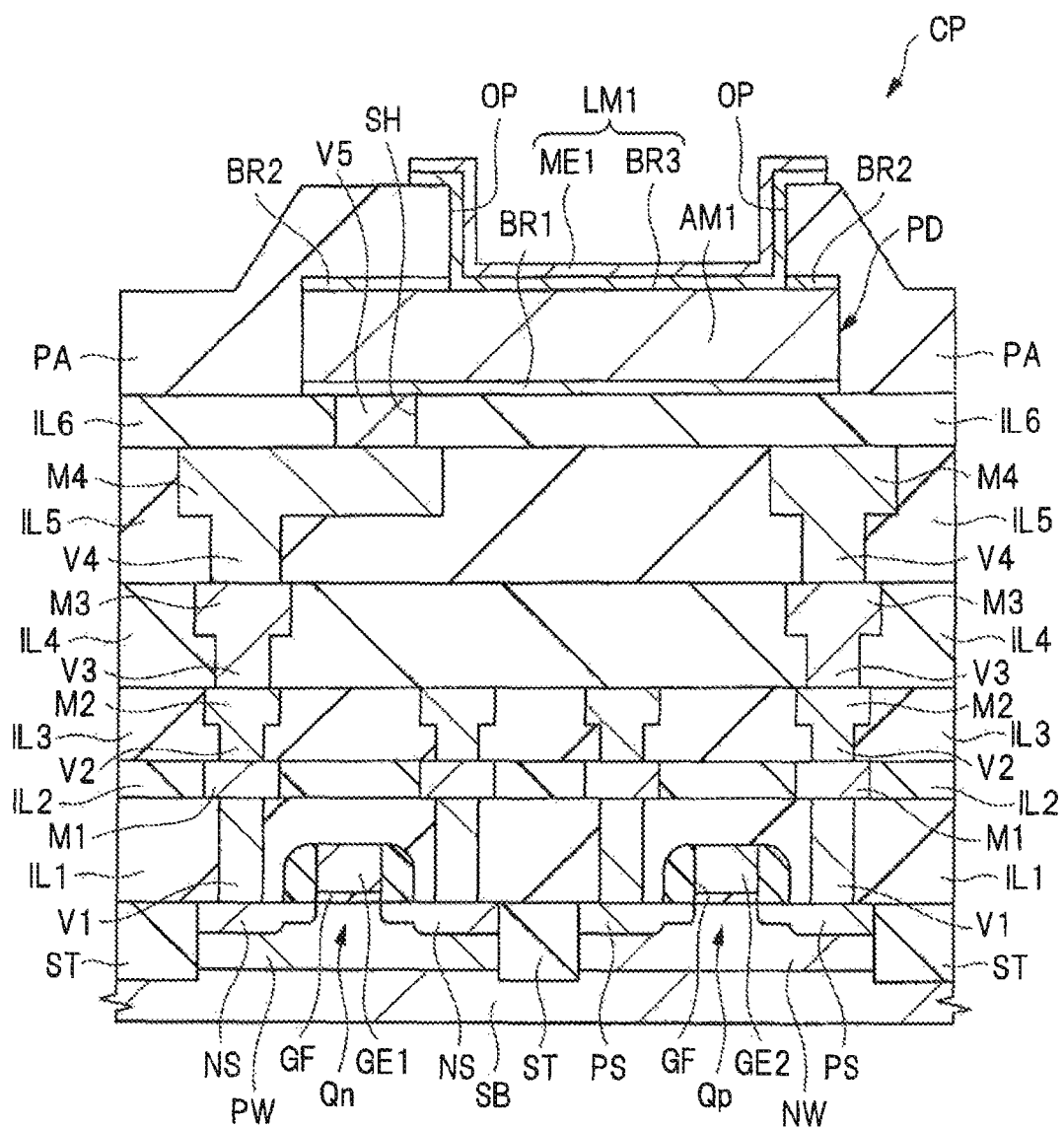
FIG. 7 is a main-portion cross-sectional view of the semiconductor device in the embodiment.
Figure 8:
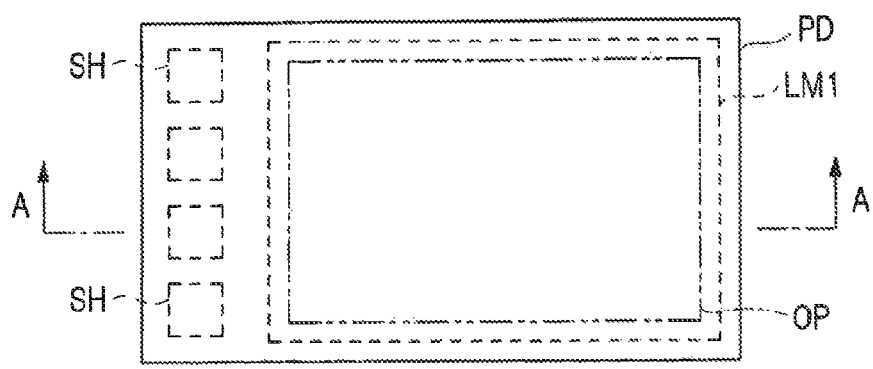
FIG. 8 is a plan view showing a pad formation region.

FIG. 7 is a main-portion cross-sectional view of the semiconductor device (semiconductor chip) CP in the present embodiment. FIG. 7 shows a cross section of the semiconductor device including the structure located below the interlayer insulating film IL6 shown in FIG. 6. FIG. 8 is a plan view showing a region where the pad PD is formed. The pad PD shown in the cross-sectional view of FIG. 7 substantially corresponds to a cross-sectional view taken at the position along the line A-A in FIG. 8. Note that, since FIG. 6 described above is a cross-sectional view taken at a position where an opening SH is not traversed, the opening SH and a via portion V5 are not shown.

In the semiconductor device CP in the present embodiment, semiconductor elements such as MISFETs are formed in the main surface of the semiconductor substrate SB and, over the semiconductor substrate SB, a multilayer wiring structure including a plurality of wiring layers is formed. A specific description will be given below of an example of a configuration of the semiconductor device in the present embodiment.

As shown in FIG. 7, in the semiconductor substrate SB made of monocrystalline silicon or the like and included in the semiconductor device in the present embodiment, semiconductor elements such as MISFETs (Metal Insulator Semiconductor Field Effect Transistors) are formed. In the semiconductor substrate SB, a plurality of MISFETs are formed, but FIG. 7 shows two MISFETs (which are an n-channel MISFET Qn and a p-channel MISFET Qp) as the representatives of the plurality of MISFETs.

In the main surface of the semiconductor substrate SB, isolation regions ST are formed by a STI (Shallow Trench Isolation) method or the like. In the active regions of the semiconductor substrate SB which are defined by the isolation regions ST, the MISFETs (Qn and Qp) are formed. The isolation regions ST are each made of an insulating film embedded in a trench formed in the semiconductor substrate SB.

In the semiconductor substrate SB, a p-type well PW and an n-type well NW are formed. Over the p-type well PW, agate electrode GE1 for the n-channel MISFET Qn is formed via a gate insulating film GF. Over the n-type well NW, a gate electrode GE2 for the p-channel MISFET Qp is formed via the gate insulating film GF. Each of the gate insulating films GF is made of, e.g., a silicon dioxide film or the like. Each of the gate electrodes GE1 and GE2 is made of, e.g., a polycrystalline silicon film into which an impurity has been introduced.

In the p-type well PW of the semiconductor substrate SB, n-type semiconductor regions NS for the source/drain of the n-channel MISFET Qn are formed. In the n-type well NW of the semiconductor substrate SB, p-type semiconductor regions PS for the source/drain of the p-channel MISFET Qp are formed. The gate electrode GE1, the gate insulating film GF under the gate electrode GE1, and the n-type semiconductor regions NS (source/drain regions) on both sides of the gate electrode GE1 form the n-channel MISFET Qn. On the other hand, the gate electrode GE2, the gate insulating film GF under the gate electrode GE2, and the p-type semiconductor regions PS (source/drain regions) on both sides of the gate electrode GE2 form the p-channel MISFET Qp. Each of the n-type semiconductor regions NS and the p-type semiconductor regions PS can also have an LDD (Lightly doped Drain) structure. In this case, over the side walls of the gate electrodes GE1 and GE2, side-wall insulating films referred to also as sidewall spacers are formed. It may also be possible to form metal silicide layers (not shown) in the respective upper portions of the n-type semiconductor regions NS, the p-type semiconductor regions PS, and the gate electrodes GE1 and GE2 using a salicide (Self Aligned Silicide) technique.

In the description given herein, the MISFETs are used as an example of the semiconductor elements formed in the semiconductor substrate SB. However, it may also be possible to additionally form a capacitor element, a resistor element, a memory element, a transistor having another configuration, or the like.

Also, in the description given herein, the monocrystalline silicon substrate is used as an example of the semiconductor substrate SB. However, in another form, a SOI (Silicon On Insulator) substrate or the like can also be used as the semiconductor substrate SB.

Over the semiconductor substrate SB, a plurality of interlayer insulating films and a plurality of wiring layers form a multilayer wiring structure.

That is, over the semiconductor substrate SB, a plurality of interlayer insulating films IL1, IL2, IL3, IL4, and IL5 are formed. In the plurality of interlayer insulating films IL1, IL2, IL3, IL4, and IL5, plugs V1, via portions V2, V3, and V4, and wires M1, M2, M3, and M4 are formed. Over the interlayer insulating film IL5, the interlayer insulating film IL6 is formed. Over the interlayer insulating film IL6, the pad PD is formed. Note that, over the interlayer insulating film IL6, wires (not shown) in the same layer as that of the pad PD can also be formed.

Specifically, over the semiconductor substrate SB, the interlayer insulating film IL1 is formed so as to cover the foregoing MISFETs (Qn and Qp). In the interlayer insulating film IL1, the plugs V1 are embedded. Over the interlayer insulating film IL1 in which the plugs V1 are embedded, the interlayer insulating film IL2 is formed. In the interlayer insulating film IL2, the wires M1 are embedded. Over the interlayer insulating film IL2 in which the wires M1 are embedded, the interlayer insulating film IL3 is formed. In the interlayer insulating film IL3, the wires M2 are embedded. Over the interlayer insulating film IL3 in which the wires M2 are embedded, the interlayer insulating film IL4 is formed. In the interlayer insulating film IL4, the wires M3 are embedded. Over the interlayer insulating film IL4 in which the wires M3 are embedded, the interlayer insulating film IL5 is formed. In the interlayer insulating film IL5, the wires M4 are embedded. Over the interlayer insulating film IL5 in which the wires M4 are embedded, the interlayer insulating film IL6 is formed. Over the interlayer insulating film IL6, the pad PD is formed. Each of the interlayer insulating films IL1 to IL6 can be a single-layer insulating film (e.g., a silicon dioxide film) or a laminated film including a plurality of insulating films. Over the interlayer insulating film IL6, the insulating film PA is formed so as to cover the pad PD. In the insulating film PA, the opening OP partly exposing the pad PD is formed. As has been described above with reference to FIG. 6 and as also shown in FIG. 7, over the inner surface (inner wall) of the opening OP of the insulating film PA including the upper surface of the pad PD exposed from the opening OP of the insulating film PA, the laminated film LM1 including the barrier conductor film BR3, and the metal film ME1 thereover is formed.

The plugs V1 are made of a conductor and disposed under the wires M1. The plugs V1 electrically couple the wires M1 to various semiconductor regions formed in the semiconductor substrate SB, the gate electrodes GE1 and GE2, and the like.

The via portions V2 are made of a conductor and integrally formed with the wires M2. The via portions V2 are placed between the wires M2 and M1 to electrically couple the wires M2 and M1 to each other. That is, in the interlayer insulating film IL3, using a dual damascene method, the wires M2 and the via portions V2 integrally formed with the wires M2 are embedded. In another embodiment, it is also possible to separately form the via portions V2 and the wires M2 using a single damascene method. The same applies also to the via portions V3, V4, and V5.

The via portions V3 are made of a conductor and formed integrally with the wires M3. The via portions V3 are placed between the wires M3 and M2 to electrically couple the wires M3 and M2 to each other. That is, in the interlayer insulating film IL4, using a dual damascene method, the wires M3 and the via portions V3 formed integrally with the wires M3 are embedded.

The via portions V4 are made of a conductor and formed integrally with the wires M4. The via portions V4 are placed between the wires M4 and M3 to electrically couple the wires M4 and M3 to each other. That is, in the interlayer insulating film IL5, the wires M4 and the via portions V4 formed integrally with the wires M4 are embedded.

The wires M1, M2, M3, and M4 have been illustrated and described heretofore as damascene wires (embedded wires) formed by a damascene method, but are not limited thereto. The wires M1, M2, M3, and M4 can also be formed by patterning conductor films for wires. For example, the wires M1, M2, M3, and M4 can also be aluminum wires.

In the interlayer insulating film IL6, the opening (through hole or through bore) SH is formed at a position overlapping the pad PD in plan view. In the opening SH, the via portion V5 is formed (embedded). The via portion V5 is made of a conductor and placed between the pad PD and the wire M4 to electrically couple the pad PD and the wire M4 to each other. That is, in the interlayer insulating film IL6, using a single damascene method, the via portion V5 is embedded.

Note that, in the present embodiment, the via portion V5 and the pad PD are separately formed. However, in another embodiment, the via portion V5 can also be formed integrally with the pad PD. When the via portion V5 is formed integrally with the pad PD, a part of the pad PD is embedded in the opening SH of the interlayer insulating film IL6 to form the via portion V5.

The configuration of the pad PD, the insulating film PA (including the opening OP), and the laminated film LM1 is the same as described above with reference to FIG. 6. Therefore, a repeated description thereof is omitted herein.

Figure 9:
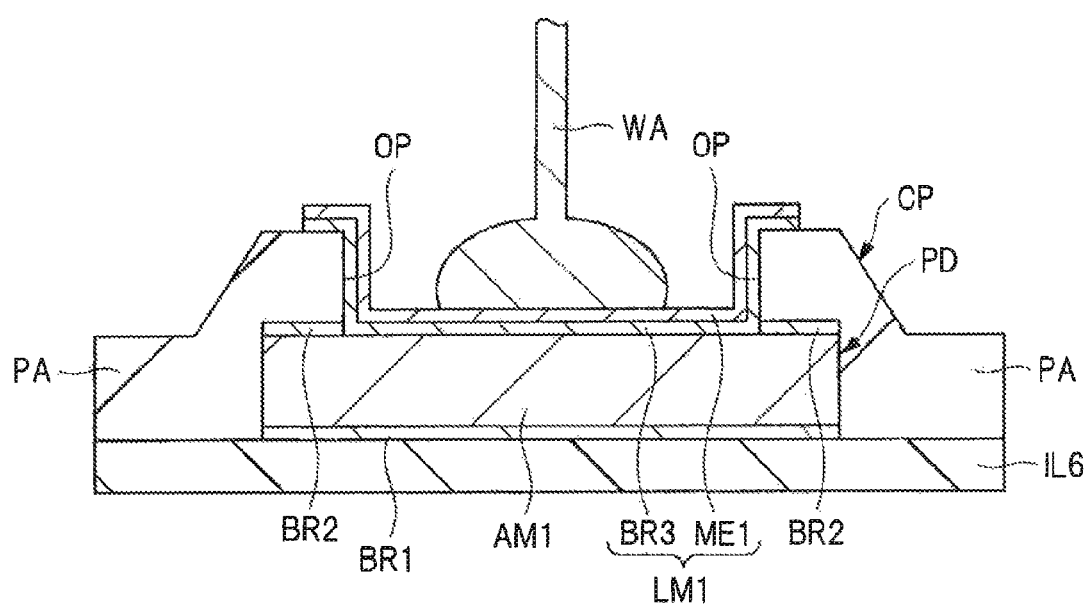
FIG. 9 is a cross-sectional view showing a state where a wire is electrically coupled to the pad shown in FIG. 6.

FIG. 9 is a cross-sectional view showing a state where the wire (bonding wire) WA is electrically coupled to the pad PD shown in FIG. 6 described above and shows a cross-sectional view of the region corresponding to FIG. 6 described above. In the semiconductor devices PKG1 and PKG2 in FIGS. 2 and 3 described above, as shown in FIG. 9, the wire WA is electrically coupled to the pad PD. By contrast, in FIG. 9, the illustration of a sealing resin (corresponding to the foregoing sealing portion MR1 or MR2) is omitted.

As shown in FIG. 9, to the pad PD, the wire WA is electrically coupled as a coupling member. The wire WA is a copper (Cu) wire containing copper (Cu) as a main component. As the wire WA, not only a copper (Cu) wire entirely made of copper (Cu), but also a copper (Cu) wire having a top surface thereof covered with a palladium (Pd) film or the like can be used.

In the present embodiment, over the pad PD exposed from the opening OP of the insulating film PA, the laminated film LM1 including the barrier conductor film BR3, and the metal film ME1 is formed. Accordingly, when wire bonding is performed on the pad PD, the wire WA is coupled (bonded) to the laminated film LM1 over the pad PD. That is, the wire WA is coupled (bonded) to the portion of the laminated film LM1 which is located over the pad PD exposed from the opening OP of the insulating film PA. In short, the wire WA is not directly coupled to the Al-containing conductive film AM1 included in the pad PD. Instead, the wire WA is pressed against and coupled (bonded) to the laminated film LM1 over the Al-containing conductive film AM1 (more specifically, against the metal film ME1) in the state where the laminated film LM1 including the barrier conductor film BR3, and the metal film ME1 is formed over the Al-containing conductive film AM1 included in the pad PD. As a result, when wire bonding is performed to electrically couple the wire WA to the pad PD, between the Al-containing conductive film AM1 included in the pad PD and the wire WA, the laminated film including the barrier conductor film BR3, and the metal film ME1 over the barrier conductor film BR3 is interposed. The barrier conductor film BR3 is located closer to the Al-containing conductive film AM1, while the metal film ME1 is located closer to the wire WA.

The wire WA is a copper wire and made of a hard material. Accordingly, by compressing the wire WA to the laminated structure (more specifically, the metal film ME1 in the uppermost layer of the laminated structure) including the pad PD, and the laminated film LM1 with the application of a mechanical pressure, a high bonding strength can be obtained. In addition, the copper (Cu) wire which is less costly than a gold (Au) wire has the advantage of allowing a cost reduction.

<About Manufacturing Process of Semiconductor Device>

Figure 10:
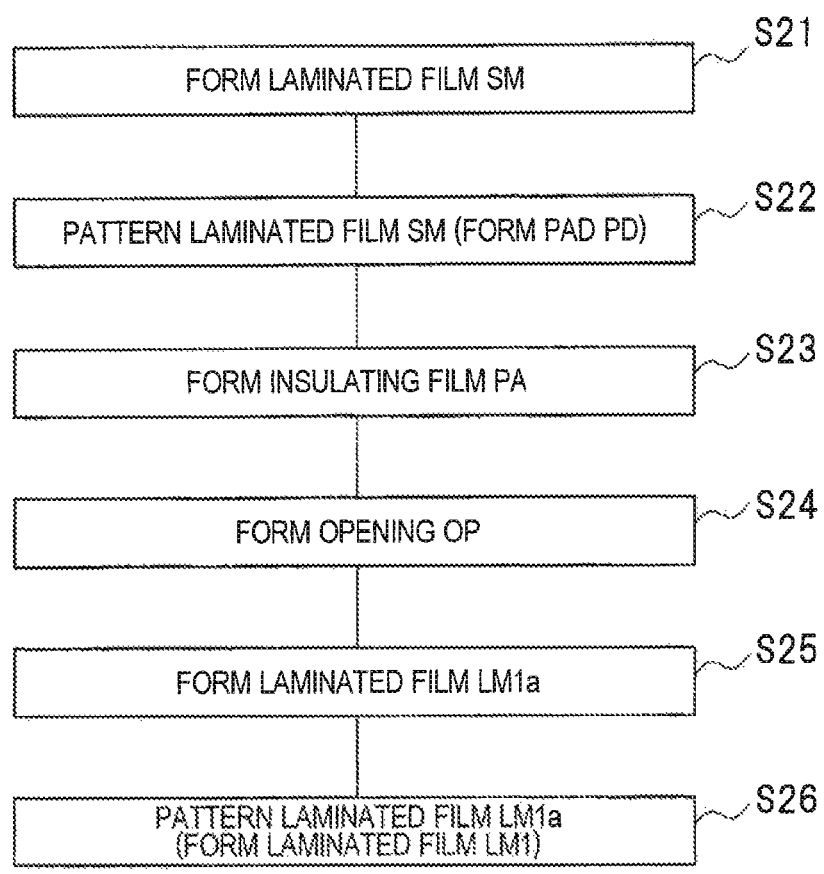
FIG. 10 is a process flow chart showing a part of the manufacturing process of the semiconductor device in the embodiment.

Referring to FIGS. 10 to 20, a description will be given of the manufacturing process of the semiconductor device CP in the present embodiment. FIG. 10 is a process flow chart showing a part of the manufacturing process of the semiconductor device CP in the present embodiment. FIGS. 11 to 20 are main-portion cross-sectional views of the semiconductor device CP in the present embodiment during the manufacturing process thereof.

The fourth wiring layer (wiring layer including the wires ME4) and the structure located below the fourth wiring layer, which are shown in FIG. 7 described above, can be formed using a known semiconductor manufacturing technique.

Figure 11:
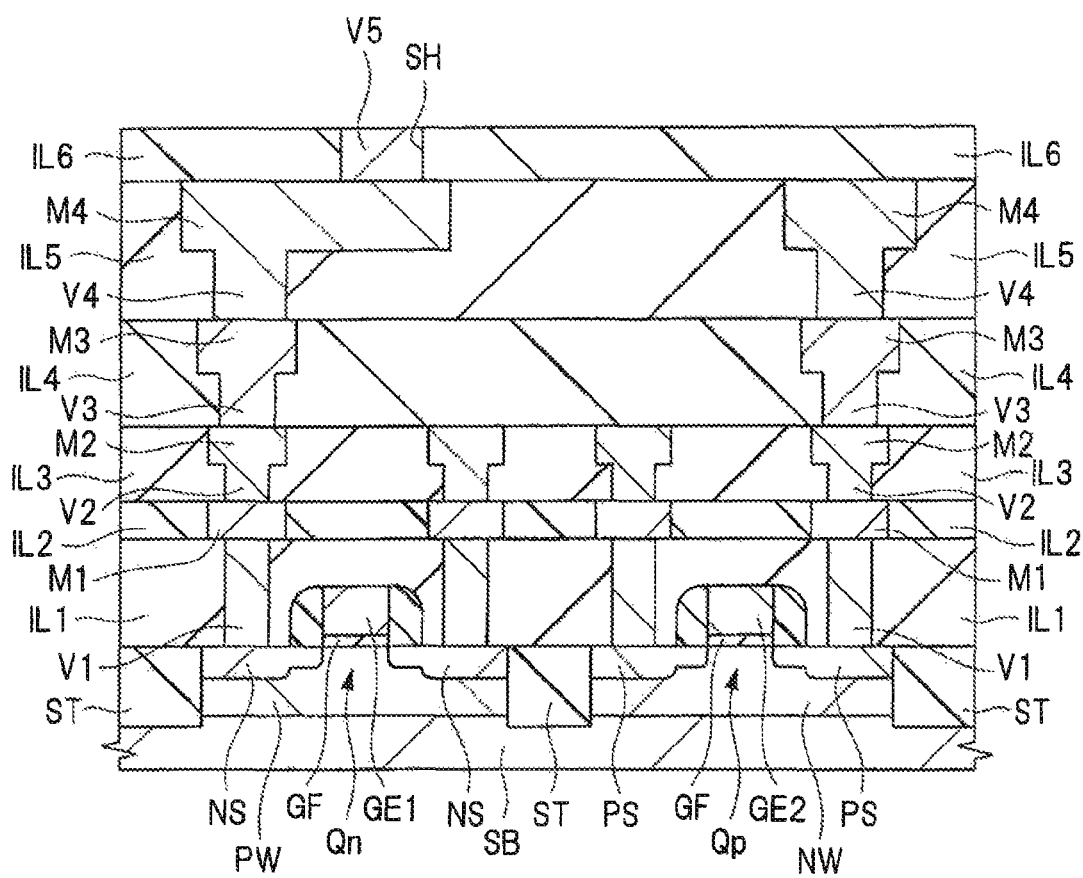
FIG. 11 is a main-portion cross-sectional view of the semiconductor device in the embodiment during the manufacturing process thereof.

That is, as shown in FIG. 11, the isolation regions ST are formed in the semiconductor substrate SB using a STI method. Then, using an ion implantation method, the p-type well PW and the n-type well NW are formed. Over the p-type well PW and the n-type well NW, the gate electrodes GE1 and GE2 are formed via the gate insulating films GF. Then, using an ion implantation method, the n-type semiconductor regions NS and the p-type semiconductor regions PS are formed. Thus, in the semiconductor substrate SB, the n-channel MISFET Qn and the p-channel MISFET Qp are formed.

Then, over the semiconductor substrate SB, the interlayer insulating film IL1 is formed so as to cover the MISFETs Qn and Qp. Then, in the interlayer insulating film IL1, contact holes are formed using a photolithographic technique and a dry etching technique. Then, in the contact holes, a conductive film is embedded to form the plugs V1.

Subsequently, over the interlayer insulating film IL1 in which the plugs V1 are embedded, the interlayer insulating film IL2 is formed. Then, in the interlayer insulating film IL2, using a single damascene technique, the wires M1 are embedded. Then, over the interlayer insulating film IL2 in which the wires M1 are embedded, the interlayer insulating film IL3 is formed. Then, in the interlayer insulating film IL3, using a dual damascene technique, the wires M2 and the via portions V2 are embedded. Then, over the interlayer insulating film IL3 in which the wires M2 are embedded, the interlayer insulating film IL4 is formed. Then, in the interlayer insulating film IL4, using a dual damascene technique, the wires M3 and the via portions V3 are embedded. The, over the interlayer insulating film IL4 in which the wires M3 are embedded, the interlayer insulating film IL5 is formed. Then, in the interlayer insulating film IL5, using a dual damascene technique, the wires M4 and the via portions V4 are embedded.

After the interlayer insulating film IL5, the wires M4, and the via portions V4 which are embedded in the interlayer insulating film IL5 are formed using the dual damascene technique, over the interlayer insulating film IL5 in which the wires M4 are embedded, the interlayer insulating film IL6 is formed.

Next, using a photolithographic technique and an etching technique, the opening SH is formed in the interlayer insulating film IL6. When the opening SH is formed in the interlayer insulating film IL6, the upper surface of the wire M4 is exposed at the bottom portion of the opening SH.

Next, over the interlayer insulating film IL6, a conductive film for the via portion V5 is formed so as to be embedded in the opening SH. Then, using a CMP (Chemical Mechanical Polishing) method, an etch-back method, or the like, the conductive film (conductive film for the via portion V5) located outside the opening SH is removed, while the conductive film (conductive film for the via portion V5) is left in the opening SH. Thus, the via portion V5 made of the conductive film (conductive film for the via portion V5) embedded in the opening SH can be formed.

FIG. 11 shows the laminated structure from the semiconductor substrate SB to the fourth wiring layer (the wires M4 and the interlayer insulating film IL5). However, for simpler illustration, in FIGS. 12 to 20 subsequent thereto, the illustration of the structure located below the interlayer insulating film IL6 is omitted. While FIG. 11 shows a cross-sectional region corresponding to FIG. 7 described above, each of FIGS. 12 to 20 shows the cross-sectional region corresponding to FIG. 6 described above. Accordingly, in FIGS. 12 to 20, the illustration of the opening SH and the via portion V5 is omitted.

Figure 12:
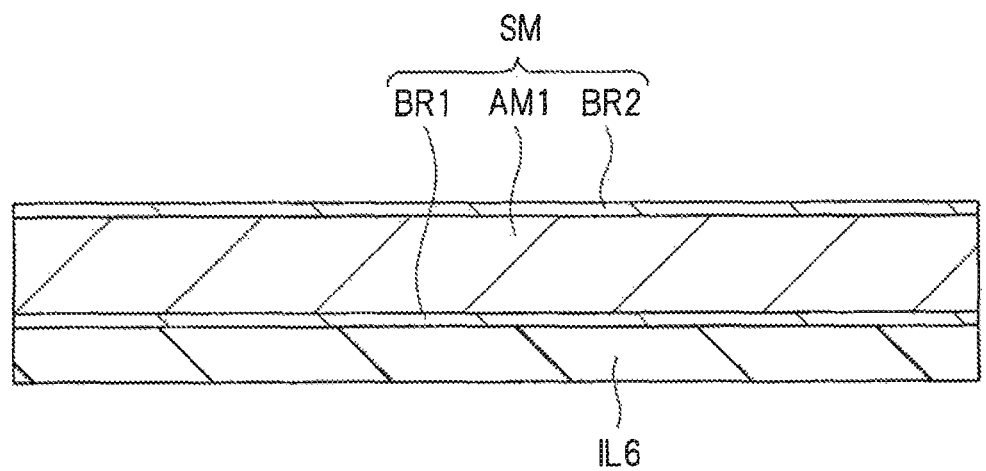
FIG. 12 is a main-portion cross-sectional view of the semiconductor device during the manufacturing process thereof, which is subsequent to FIG. 11.

Next, over the interlayer insulating film IL6 in which the via portion V5 is embedded, as shown in FIG. 12, the barrier conductor film BR1, the Al-containing conductive film AM1, and the barrier conductor film BR2 are successively formed to form the laminated film SM including the barrier conductor film BR1, the Al-containing conductive film AM1 over the barrier conductor film BR1, and the barrier conductor film BR2 over the Al-containing conductive film AM1 (Step S21 in FIG. 12). Each of the barrier conductor film BR1, the Al-containing conductive film AM1, and the barrier conductor film BR2 can be formed using a sputtering method or the like. The step of forming the Al-containing conductive film AM1 can be formed continuously after the step of forming the barrier conductor film BR1. The step of forming the barrier conductor film BR2 can be performed continuously after the step of forming the Al-containing conductive film AM1.

Next, using a photolithographic technique and an etching technique, the laminated film SM is patterned to form the pad PD (Step S22 in FIG. 12). At this stage, the entire pad PD is made of the laminated film including the barrier conductor film BR1, the Al-containing conductive film AM1 over the barrier conductor film BR1, and the barrier conductor film BR2 over the Al-containing conductive film AM1.

Figure 13:
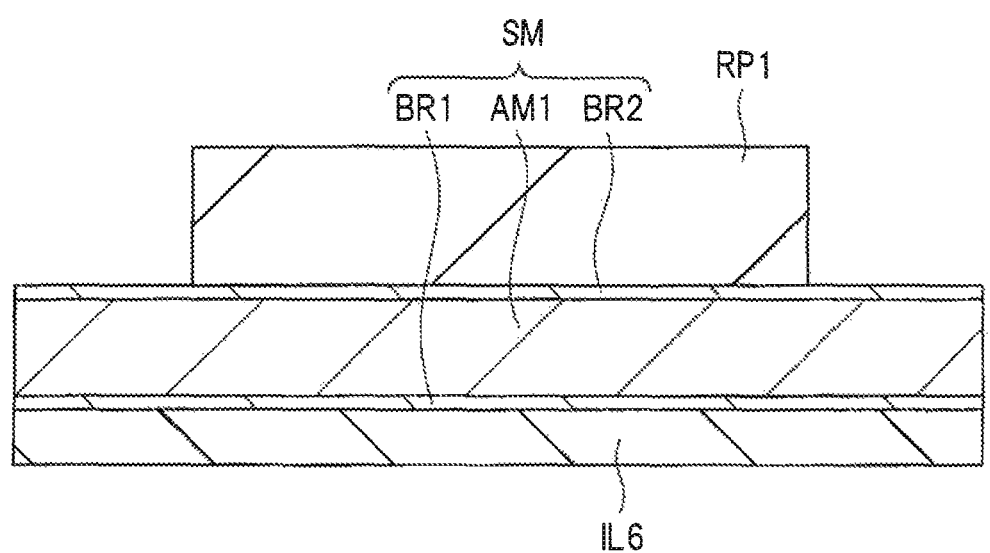
FIG. 13 is a main-portion cross-sectional view of the semiconductor device during the manufacturing process thereof, which is subsequent to FIG. 12.
Figure 14:
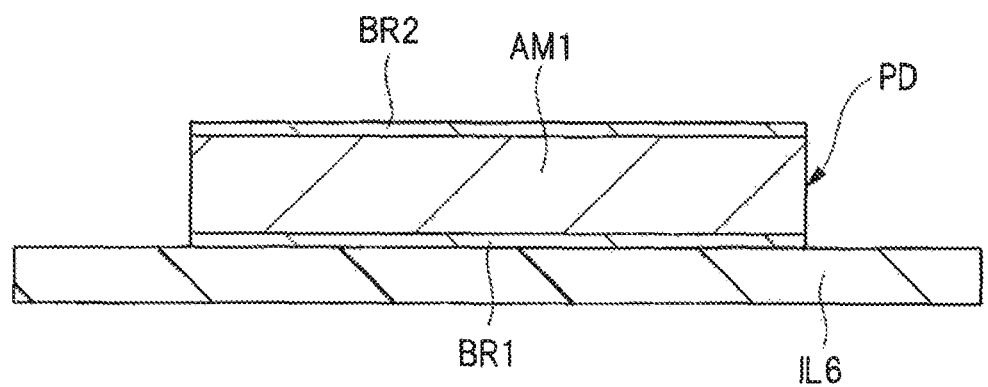
FIG. 14 is a main-portion cross-sectional view of the semiconductor device during the manufacturing process thereof, which is subsequent to FIG. 13.

Specifically, the patterning step in S22 can be performed as follows. First, as shown in FIG. 13, over the laminated film SM, the photoresist pattern RP1 is formed using a photolithographic technique. Then, using the photoresist pattern RP1 as an etching mask, the laminated film SM is etched. The step of etching the laminated film SM includes the step of etching the barrier conductor film BR2, the step of etching the Al-containing conductive film AM1, and the step of etching the barrier conductor film BR1. By the etching, the laminated film SM is patterned to form the pad PD made of the patterned laminated film SM. Thereafter, the photoresist pattern RP1 is removed. FIG. 14 shows the resulting stage. Thus, the patterning step in Step S22 is performed. Note that, when the laminated film SM is patterned in Step S22, not only the pad PD, but also the wires in the same layer as that of the pad PD can also be formed.

Heretofore, the case where the via portion V5 and the pad PD are separately formed has been illustrated and described. However, in another form, the via portion V5 can also be formed integrally with the pad PD. In that case, in the state where the via portion V5 is not formed, the laminated film SM is formed over the interlayer insulating film IL6 including the inside of the opening SH and then patterned using a photolithographic technique and an etching technique to form the pad PD. Thus, of the patterned laminated film SM, the pad PD and the via portion V5 are integrally formed.

Figure 15:
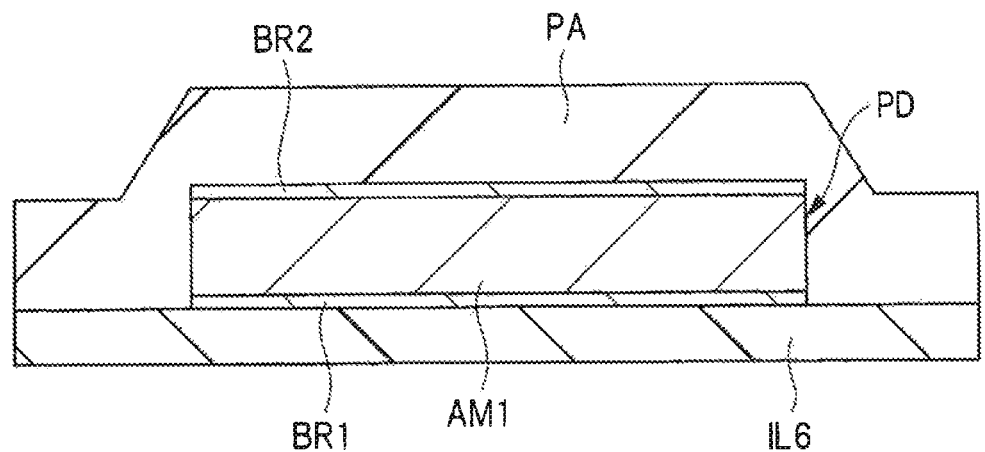
FIG. 15 is a main-portion cross-sectional view of the semiconductor device during the manufacturing process thereof, which is subsequent to FIG. 14.

Next, as shown in FIG. 15, over the interlayer insulating film IL6, the insulating film PA is formed so as to cover the pad PD (Step S23 in FIG. 10). As the insulating film PA, a single-layer insulating film or a laminated insulating film in which a plurality of insulating films are stacked can be formed. For example, a silicon dioxide film, a silicon nitride film, or a laminated film thereof (laminated film including, e.g., a silicon dioxide film, and a silicon nitride film over the silicon dioxide film) can be used as the insulating film PA. The insulating film forming the insulating film PA can be formed using a plasma CVD (Chemical Vapor Deposition) method or the like. As the insulating film PA, a resin film (organic insulating film) such as a polyimide resin can also be used.

Figure 16:
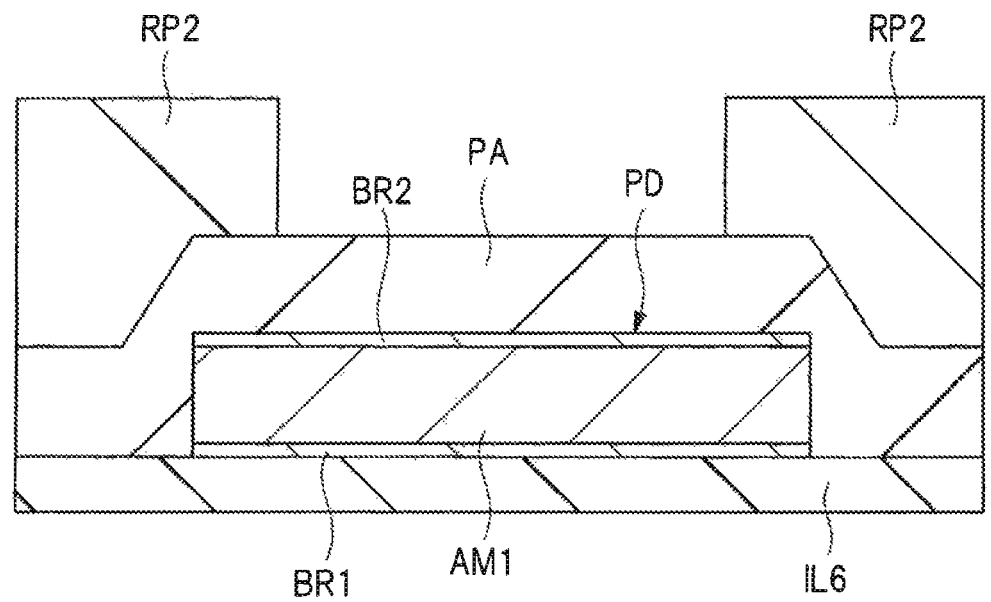
FIG. 16 is a main-portion cross-sectional view of the semiconductor device during the manufacturing process thereof, which is subsequent to FIG. 15.
Figure 17:
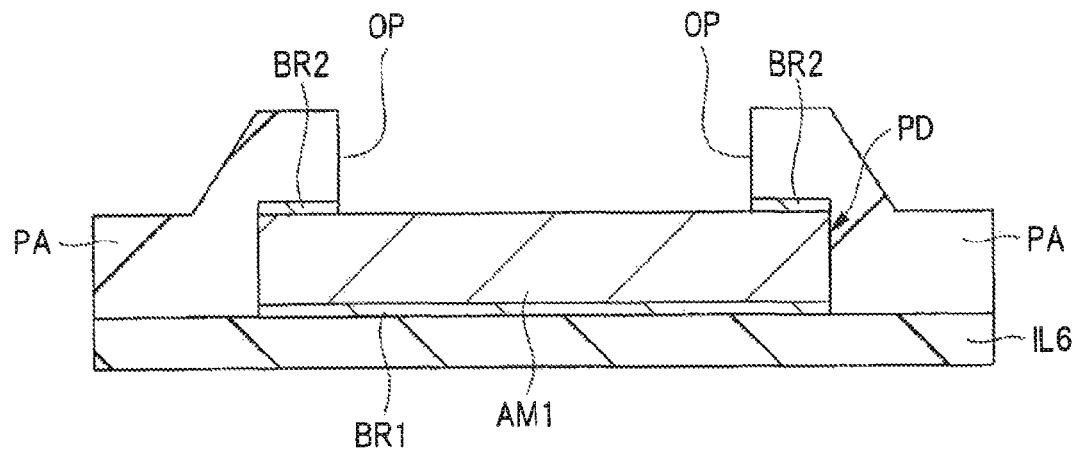
FIG. 17 is a main-portion cross-sectional view of the semiconductor device during the manufacturing process thereof, which is subsequent to FIG. 16.

Next, in the insulating film PA, the opening OP is formed (Step S24 in FIG. 10). In Step S24, the opening OP can be formed, e.g., as follows. That is, as shown in FIG. 16, over the insulating film PA, a photoresist pattern RP2 is formed using a photolithographic technique. Then, using the photoresist pattern RP2 as an etching mask, the insulating film PA is etched such that the opening OP is formed therein. Thereafter, the photoresist pattern RP2 is removed. FIG. 17 shows the resulting stage.

In the etching step for forming the opening OP in the insulating film PA, the insulating film PA is etched such that the opening OP is formed therein to expose the barrier conductor film BR2 of the pad PD. Then, the barrier conductor film BR2 exposed from the opening OP is further removed by the etching to expose the Al-containing conductive film AM1 of the pad PD from the opening OP. That is, in the region overlapping the opening OP in plan view, not only the insulating film PA, but also the barrier conductor film BR2 forming the pad PD is etched and removed. Consequently, the upper surface of the Al-containing conductive film AM1 included in the pad PD is exposed. On the other hand, in the region covered with the insulating film PA even after the opening OP is formed, the barrier conductor film BR2 is not removed and remains.

Figure 18:
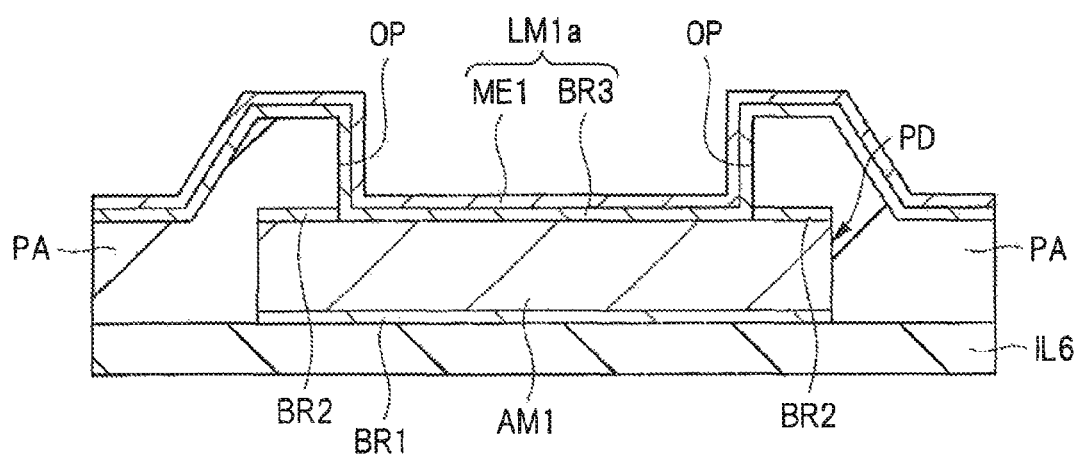
FIG. 18 is a main-portion cross-sectional view of the semiconductor device during the manufacturing process thereof, which is subsequent to FIG. 17.

Next, as shown in FIG. 18, over the insulating film PA including the side wall of the opening OP, and the upper surface of the pad PD exposed from the opening OP (which is the Al-containing conductor film AM1 herein), the barrier conductor film BR3 and the metal film ME1 are successively formed to form a laminated film LM1a including the barrier conductor film BR3, and the metal film ME1 over the barrier conductor film BR3 (Step S25 in FIG. 10). Each of the barrier conductor film BR3 and the metal film ME1 is preferably formed using a sputtering method. At this stage, the laminated film LM1a including the barrier conductor film BR3, and the metal film ME1 over the barrier conductor film BR3 is formed over the entire upper surface of the insulating film PA including the side wall of the opening OP, and the upper surface of the pad PD exposed from the opening OP.

After the opening OP is formed and immediately before the barrier conductor film BR is formed by the sputtering method, the top surface of the underlay (especially the top surface of the pad PD exposed from the opening OP) can also be subjected to cleaning treatment (preferably, plasma cleaning treatment). This allows the barrier conductor film BR3 to be formed over the clean top surface of the pad PD and thus allows a further improvement in the adhesion of the barrier conductor film BR3 to the upper surface of the pad PD. The cleaning treatment is preferably performed by plasma treatment. For example, oxygen or argon plasma treatment can be used appropriately. Note that, in the case in the second embodiment described later, the cleaning treatment (plasma cleaning treatment) is performed after the opening OP is formed and immediately before the metal film ME1 is formed by a sputtering method.

Next, using a photolithographic technique and an etching technique, the laminated film LM1a is patterned to form the laminated film LM1 (Step S26 in FIG. 10).

Figure 19:
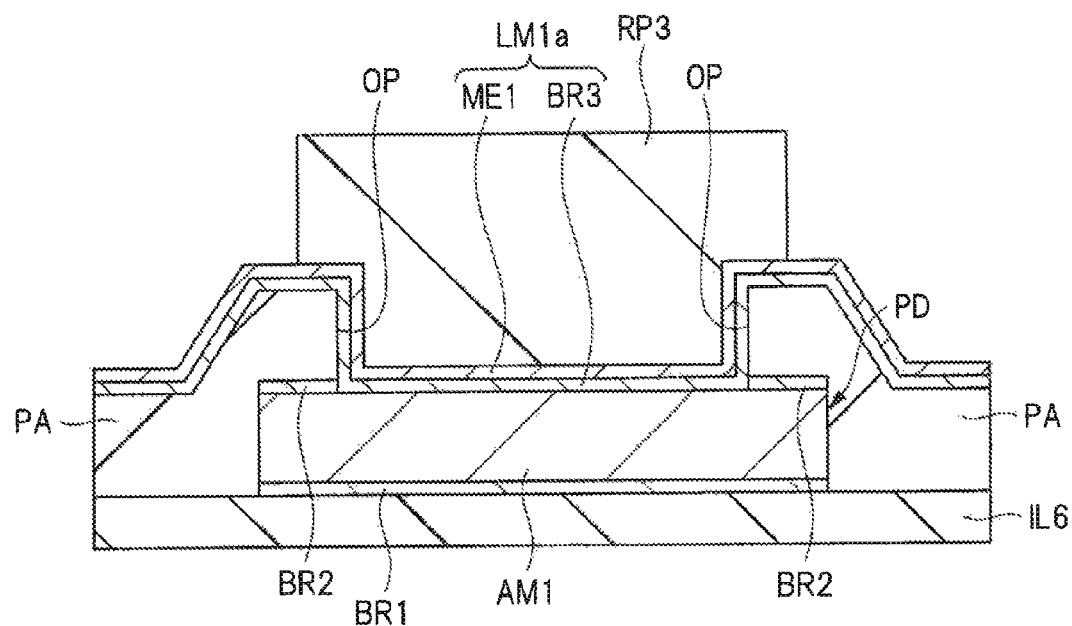
FIG. 19 is a main-portion cross-sectional view of the semiconductor device during the manufacturing process thereof, which is subsequent to FIG. 18.
Figure 20:
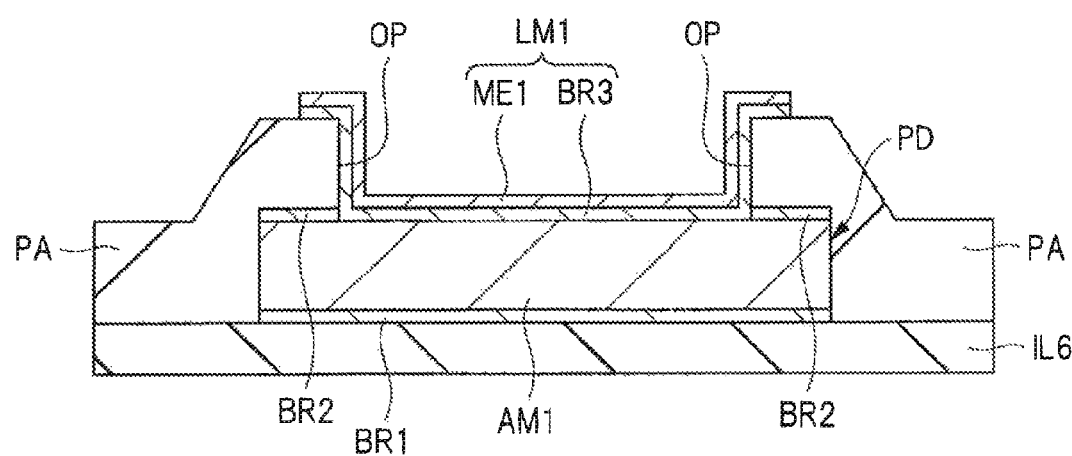
FIG. 20 is a main-portion cross-sectional view of the semiconductor device during the manufacturing process thereof, which is subsequent to FIG. 19.

Specifically, the patterning step in Step S26 can be performed as follows. First, as shown in FIG. 19, over the laminated film LM1a, a photoresist pattern RP3 is formed using a photolithographic technique. Then, using the photoresist pattern RP3 as an etching mask, the laminated film LM1a is etched. Thus, the portion of the laminated film LM1a which is uncovered with and exposed from the photoresist pattern RP3 is etched and removed, while the portion of the laminated film LM1a which is covered with the photoresist pattern RP3 is not etched and remains. The step of etching the laminated film LM1a includes the step of etching the metal film ME1, and the step of subsequently etching the barrier conductor film BR3. The step of etching the metal film ME1 and the step of etching the barrier conductor film BR3 can be performed under varied etching conditions (such as, e.g., the type and flow rate of an etching gas). Thereafter, the photoresist pattern RP3 is removed. FIG. 20 shows the resulting stage. Thus, the patterning step in Step S26 is performed. The laminated film LM1a patterned in Step S26 serves as the laminated film LM1.

After the photoresist pattern RP3 is formed and before the etching step (which is the step of etching the metal film ME1 herein) using the photoresist pattern RP3 is performed, oxygen or argon plasma treatment can also be performed. This allows, even when an impurity has been deposited over the photoresist pattern RP3, the top surface of the photoresist pattern RP3 to be ground together with the impurity. Thus, the top surface of the photoresist pattern RP3 can be cleaned. As a result, it is easier to prevent an impurity from being deposited over the top surface of the metal film ME1 due to the photoresist pattern RP3. The same applies to each of modifications and the second and third embodiments described later.

After the photoresist pattern RP3 is removed, oxygen plasma treatment can also be performed. By performing the oxygen plasma treatment, even when the top surface of the underlying insulating film PA has been damaged by the formation of the barrier conductor film BR3 by a sputtering method, the damaged layer can be restored. Note that, in the case in a third modification described later, the oxygen plasma treatment is performed after the structure in FIG. 38 described later is obtained. In the case in the second embodiment described later, the oxygen plasma treatment is performed after the structure in FIG. 37 described later or the structure in FIG. 52 described later is obtained.

Subsequently, the back surface side of the semiconductor substrate SB is ground or polished as necessary to reduce the thickness of the semiconductor substrate SB. Then, the semiconductor substrate SB is subjected to dicing (cutting) together with the laminated structure over the semiconductor substrate SB. At this time, the semiconductor substrate SB and the laminated structure over the semiconductor substrate SB are diced (cut) along scribe regions.

In this manner, the semiconductor device (semiconductor chip) CP can be manufactured.

<About First Studied Example>

Figure 21:
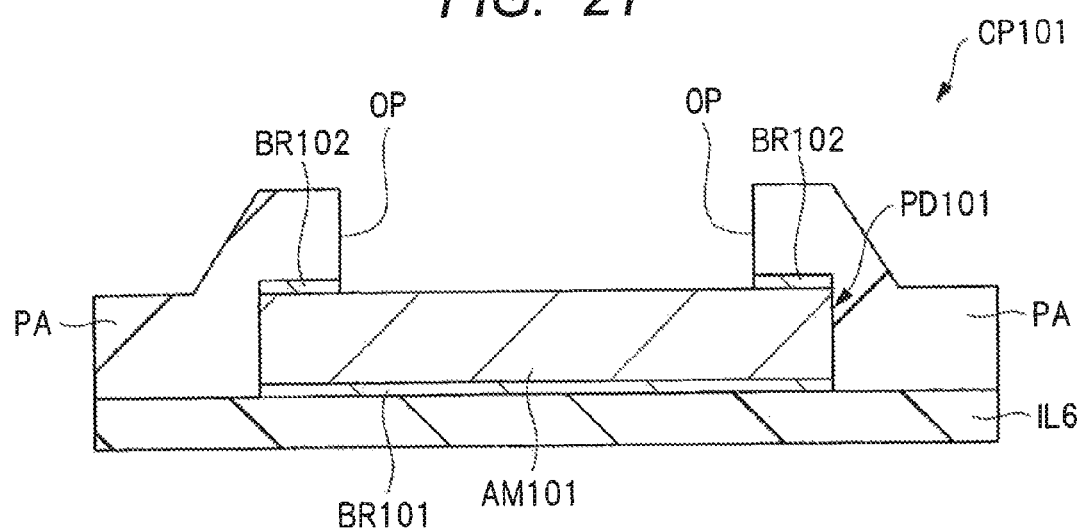
FIG. 21 is a main-portion cross-sectional view of a semiconductor device in a first studied example.

FIG. 21 is a main-portion cross-sectional view of a semiconductor device CP101 in the first studied example studied by the present inventors, which corresponds to FIG. 6 described above in the present embodiment.

In the semiconductor device (semiconductor chip) CP101 in the first studied example shown in FIG. 21, no equivalent to the foregoing laminated film LM1 is formed. That is, in the semiconductor device CP101 in the first studied example shown in FIG. 21, a pad PD101 corresponding to the pad PD is formed of a laminated film including a barrier conductor film BR101, an aluminum film AM101 over the barrier conductor film BR101, and a barrier conductor film BR102 over the aluminum film AM101. The barrier conductor film BR101 corresponds to the foregoing barrier conductor film BR1. The barrier conductor film BR102 corresponds to the foregoing barrier conductor film BR2. The aluminum film AM101 corresponds to the foregoing Al-containing conductive film AM1. The portion of the barrier conductor film BR102 which is exposed from the opening OP of the insulating film PA has been removed. Consequently, at the bottom portion of the opening OP, the upper surface of the aluminum film AM101 included in the pad PD101 is exposed. Over the pad PD101, no equivalent to the foregoing laminated film LM1 is formed.

Figure 22:
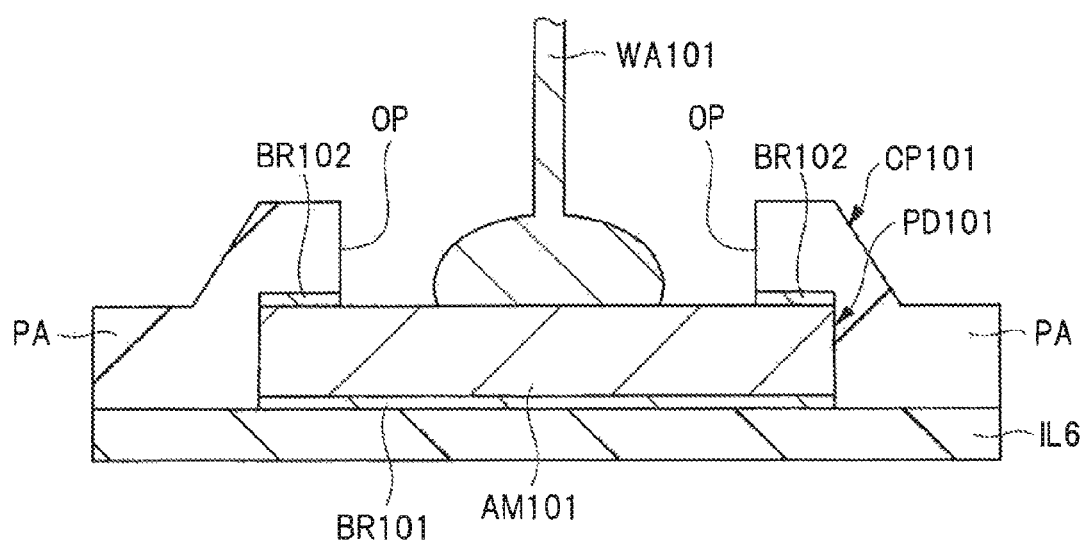
FIG. 22 is a cross-sectional view showing a state where a copper wire is electrically coupled to the pad shown in FIG. 21.

FIG. 22 is a cross-sectional view showing the state where, in the semiconductor device P101 in the first studied example shown in FIG. 21, a copper wire WA101 is electrically coupled to the pad PD101, which corresponds to FIG. 9 described above.

As shown in FIG. 22, to the pad PD101 exposed from the opening OP of the insulating film PA, the copper wire WA101 corresponding to the foregoing wire WA is coupled.

In the first studied example shown in FIG. 21, over the pad PD101 exposed from the opening OP of the insulating film PA, no equivalent to the foregoing laminated film LM1 has been formed. From the opening OP of the insulating film PA, the upper surface of the aluminum film AM101 included in the pad PD101 is exposed. As a result, when wire bonding is performed to the pad PD101, as shown in FIG. 22, the copper wire WA101 is coupled (bonded) directly to the aluminum film AM101 included in the pad PD101.

As a result of study, the present inventors have found that, in the case in the first studied example shown in FIGS. 21 and 22, such a problem as described below arises.

FIGS. 23A to 23C are cross-sectional views each showing the vicinity of the region where the copper wire WA101 is coupled to the pad PD101 in the semiconductor device CP101 in the first studied example shown in FIG. 22.

Figure 27A:
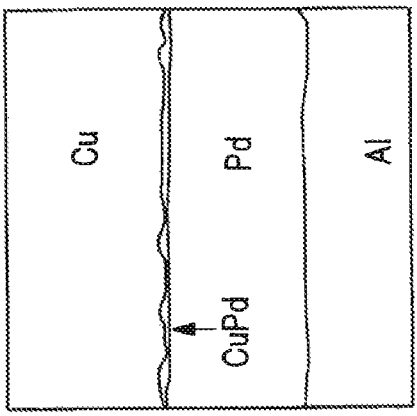
FIGS. 27A to 27C are cross-sectional views each showing the vicinity of a region where the copper wire is coupled to the pad in the semiconductor device in the second studied example.

Each of FIG. 23A and FIGS. 24A and 27A described later corresponds to the state immediately after a semiconductor package was manufactured. Each of FIG. 23B and FIGS. 24B and 27B described later corresponds to the state after a high-temperature storage test (at 240° C.) was performed on the semiconductor package. Each of FIG. 23C and FIGS. 24C and 27C described later corresponds to the state immediately after a high-temperature/humidity test (at 130° C./85% RH) was performed on the semiconductor package. The semiconductor package corresponds to the foregoing semiconductor device PKG1 or PKG2. Note that each of FIGS. 23A to 23C and FIGS. 24A to 24C and 27A to 27C described later is drawn on the basis of a TEM (Transmission Electron Micrograph).

At the stage immediately after the semiconductor package was manufactured using the semiconductor device CP101 in the first studied example, as also shown in FIG. 23A, at the junction interface between the aluminum film AM101 included in the pad PD101 and the copper wire WA101, a reaction product (compound) between Al (aluminum) forming the aluminum film AM101 and Cu (copper) forming the copper wire WA101 is formed in a small quantity. The reaction product is $Cu_9Al_4$ or CuAl.

In each of FIGS. 23A and 23C, the state (quantity and composition) of the reaction product (compound) between Al and Cu at the junction interface between the aluminum film AM101 and the copper wire WA101 is substantially the same. This indicates that, even when the high-temperature/humidity test (at 130° C./85% RH) is performed on the semiconductor package manufactured using the semiconductor device CP101 in the first studied example, the reaction product (compound) between Al forming the aluminum film AM101 and Cu forming the copper wire WA101 does not considerably increase in the vicinity of the junction interface between the aluminum film AM101 included in the pad PD101 and the copper wire WA101.

However, the state (quantity and composition) of the reaction product (compound) between Al and Cu in the vicinity of the junction interface between the aluminum film AM101 and the copper wire WA101 in FIG. 23A is significantly different from that in FIG. 23B. After the high-temperature storage test (at 240° C.) was performed, as also shown in FIG. 23B, in the vicinity of the junction interface between the aluminum film AM101 included in the pad PD101 and the copper wire WA101, the reaction product (compound) between Al forming the aluminum film AM101 and Cu forming the copper wire WA101 was produced in a large quantity. The reaction product (compound) is $Cu_9Al_4$, $Cu_3Al_2$, or CuAl. That is, when the high-temperature storage test (at 240° C.) is performed on the semiconductor package manufactured using the semiconductor device CP101 in the first studied example, the state shown in FIG. 23A shifts to the state shown in FIG. 23B and the reaction product (compound) between Al forming the aluminum film AM101 and Cu forming the copper wire WA101 significantly increases.

A compound between Al and Cu, especially $Cu_9Al_4$, has low corrosion resistance (i.e., is susceptible to corrosion). In addition, $Cu_9Al_4$ is also susceptible to NaCl (sodium chloride) or the like and therefore susceptible to Cl (chlorine) ions or the like. Accordingly, even in a neutral environment, $Cu_9Al_4$ may be corroded.

As a result, when a compound between Al and Cu (especially $Cu_9Al_4$) is formed in a large quantity in the vicinity of the junction interface between the aluminum film AM101 included in the pad PD101 and the copper wire WA101, the reliability of the coupling of the copper wire WA101 to the pad PD101 may deteriorate to possibly degrade the reliability of the semiconductor package. Specifically, when a compound between Al and Cu (especially $Cu_9Al_4$) is formed in a large quantity in the vicinity of the junction interface between the aluminum film AM101 included in the pad PD101 and the copper wire WA101, e.g., the strength of the coupling of the copper wire WA101 to the pad PD101 decreases or the coupling resistance between the pad PD101 and the copper wire WA101 increases. In the worst case, the electric coupling between the copper wire WA101 and the pad PD101 is removed to cause a disconnection failure.

A compound between Al and Cu (especially $Cu_9Al_4$) is formed in a large quantity in the vicinity of the junction interface between the aluminum film AM101 included in the pad PD101 and the copper wire WA101 in the case where the high-temperature storage test (at 240° C.) is performed, not in the case where the high-temperature/humidity test (at 130° C./85% REI) is performed. This indicates that the reaction between Al forming the aluminum film AM101 and Cu forming the copper wire WA101 is accelerated by a temperature factor. Note that a test object (which is the semiconductor package herein) is exposed to a higher ambient temperature in the high-temperature storage test (at 240° C.) than in the high-temperature/humidity test (at 130° C./85% RH). When the test object is exposed to such a high-temperature environment for a long period of time, in the vicinity of the junction interface between the aluminum film AM101 included in the pad PD101 and the copper wire WA101, corrosion by S (sulfur) or a sulfide occurs between a Cu region (copper wire) and a $Cu_9Al_4$ region to degrade the reliability of the coupling of the copper wire WA101 to the pad PD101. On the other hand, in a high-temperature/humidity environment, a compound between Al and Cu (especially $Cu_9Al_4$) is corroded by Cl (chlorine), a chloride, Br (bromine), or a bromide to be changed to alumina. This degrades the reliability of the coupling of the copper wire WA101 to the pad PD101

The problem described heretofore with reference to the first studied example occurs when a copper wire is coupled to an aluminum pad, but does not occur when a gold wire is coupled to an aluminum pad. That is, the present inventors could find the problem as a result of examining the use of a copper wire and actively performing the analysis of the reaction product between an aluminum pad and a copper wire in conjunction with a reliability test.

<About Main Characteristic Features and Effects>

The semiconductor device CP in the present embodiment includes the semiconductor substrate SB, the interlayer insulating film IL6 (first insulating film) formed over the semiconductor substrate SB, the pad PD formed over the interlayer insulating film IL6, the insulating film PA (second insulating film) formed over the interlayer insulating film IL6 so as to cover the pad PD, and the opening OP formed in the insulating film PA to expose a part of the pad PD. The pad PD is a pad to which a copper wire (wire WA) is to be coupled and includes the Al-containing conductive film AM1 containing aluminum as a main component. Over the Al-containing conductive film AM1 in the region overlapping the opening OP in plan view, the laminated film including the barrier conductor film BR3 (first conductor film), and the metal film ME1 (second conductor film) over the barrier conductor film BR3 is formed. In the laminated film, the metal film ME1 is in the uppermost layer.

The semiconductor device PKG (PKG1 or PKG2) in the present embodiment includes the semiconductor device (semiconductor chip) CP having the pad PD, the wire WA (copper wire) electrically coupled to the pad PD of the semiconductor device CP, and the sealing resin portion (MR1 or MR2) sealing therein the semiconductor device CP and the wire WA. The pad PD includes the Al-containing conductive film. AM1 containing aluminum as a main component. Between the wire WA and the Al-containing conductive film AM1, the laminated film including the barrier conductor film BR3 (first conductor film), and the metal film ME1 (second conductor film) over the barrier conductor film BR3 is interposed. The wire WA is bonded to the metal film ME1.

The barrier conductor film BR3 (first conductor film) is a single-layer film or a laminated film including at least one or more layers of films selected from the group consisting of a titanium (Ti) film, a titanium nitride (TiN) film, a tantalum (Ta) film, a tantalum nitride (TaN) film, a tungsten (W) film, a tungsten nitride (WN) film, a titanium-tungsten (TiW) film, and a tantalum-tungsten (TaW) film. The metal film ME1 (second conductor film) is made of one or more metals selected from the group consisting of palladium (Pd), gold (Au), ruthenium (Ru), rhodium (Rh), platinum (Pt), and iridium (Ir).

One of the main characteristic features of the present embodiment is that the pad PD of the semiconductor device CP is a pad to which the copper wire (wire WA) is to be coupled. Accordingly, in the semiconductor device PKG using the semiconductor device (semiconductor chip) CP, the copper wire (corresponding to the wire WA) is electrically coupled to the pad PD of the semiconductor device CP.

Another one of the main characteristic features of the present embodiment is that, in the semiconductor device CP, the pad PD includes the Al-containing conductive film AM1 containing aluminum as a main component and, over the Al-containing conductive film AM1 in a region overlapping the opening OP of the insulating film PA in plan view, the barrier conductor film BR3 and the metal film ME1 over the barrier conductor film BR3 are formed. Accordingly, in the semiconductor device PKG using the semiconductor device (semiconductor chip) CP, between the wire WA (copper wire) and the Al-containing conductive film AM1, the laminated film including the barrier conductor film BR3, and the metal layer ME1 over the barrier conductor film BR3 is interposed so that the wire WA is bonded to the metal film ME1. The barrier conductor film BR3 is a single-layer film or a laminated film including at least one or more layers of films selected from the group consisting of a titanium film, a titanium nitride film, a tantalum film, a tantalum nitride film, a tungsten film, a tungsten nitride film, a titanium-tungsten film, and a tantalum-tungsten film. The metal film ME1 is made of one or more metals selected from the group consisting of palladium (Pd), gold (Au), ruthenium (Ru), rhodium (Rh), platinum (Pt), and iridium (Ir).

That is, in the present embodiment, the copper wire (wire WA) is electrically coupled to the pad PD as the aluminum pad. Between the Al-containing conductive film AM1 forming the pad PD and the copper wire (wire WA), the laminated film including the barrier conductor film BR3, and the metal film ME1 over the barrier conductor film BR3 is interposed, and the respective materials of the barrier conductor film BR3 and the metal film ME1 are chosen as described above. This can improve the reliability of the coupling of the copper wire (wire WA) to the pad PD and consequently improve the reliability of each of the semiconductor device CP and the semiconductor device PKG using the semiconductor device CP. The reason for this will be described below.

FIG. 24 is a cross-sectional view showing the vicinity of the region where the copper wire (wire WA) is coupled to the pad PD in the semiconductor device CP in the present embodiment in FIG. 9 described above, which corresponds to FIG. 23 described above. Note that FIG. 24 shows the case where the barrier conductor film BR3 is a titanium (Ti) film, and the metal film ME1 is a palladium (Pd) film.

In the present embodiment, the wire WA (copper wire) is electrically coupled to the pad PD in the semiconductor device CP. Over the portion (i.e., portion exposed from the opening OP) of the Al-containing conductive film. AM1 which overlaps the opening OP in plan view, the barrier conductor film BR3 and the metal film ME1 over the barrier conductor film BR3 are formed. The outermost surface in the region to which the wire WA is coupled is the metal film ME1 (Pd) film. That is, in wire bonding, the wire WA comes into contact with the metal film ME1 (Pd film) in the outermost surface. Accordingly, the wire WA is coupled (bonded) to the metal film ME1.

Figure 24A:
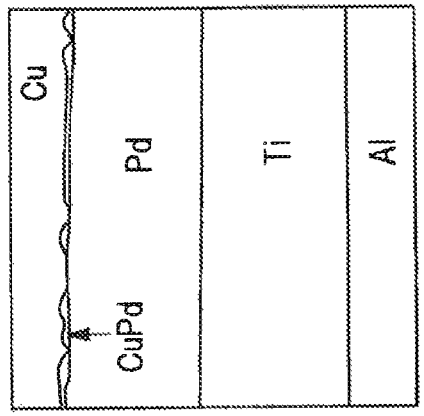
FIGS. 24A to 24C are cross-sectional views each showing the vicinity of a region where the copper wire is coupled to the pad in the semiconductor device in the embodiment.

Therefore, at the stage immediately after the semiconductor package is manufactured using the semiconductor device CP in the present embodiment, as also shown in FIG. 24A, in the vicinity of the junction interface between the metal film ME1 and the wire WA, a reaction product (compound) between the metal element (which is Pd herein) forming the metal film ME1 and Cu (copper) forming the wire WA may be formed in a small quantity. The reaction product (compound) is a CuPd (CuPd) (CuPd solid solution or $Cu_1Pd_1$ intermetallic compound).

Figure 24B:
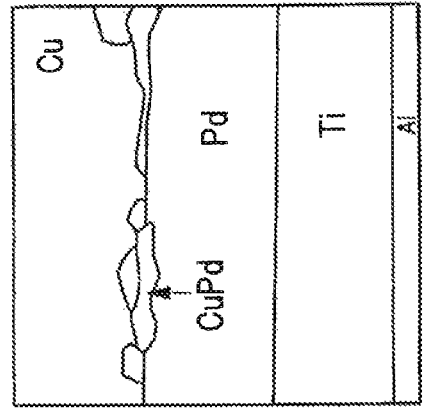
Figure 24C:
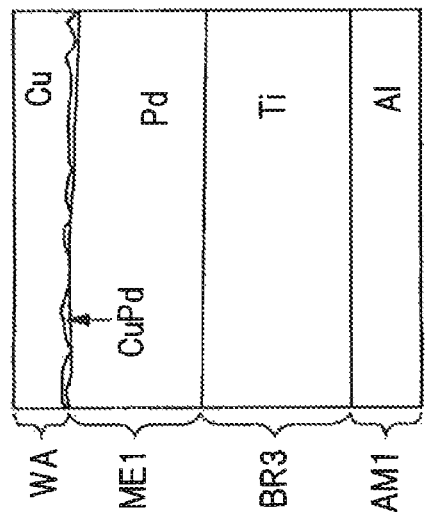

In each of FIGS. 24A and 24C, the state (quantity and composition) of the reaction product (compound) between Pd and Cu in the vicinity of the junction interface between the metal film ME1 and the wire WA is substantially the same. This indicates, even when the high-temperature/humidity test (at 130° C./85% REI) is performed on the semiconductor package manufactured using the semiconductor device CP, in the vicinity of the junction interface between the metal film ME1 and the wire WA, the reaction product (compound) between the metal element (which is Pd herein) forming the metal film ME1 and Cu (copper) forming the wire WA scarcely increases.

When the temperature set in the high-temperature storage test was not higher than 200° C., even though the high-temperature storage test was performed, in the vicinity of the junction interface between the metal film ME1 and the copper wire (wire WA), the reaction product (compound) between the metal element (which is Pd herein) forming the metal film ME1 and Cu forming the copper wire (wire WA) scarcely increased (substantially the same state as in FIG. 24A was observed).

On the other hand, after the high-temperature storage test at 240° C. was performed, as also shown in FIG. 24B, in the vicinity of the junction interface between the metal film ME1 and the copper wire (wire WA), the quantity of the reaction product (compound) produced between the metal element (which is Pd herein) forming the metal film ME1 and Cu (copper) forming the wire WA slightly increased. However, the increment was not so large. No change was observed in the phase (composition) of the produced reaction product and only the quantity of CuPd (CuPd solid solution or $Cu_1Pd_1$ intermetallic compound) increased. Since CuPd (CuPd solid solution or $Cu_1Pd_1$ intermetallic compound) is immune to corrosion and has high corrosion resistance, even when CuPd is generated in the vicinity of the junction interface between the metal film ME1 and the copper wire (wire WA), the reliability of the coupling of the wire WA scarcely deteriorates.

The reaction product (compound) between the metal element forming the metal film ME1 and Cu forming the wire WA has corrosion resistance (resistance to corrosion) higher than that of a reaction product (compound) between Al and Cu, especially $Cu_9Al_4$. That is, the metal element forming the metal film ME1 is chosen such that, even when placed in a high-temperature environment such as in a high-temperature storage test, the metal element forming the metal film ME1 and Cu forming the wire WA do not react with each other and produce a reaction product (compound) having low corrosion resistance. Specifically, the metal element forming the metal film ME1 is one or more selected from the group consisting of Pd, Au, Ru, Rh, Pt, and Ir. More preferably, the metal element forming the metal film ME1 is Pd.

The barrier conductor film BR3 is formed of a material as mentioned above and has a high melting point and low reactivity to the metal element (which is Pd herein) forming the metal film ME1 and Al (aluminum) forming the Al-containing conductive film AM1. Accordingly, not only at the stage immediately after the semiconductor package is manufactured using the semiconductor device CP in the present embodiment, but also at the stage where the high-temperature/humidity test (at 130° C./85% RH) is performed and at the stage where the high-temperature storage test (at 240° C.) is performed also, the barrier conductor film BR3 scarcely reacts with the metal element (which is Pd herein) forming the metal film ME1 and Al forming the Al-containing conductive film AM1.

The barrier conductor film BR3 can also function to prevent Al (aluminum) forming the Al-containing conductive film AM1 from being diffused into the metal film ME1. Additionally, the barrier conductor film BR3 can also function to prevent Cu (copper) forming the wire WA from being diffused into the Al-containing conductive film AM1. This can prevent a reaction between Al (aluminum) forming the Al-containing conductive film AM1 and Cu (copper) forming the wire WA. Thus, it is possible to prevent Al forming the Al-containing conductive film AM1 and Cu forming the wire WA from reacting with each other and consequently producing a reaction product (compound) having low corrosion resistance, particularly producing $Cu_9Al_4$. This allows an improvement in the reliability of the coupling of the wire WA.

Unlike in the present embodiment, the case where no equivalent to the barrier conductor film BR3 can also be considered. This case will be described as a second studied example.

Figure 25:
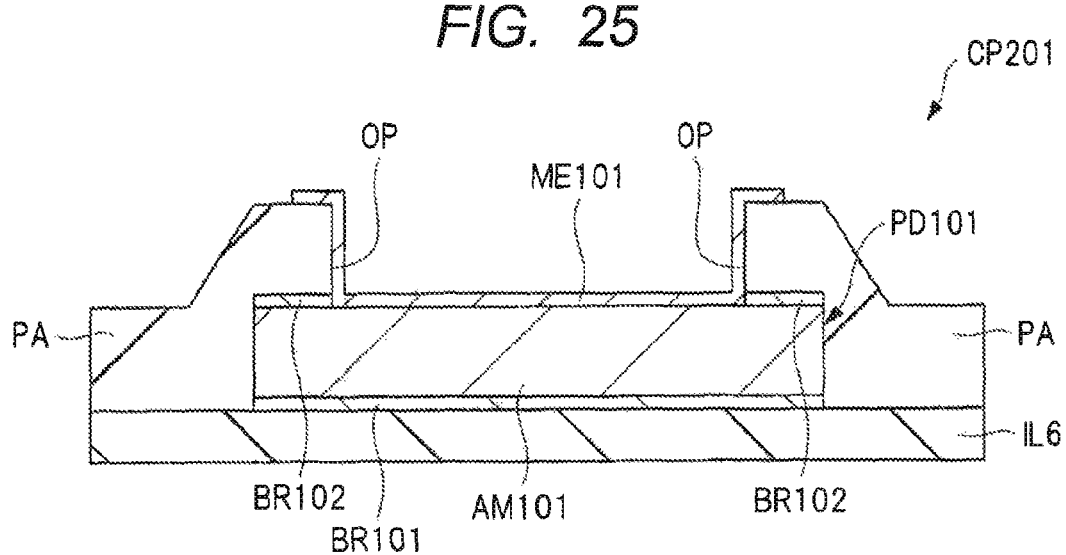
FIG. 25 is a main-portion cross-sectional view of a semiconductor device in a second studied example.
Figure 26:
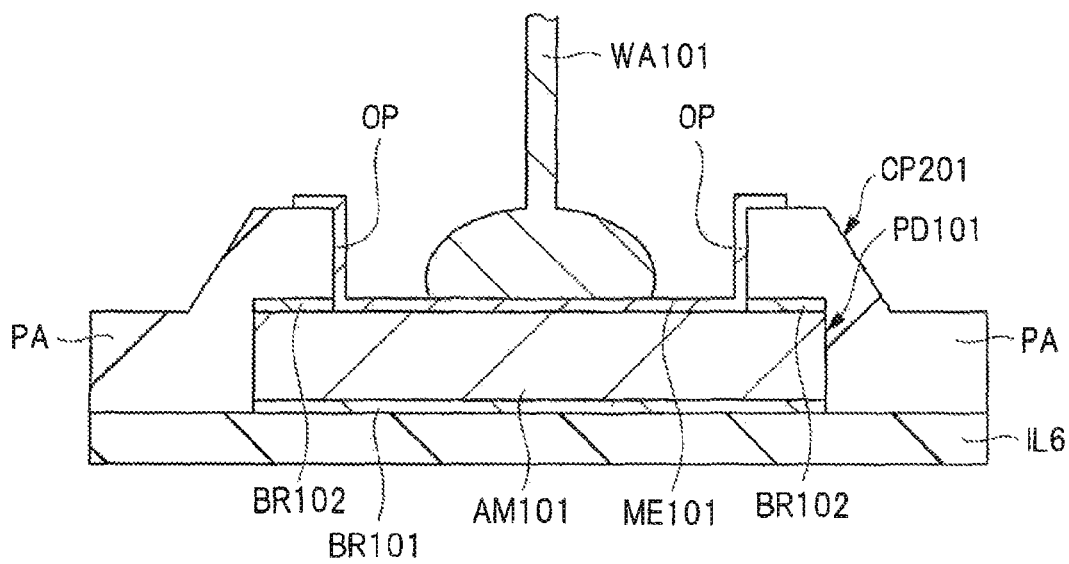
FIG. 26 is a cross-sectional view showing a state where a copper wire is electrically coupled to the pad shown in FIG. 25.

FIG. 25 is a main-portion cross-sectional view of a semiconductor device CP201 in the second studied example studied by the present inventors, which corresponds to FIG. 21 described above in the first studied example. FIG. 26 is a cross-sectional view showing the state where, in the semiconductor device CP201 in the second studied example shown in FIG. 25, the copper wire WA101 is electrically coupled to the pad PD101, which corresponds to FIG. 22 described above in the foregoing first studied example.

In the second studied example shown in FIGS. 25 and 26, no equivalent to the barrier conductor film BR3 is formed. Over the portion of the aluminum film AM101 which is exposed from the opening OP, a palladium (Pd) film ME101 is formed and, to the palladium film ME101, the copper wire WA101 is coupled. That is, in the first studied example shown in FIG. 22 described above, to the aluminum film AM101 included in the pad PD101, the copper wire WA101 is directly coupled. By contrast, in the second studied example in FIG. 26, to the palladium film ME101 over the aluminum film AM101 included in the pad PD101, the copper wire WA101 is coupled.

FIG. 27 is a cross-sectional view showing, in enlarged relation, the vicinity of the region where the copper wire WA101 is coupled to the pad PD101 in the semiconductor device CP201 in the second studied example shown in FIG. 26. FIG. 27 corresponds to FIGS. 23 and 24 described above.

In the case in the second studied example shown in FIGS. 25 and 26, the copper wire WA101 is coupled to the palladium (Pd) film. Between the palladium (Pd) film and the aluminum film AM101, no equivalent to the barrier conductor film BR3 is formed. At the stage immediately after the semiconductor package is manufactured, as also shown in FIG. 27A, in the vicinity of the junction interface between the palladium film ME101 and the copper wire WA101, a reaction product (CuPd) between Pd (palladium) forming the palladium film ME101 and Cu (copper) forming the wire WA is formed in a small quantity. The quantity and composition of the reaction product is substantially the same as in the case in FIG. 24A described above. That is, in each of FIGS. 24A and 27A, the state (quantity and composition) of the reaction product (compound) between Pd and Cu in the vicinity of the junction interface between the palladium film (ME1 or ME101) and the copper wire (WA or WA101) is substantially the same. In each of FIGS. 24C and 27C also, the state (quantity and composition) of the reaction product (compound) between Pd and Cu in the vicinity of the junction interface between the palladium film (ME1 or ME101) and the copper wire (WA or WA101) is substantially the same.

Figure 27B:
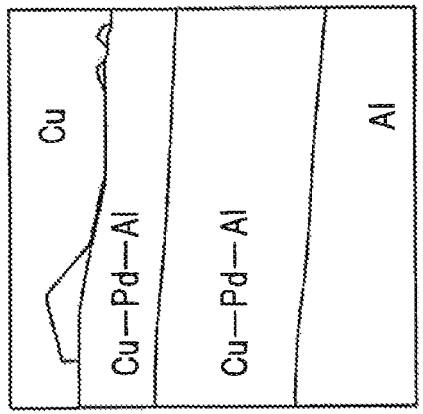
Figure 27C:
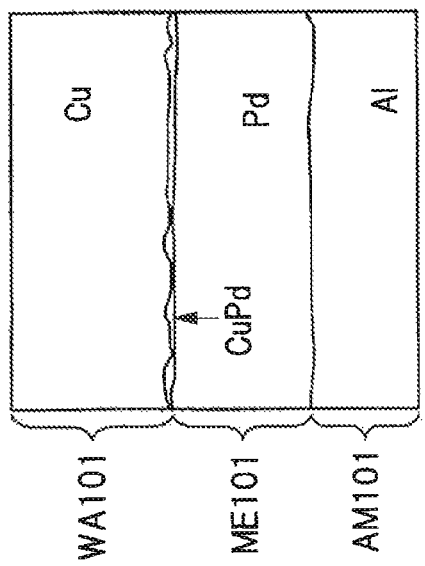

However, the state (quantity and composition) of a reaction product (compound) derived from Cu (copper) forming the copper wire (WA or WA101) in FIG. 27B is significantly different from that in FIG. 24B.

That is, in the case in the second studied example in which no equivalent to the barrier conductor film BR3 is provided unlike in the present embodiment, after a high-temperature storage test (at 240° C.) is performed, a reaction layer is formed in a large quantity between the aluminum film AM101 and the copper wire WS101, as also shown in FIG. 27B. The reaction layer is a compound layer formed of Cu (copper), Pd (palladium), and Al (aluminum), i.e., a Cu—Pd—Al layer (Cu—Pd—Al compound layer). That is, between the aluminum film AM101 and the copper wire WA101, the Cu—Pd—Al layer as a reaction layer between Al (aluminum), Pd (palladium), and Cu (copper) is generated in a large quantity. A conceivable reason why the reaction layer between Al, Pd, and Cu, not a reaction layer between Pd and Cu, is generated is that Al forming the aluminum film AM101 is diffused into the palladium film ME101 and diffused Al reacts with Cu forming the copper wire WA101 in conjunction with Pd. That is, unlike in the present embodiment, in the case in the second studied example where no equivalent to the barrier conductor film BR3 is provided, in a high-temperature environment such as in a high-temperature storage test, the diffusion of Al from the aluminum film AM101 into the palladium film ME101 cannot be prevented. Consequently, the diffused Al undesirably reacts with Cu forming the copper wire WA101.

The reaction product (compound) between Al, Cu, and Pd containing Pd is accordingly more resistant to corrosion than $Cu_9Al_4$, but the corrosion resistance thereof is still low. In a high-temperature environment, corrosion by S (sulfur) or a sulfide proceeds between a Cu region (copper wire) and a Cu—Pd—Al compound layer.

That is, in the case in the second studied example in which no equivalent to the barrier conductor film BR3 is provided unlike in the present embodiment, when a high-temperature storage test (at 240° C.) is performed, as shown in FIG. 27B, a reaction layer (compound layer) containing Al and Cu is undesirably generated between the aluminum film AM101 included in the pad PD101 and the copper wire WA101. Since the reaction layer shows low corrosion resistance to S (sulfur) or a sulfide, the reliability of the coupling of the copper wire WA101 deteriorates to degrade the reliability of the semiconductor package.

By contrast, in the present embodiment, between the Al-containing conductive film AM1 included in the pad PD and the copper wire (wire WA), not only the metal film ME1, but also the barrier conductor film BR3 is interposed. The barrier conductor film BR3 is present immediately under the metal film ME1 and consequently interposed between the Al-containing conductive film AM1 included in the pad PD and the metal film ME1. During the high-temperature storage test (at 240° C.), the barrier conductor film BR3 can function to prevent Al forming the Al-containing conductive film AM1 from reacting with Cu forming the wire WA.

Another case is assumed where, unlike in the present embodiment, the metal film ME1 is not provided and the wire WA is directly coupled to the barrier conductor film BR3 formed over the Al-containing conductive film AM1. In this case, it may be impossible to ensure the bonding strength between the barrier conductor film BR3 and the wire WA. This is because a material which allows the wire WA to be easily coupled thereto and allows the bonding strength of the wire WA to be easily ensured is not appropriate as the material of a film which prevents the diffusion of Al. For example, the case is assumed where a copper wire is coupled to a titanium film. When an oxide film has been formed over the top surface of the titanium film due to the susceptibility of the titanium film to oxidation, it is difficult to couple the copper wire to the titanium film, resulting in a reduction in bonding strength. In addition, since the titanium film is hard, it is difficult to couple the copper wire thereto and ensure the bonding strength. Moreover, since the titanium film is unreactive to the copper wire, it is also difficult to ensure the bonding strength in this respect.

By contrast, in the present embodiment, in wire bonding, the wire WA comes into contact with the metal film ME1 and is coupled (bonded) to the metal film ME1. For the metal film ME1, a material which allows the wire WA to be easily coupled thereto and allows the bonding strength of the wire WA to be easily ensured is used. As a result, the wire WA is easily coupled and the bonding strength of the wire WA is easily ensured.

That is, in the present embodiment, the wire WA is not coupled directly to the Al-containing conductive film. AM1 containing Al as a main component. Instead, over the Al-containing conductive film AM1, the laminated film which includes the barrier conductor film BR3, and the metal film ME1 over the barrier conductor film BR3 and in which the metal film ME1 is in the uppermost layer is formed, and the wire WA is coupled to the metal film ME1. As the metal film ME1, a material film which allows the wire WA to be easily coupled thereto and allows the bonding strength of the wire WA to be easily ensured is used. Even when placed in a high-temperature environment such as in a high-temperature storage test, the material film is prevented from reacting with Cu forming the wire WA and producing a reaction product having low corrosion resistance (i.e., susceptible to corrosion). As the barrier conductor film BR3, a material film which can prevent Al forming the Al-containing conductive film AM1 from being diffused into the metal film ME1 and reacting with Cu forming the wire WA even when placed in a high-temperature environment such as in a high-temperature storage test is used.

Accordingly, the metal film ME1 is made of one or more metals selected from the group consisting of palladium (Pd), gold (Au), ruthenium (Ru), rhodium (Rh), platinum (Pt), and iridium (Ir) and can be a single-layer film made of a one-layer metal film or a laminated film including a plurality of metal films. When the metal film ME1 is a laminated film, each of the plurality of metal films included in the laminated film is made of one or more metals selected from the group consisting of palladium (Pd), gold (Au), ruthenium (Ru), rhodium (Rh), platinum (Pt), and iridium (Ir). Most preferably, the metal film ME1 is a palladium (Pd) single-element film (single-layer film).

The barrier conductor film BR3 is a single-layer film or a laminated film including at least one or more layers of films selected from the group consisting of a titanium (Ti) film, a titanium nitride (TiN) film, a tantalum (Ta) film, a tantalum nitride (TaN) film, a tungsten (W) film, a tungsten nitride (WN) film, a titanium-tungsten (TiW) film, and a tantalum-tungsten (TaW) film. Preferably, the barrier conductor film BR3 includes a titanium (Ti) film and, over the titanium (Ti) film, the metal film ME1 is formed. Most preferably, the barrier conductor film BR3 is a titanium (Ti) film.

Figure 28:
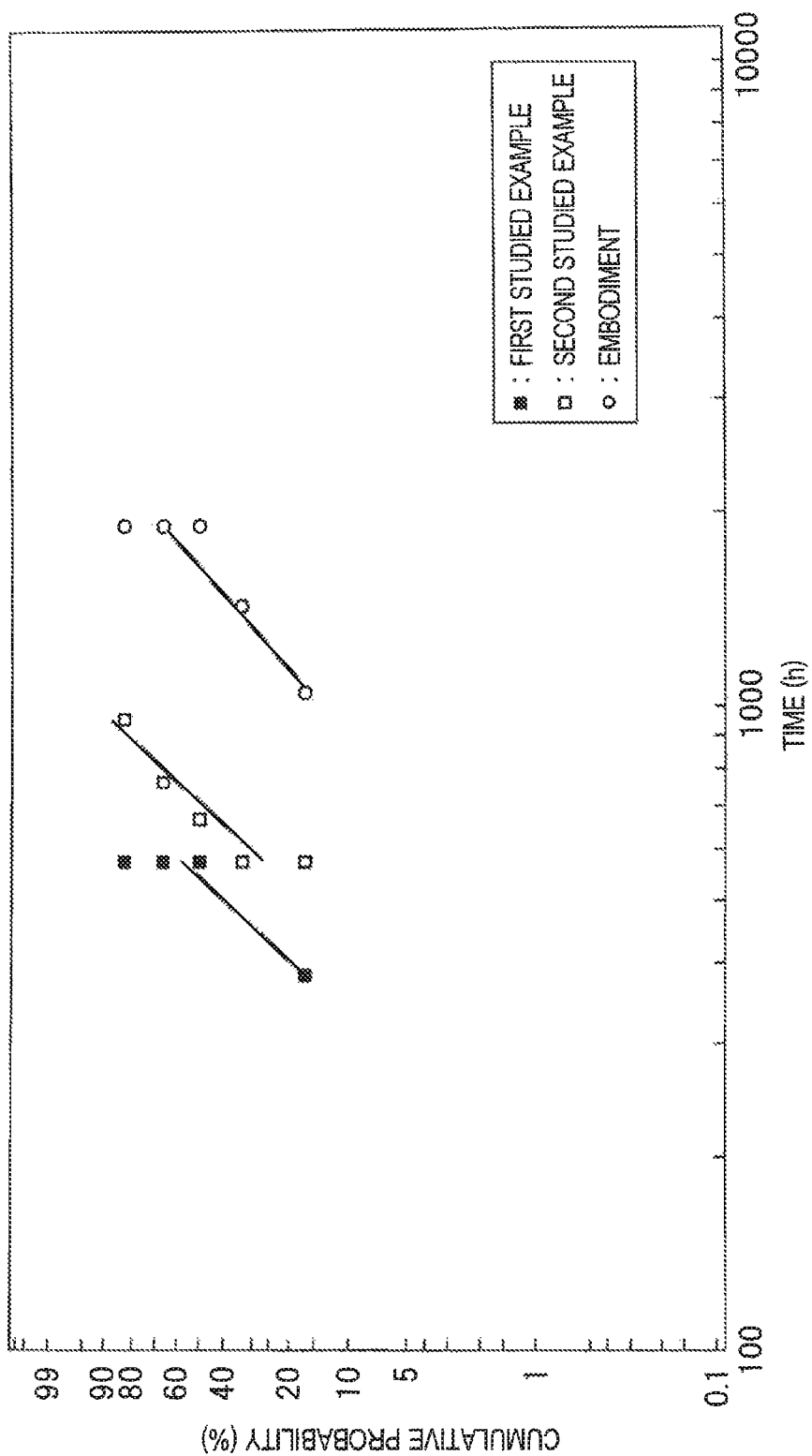
FIG. 28 is a graph showing the result of a reliability test in accordance with a high-temperature storage test.

FIG. 28 is a graph showing the result of a reliability test in accordance with a high-temperature storage test at 200° C. The abscissa axis of the graph in FIG. 28 corresponds to an elapsed time. The ordinate axis of the graph in FIG. 28 corresponds to the cumulative probability of the occurrence of a failure resulting from defective coupling of a copper wire. The graph in FIG. 28 shows the result of performing the reliability test in each of the first studied example (structure in FIG. 22), the second studied example (structure in FIG. 26), and the present embodiment (structure in FIG. 9). Note that, in FIG. 28, in the case in the present embodiment (structure in FIG. 9), a palladium film is used as the metal film ME1, and a titanium film is used as the barrier conductor film BR3. Note that, to serve as an acceleration test, the reliability test is performed by producing a semiconductor package using a sealing resin containing Cl ions (or a chloride) and $SO_4$ ions (or a sulfide) in a large quantity.

As can also be seen from the graph in FIG. 28, the result of the reliability test is most satisfactory in the present embodiment. That is, in the first studied example, a failure resulting from defective coupling of the copper wire is most likely to occur. In the second studied example, a failure resulting from defective coupling of the copper wire is less likely to occur than in the first studied example, but more likely to occur than in the present embodiment. In the present embodiment, a failure resulting from defective coupling of the copper wire is least likely to occur. A conceivable reason why the lifetime was short as a result of the reliability test in each of the first and second studied examples is that, as described above, in the region to which the copper wire is bonded, the $Cu_9Al_4$ layer susceptible to corrosion was generated in the first studied example, the $(Cu,Pd)_9Al_4$ layer less susceptible to corrosion than $Cu_9Al_4$ but still having low corrosion resistance was generated in the second studied example, and the corrosion of these layers caused the failures. In the present embodiment, such a compound layer having low corrosion resistance was not generated and therefore it can be considered that, as the result of the reliability test, the lifetime was long.

Thus, in the present embodiment, in the reliability test in accordance with the high-temperature storage test, the occurrence of a failure resulting from defective coupling of a wire can be suppressed (i.e., the lifetime can be elongated). Therefore, in the present embodiment, it is possible to improve the reliability of the semiconductor device.

The barrier conductor film BR3 has the function of preventing Al forming the Al-containing conductive film AM1 from being diffused into the metal film ME1. In view of this function, the thickness of the barrier conductor film BR3 is preferably not less than 5 nm. When the thickness of the barrier conductor film BR3 is excessively large, a film deposition time increases to reduce the throughput of the semiconductor device. Accordingly, the thickness of the barrier conductor film BR3 is more preferably not more than 200 nm. Since the barrier conductor film BR3 is harder than the metal film ME1, when the barrier conductor film BR3 is excessively thick, a crack may be formed during wire bonding (during the coupling of the wire WA). From this viewpoint, the thickness of the barrier conductor film BR3 is more preferably not more than 80 nm. Thus, the thickness of the barrier conductor film BR3 is preferably in the range of 5 to 200 nm, and most preferably in the range of 5 to 80 nm. Note that the thickness of the barrier conductor film BR3 mentioned herein is the thickness of the barrier conductor film BR3 at the stage before wire bonding is performed (before the wire WA is coupled). However, since the thickness of the barrier conductor film BR3 after wire bonding remains substantially unchanged from that before wire bonding, the thickness of the barrier conductor film BR3 mentioned herein can also be used even at the stage after wire bonding is performed and consequently in the semiconductor device PKG. In addition, the preferred values (range) of the thickness of the barrier conductor film BR3 described herein are applicable to the thickness of the barrier conductor film BR2 in the second and third embodiments described later. This is because, in the second and third embodiments described later, the barrier conductor film BR3 is not provided and the barrier conductor film BR2 is provided with the function of the barrier conductor film BR3.

In terms of ensuring the coupling strength of the wire WA, it is preferable that, after wire bonding is performed, the metal film ME1 is present under the wire WA. However, when the thickness of the metal film ME1 is excessively small, during wire bonding, the wire WA may cut through the metal film ME1 and consequently the metal film ME1 may not be interposed between the wire WA and the barrier conductor film BR3. Accordingly, the thickness of the metal film ME1 is preferably not less than 10 nm. This allows the metal film ME1 to be reliably present under the wire WA after wire bonding is performed and consequently allows the coupling strength of the wire WA to be easily ensured. When the thickness of the metal film ME1 is excessively large, the influence of the stress of the metal film ME1 may increase to possibly reduce the strength of the pad PD including the barrier conductor film BR3, and the metal film ME1. In addition, a time required for depositing the metal film ME1 also undesirably increases. Accordingly, the thickness of the metal film ME1 is preferably not more than 200 nm. Thus, the thickness of the metal film ME1 is preferably in the range of 10 to 200 nm. Note that the thickness of the metal film ME1 mentioned herein is the thickness of the metal film ME1 at the stage before wire bonding is performed (before the wire WA is coupled). Since the thickness of the metal film ME1 in the region other than the region to which the wire WA is coupled after wire bonding remains substantially unchanged from that before wire bonding, the thickness of the metal film ME1 mentioned herein is applicable to the thickness of the metal film ME1 in the region other than the region to which the wire WA is coupled at the stage after wire bonding is performed and consequently in the semiconductor device PKG.

The thickness of the Al-containing conductive film AM1 is, e.g., about 0.7 to 1.5 μm and can be selected from among various values in accordance with a product.

In the semiconductor device PKG (PKG1 or PKG2) manufactured using the semiconductor device (semiconductor chip) CP, at the junction interface between the wire WA (copper wire) and the metal film ME1, a reaction layer between the wire WA and the metal film ME1 may be formed. The reaction layer is an intermetallic compound (or solid solution) containing Cu forming the wire WA and the metal element forming the metal film ME1 and corresponds to the CuPd layer formed at the junction interface between the Cu layer (wire WA) and the Pd layer (metal film ME1) in FIG. 24A described above. When wire bonding is performed, at the junction interface between the wire WA (copper wire) and the metal film ME1, the reaction layer between the wire WA and the metal film ME1 is formed to be able to enhance the bonding strength of the wire WA.

Preferably, the metal film ME1 is formed by a sputtering method. The reason for this is as follows.

The metal film ME1 can also be formed by a plating method. However, when the metal film ME1 is formed by a plating method, due to film deposition using a plating solution, an organic component may be mixed in the metal film ME1 or contamination may be deposited on the top surface of the metal film ME. Since the top surface (upper surface) of the metal film ME1 forms a bonding surface (junction surface) to which the wire WA is bonded (joined), when an organic component is mixed in the metal film ME1 or contamination is deposited on the top surface of the metal film ME1, the strength of the bonding of the wire WA to the metal film ME1 may decrease. When the metal film ME1 is formed by a plating method, the formed metal film ME1 is harder than when the metal film ME1 is formed by a sputtering method. However, when the metal film ME1 is hard, the strength of the bonding of the wire WA to the metal film ME1 may decrease.

By contrast, when the metal film ME1 is formed by a sputtering method, an impurity such as an organic component is less likely to be mixed in the metal film ME1 and contamination is less likely to be deposited on the top surface of the metal film ME1. In addition, the formed metal film ME1 is softer when the metal film ME1 is formed by a sputtering method than when the metal film ME1 is formed by a plating method. Moreover, the formed metal film ME1 is denser when the metal film ME1 is formed by a sputtering method than when the metal film ME1 is formed by a plating method. Accordingly, by forming the metal film ME1 by a sputtering method, the strength of the bonding of the wire WA to the metal film ME1 can be improved. As a result, it is possible to improve the reliability of the coupling of the wire WA and consequently improve the reliability of the semiconductor package. In addition, a sputtering method allows a thin film to be formed more easily than by a plating method. Therefore, the metal film ME1 is more easily formed when formed by a sputtering method than when formed by a plating method.

More preferably, not only the metal film ME1, but also the barrier conductor film BR3 is formed by a sputtering method. By performing not only the step of depositing the metal film ME1, but also the step of depositing the barrier conductor film BR3, the step of depositing the barrier conductor film BR3 and the step of depositing the metal film ME1 can efficiently be performed. For example, using the same sputtering apparatus, the step of depositing the barrier conductor film BR3 and the step of depositing the metal film ME1 can continuously be performed.

<About First Modification>

Figure 29:
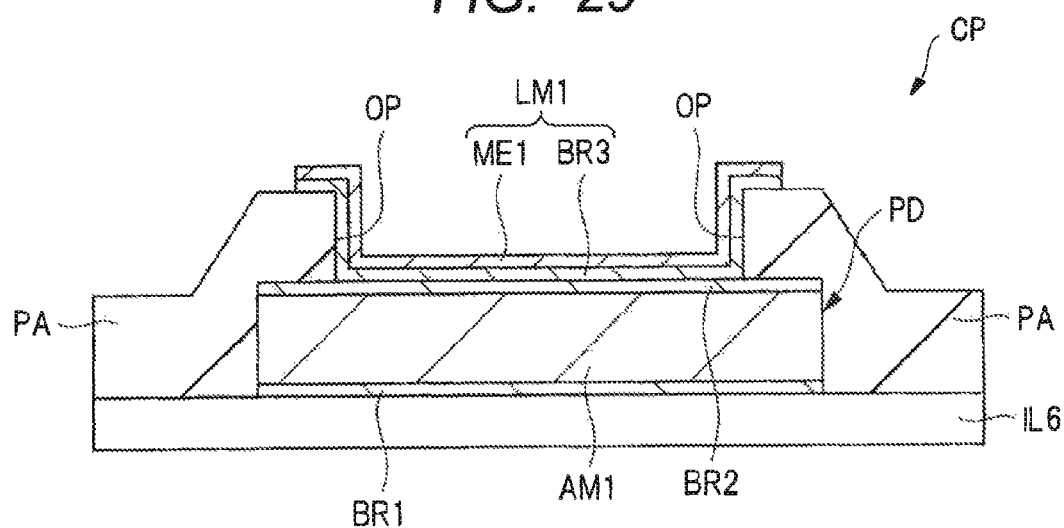
FIG. 29 is a main-portion cross-sectional view of a semiconductor device in a first modification.
Figure 30:
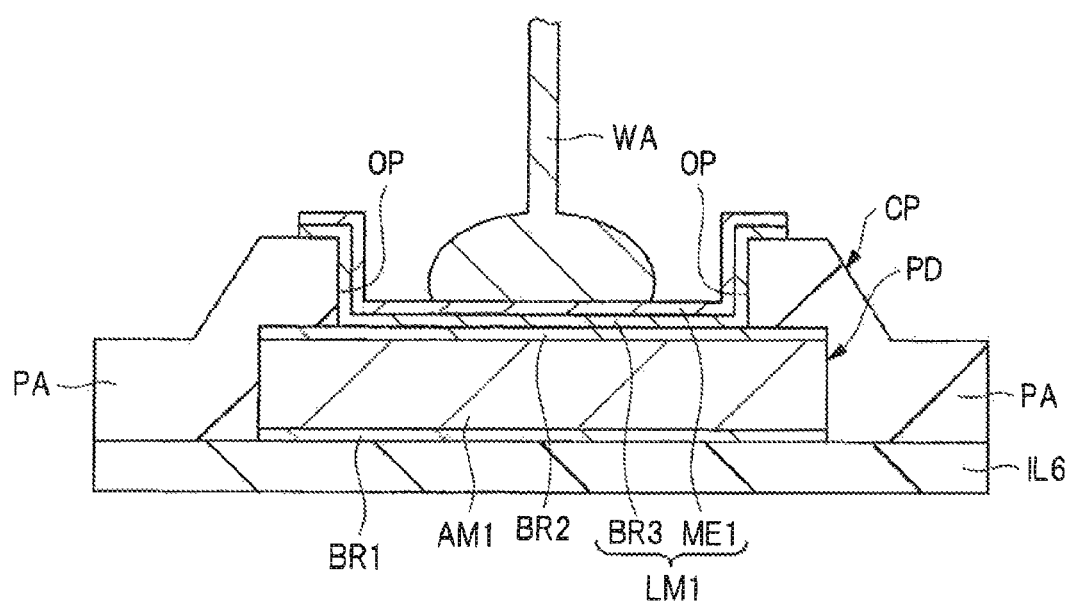
FIG. 30 is a cross-sectional view showing a state where a copper wire is electrically coupled to the pad shown in FIG. 29.

FIG. 29 is a main-portion cross-sectional view of the semiconductor device CP in a first modification of the present embodiment, which corresponds to FIG. 6 described above. FIG. 30 is a cross-sectional view showing the state where the wire WA is electrically coupled to the pad PD shown in FIG. 29 described above, which corresponds to FIG. 9 described above.

The semiconductor device CP in the first modification shown in FIGS. 29 and 30 is different from the semiconductor device CP shown in each of FIGS. 6 and 9 described above in that, in the case in the first modification, the barrier conductor film BR2 is formed over the entire upper surface of the Al-containing conductive film AM1 and, at the bottom portion of the opening OP, the barrier conductor film BR3 is formed not over the Al-containing conductive film AM1, but over the barrier conductor film BR2 over the Al-containing conductive film AM1. The semiconductor device CP in the first modification shown in FIGS. 29 and 30 is otherwise basically the same as the semiconductor device shown in each of FIGS. 6 and 9 described above.

Figure 31:
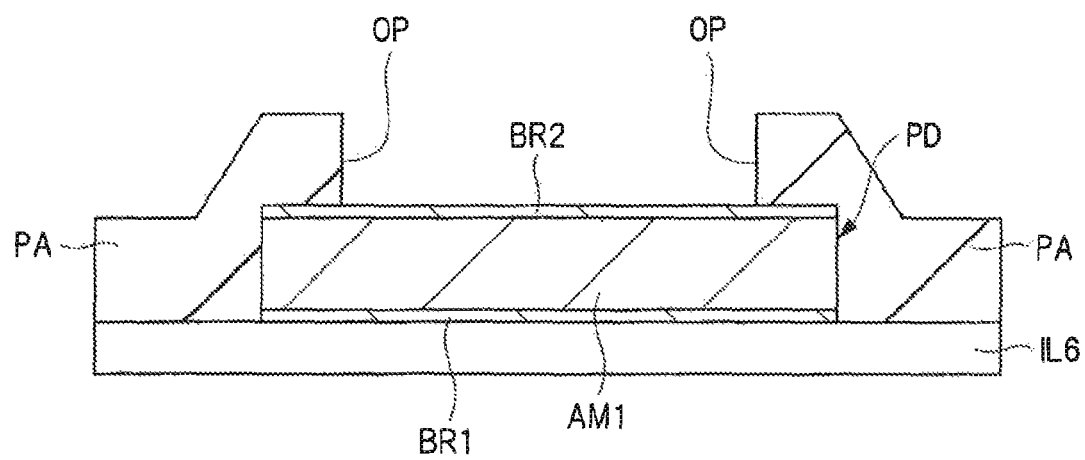
FIG. 31 is a main-portion cross-sectional view of the semiconductor device in the first modification during the manufacturing process thereof.

The manufacturing process of the semiconductor device CP in the first modification shown in FIG. 29 is different from the manufacturing process of the semiconductor device CP in FIG. 6 described above in the following point. Note that FIG. 31 is a main-portion cross-sectional view of the semiconductor device in the first modification during the manufacturing process thereof, which corresponds to the same process stage as that in FIG. 17 described above.

In the first modification, in Step S24 (step of forming the opening OP) described above, the insulating film PA is etched using the foregoing photoresist pattern RP2 as an etching mask such that the opening OP is formed therein. Thus, from the opening OP, the barrier conductor film BR2 of the pad PD is exposed. At the stage where the barrier conductor film BR2 of the pad PD is exposed from the opening OP, etching is ended. That is, after the barrier conductor film BR2 is exposed from the opening OP and before the Al-containing conductive film AM1 is exposed from the opening OP, etching is ended. Accordingly, in the first modification, as shown in FIG. 31, even when the opening OP is formed in Step S24, at the bottom portion of the opening OP, the barrier conductor film BR2 remains over the Al-containing conductive film AM1 and the Al-containing conductive film AM1 is not exposed. When the barrier conductor film BR3 is formed in Step S25 described above, the barrier conductor film BR3 is formed over the insulating film PA including the side wall of the opening OP, and the upper surface of the pad PD (which is the upper surface of the barrier conductor film BR2 herein) exposed from the opening OP. The manufacturing process is otherwise the same as described above with reference to FIGS. 10 to 20 so that a repeated description thereof is omitted herein.

In the semiconductor device in the first modification, when the opening OP is formed in the insulating film PA in Step S24 described above, the barrier conductor film BR2 need not be etched. This allows a reduction in the number of the process steps of manufacturing the semiconductor device and a reduction in the time required for manufacturing the semiconductor device. This also allows an improvement in the throughput of the semiconductor device.

Preferably, the barrier conductor film BR2 is made of a single-layer film or a laminated film including one or more layers of films selected from the group consisting of a titanium (Ti) film, a titanium nitride (TiN) film, a tantalum (Ta) film, a tantalum nitride (TaN) film, a tungsten (W) film, a tungsten nitride (WN) film, a titanium-tungsten (TiW) film, and a tantalum-tungsten (TaW) film. However, in view of the function of an antireflection film, as the barrier conductor film BR2, a titanium nitride (TiN) film is most preferred. As the barrier conductor film BR3, a titanium (Ti) film is preferably used.

<About Second Modification>

Figure 32:
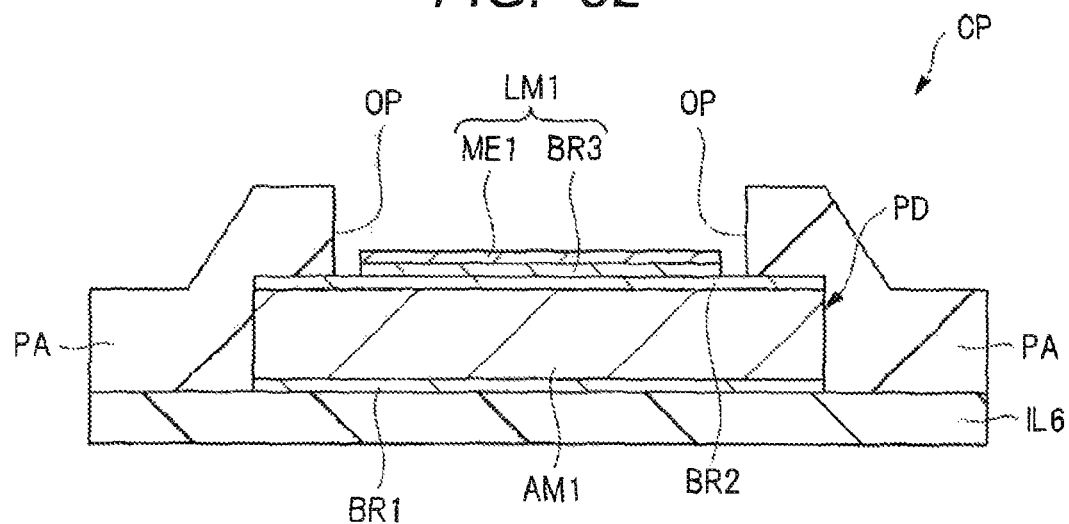
FIG. 32 is a main-portion cross-sectional view of a semiconductor device in a second modification.
Figure 33:
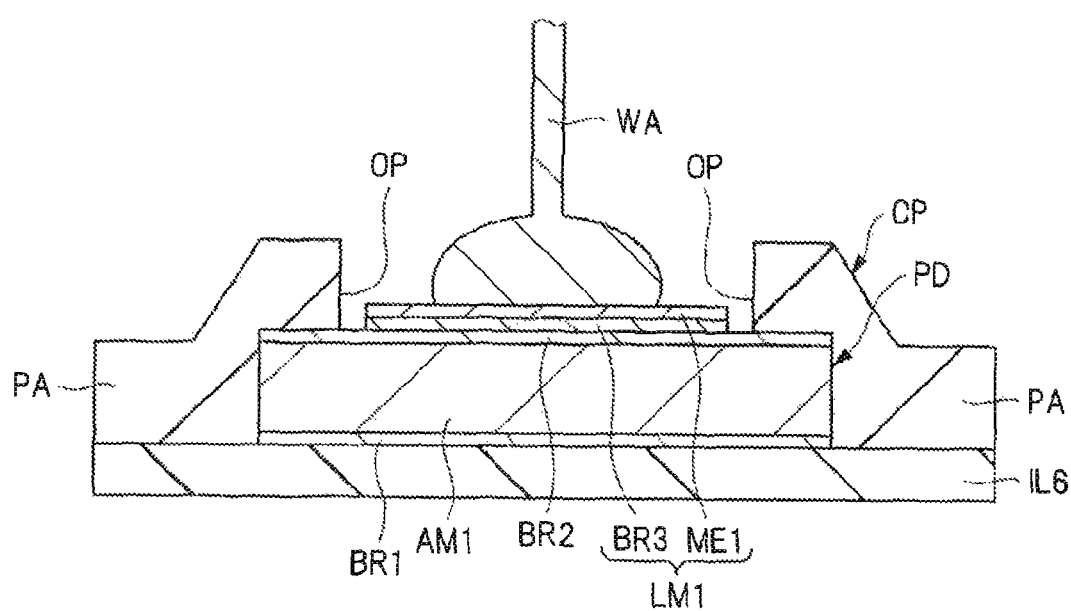
FIG. 33 is a cross-sectional view showing a state where a wire is electrically coupled to the pad shown in FIG. 32.

FIG. 32 is a main-portion cross-sectional view of the semiconductor device CP in a second modification of the present embodiment, which corresponds to FIGS. 6 and 29 described above. FIG. 33 is a cross-sectional view showing the state where the wire WA is electrically coupled to the pad PD shown in FIG. 32 described above, which corresponds to FIGS. 9 and 30 described above.

The semiconductor device CP shown in FIGS. 32 and 33 is different from the semiconductor device CP in the first modification shown in FIGS. 29 and 30 described above in that, in the case in the second modification shown in FIGS. 32 and 33, over the side wall of the opening OP of the insulating film PA and over the upper surface of the insulating film PA, the barrier conductor film BR3 and the metal film ME1 are not formed. Consequently, in the semiconductor device CP in the second modification shown in FIGS. 32 and 33, the laminated film including the barrier conductor film BR3, and the metal film ME1 over the barrier conductor film BR3 is formed locally over the pad PD exposed at the bottom portion of the opening OP. The semiconductor device CP in the second modification shown in FIGS. 32 and 33 is otherwise basically the same as the semiconductor device CP in the first modification shown in FIGS. 29 and 30 described above.

The manufacturing process of the semiconductor device CP in the second modification shown in FIG. 32 is different from the manufacturing process of the semiconductor device CP in the first modification shown in FIG. 29 described above in the following point. Note that FIG. 34 is a main-portion cross-sectional view of the semiconductor device in the second modification during the manufacturing process thereof, which corresponds to the same process stage as that in FIG. 19 described above.

Figure 34:
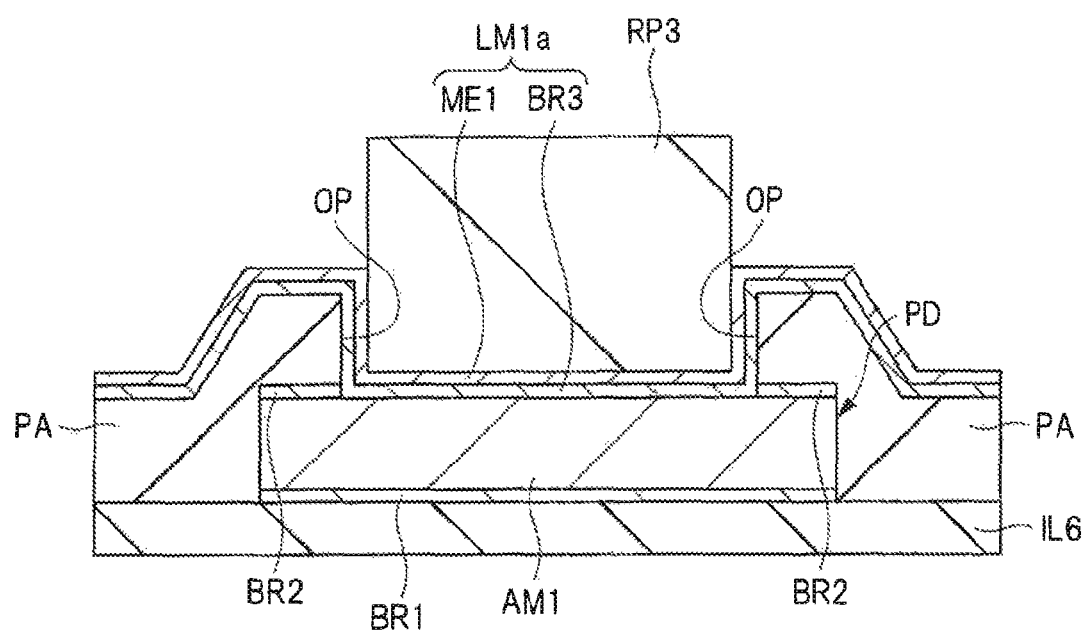
FIG. 34 is a main-portion cross-sectional view of the semiconductor device in the second modification during the manufacturing process thereof.

That is, in the second modification, in Step S26 (step of patterning the laminated film LM1a) described above, the photoresist pattern RP3 is formed using a photolithographic technique and, as shown in FIG. 34, the two-dimensional shape and two-dimensional size (plane area) of the photoresist pattern RP are set smaller than the two-dimensional shape and two-dimensional size (plane area) of the opening OP. That is, the photoresist pattern RP3 is caused to be included in the opening OP in plan view. As a result, when the laminated film LM1 is etched using the photoresist pattern RP3 as an etching mask, from the side wall of the opening OP of the insulating film PA and from the upper surface of the insulating film PA, the laminated film LM1 is removed. Consequently, the laminated film LM1 remains over the pad PD exposed at the bottom portion of the opening OP. The manufacturing process is otherwise the same as the manufacturing process of the semiconductor device in the first modification so that a repeated description thereof is omitted herein.

The second modification can also be applied to the semiconductor device CP in FIG. 6 described above. In that case, in the semiconductor device in FIG. 6 described above, over the side wall of the opening OP of the insulating film PA and over the upper surface of the insulating film PA, the barrier conductor film BR3 and the metal film ME1 are not formed. As a result, the laminated film including the barrier conductor film BR3 and the metal film ME1 over the barrier conductor film BR3 is formed locally over the pad PD exposed at the bottom portion of the opening OP.

In the second modification, over the side wall of the opening OP of the insulating film PA, the barrier conductor film BR3 and the metal film ME1 are not formed. Accordingly, in wire bonding, the barrier conductor film BR3 and the metal film ME1 each over the side wall of the opening OP do not interrupt wire bonding so that wire bonding is easily performed. That is, the wire bonding possible region in the pad PD is defined by the opening OP and, when the barrier conductor film BR3 and the metal film ME1 are formed over the side wall of the opening OP, the effective area of the opening OP is accordingly reduced by the thicknesses of the films. In view of this, the second modification is applied to the semiconductor device CP in FIG. 6 described above to prevent the barrier conductor film BR3 and the metal film ME1 from being formed over the side wall of the opening OP of the insulating film PA. This allows the effective area of the opening OP to be increased to be larger than when the barrier conductor film BR3 and the metal film ME1 are formed over the side wall of the opening OP of the insulating film PA and allows an increase in the area of the wire bonding possible region in the pad PD. Accordingly, when the area of the opening OP is not changed, the wire bonding step is easily performed. In addition, since the barrier conductor film BR3 and the metal film ME1 are not formed over the side wall of the opening OP of the insulating film PA, the area of the opening OP can be reduced advantageously for a reduction in the size (a reduction in the area) of the semiconductor device. This also facilitates an increase in the number of pads and a reduction in the pitch of the pads.

<About Third Modification>

FIGS. 35 to 38 are main-portion cross-sectional views of a semiconductor device in a third modification during the manufacturing process thereof.

In the third modification, Steps S25 and S26 described above are different from those in the manufacturing process in FIGS. 10 to 20 described above. Note that the manufacturing process in the third modification is also applicable to each of the manufacturing process in the foregoing first modification and the manufacturing process in the foregoing second modification.

In the third modification, the manufacturing process is performed in accordance with the manufacturing process shown in FIGS. 10 to 17 described above up to Step S24 (the step of forming the opening OP) described above to obtain the structure in FIG. 17 described above. Note that, in FIG. 17 described above, as described above, the barrier conductor film BR2 has been removed from the bottom portion of the opening OP so that the Al-containing conductive film AM1 is exposed at the bottom portion of the opening OP. In another form, it is also possible that, in the third modification, the barrier conductor film BR2 is not removed and is left at the bottom portion of the opening OP in the same manner as in the foregoing first modification. In that case, as shown in FIG. 31 described above, not in FIG. 17 described above, the barrier conductor film BR2 remains at the bottom portion of the opening OP.

Next, Step S25 described above is performed to successively form the barrier conductor film BR3 and the metal film ME1 over the insulating film PA including the side wall of the opening OP, and the upper surface of the pad PD exposed from the opening OP, which is the same as in the step shown in FIG. 18 described above. However, the manufacturing process in the third modification is different from the manufacturing process shown in FIGS. 10 to 20 described above in that, as shown in FIG. 35, over the metal film ME1, a barrier conductor film BR4 is further formed.

Figure 35:
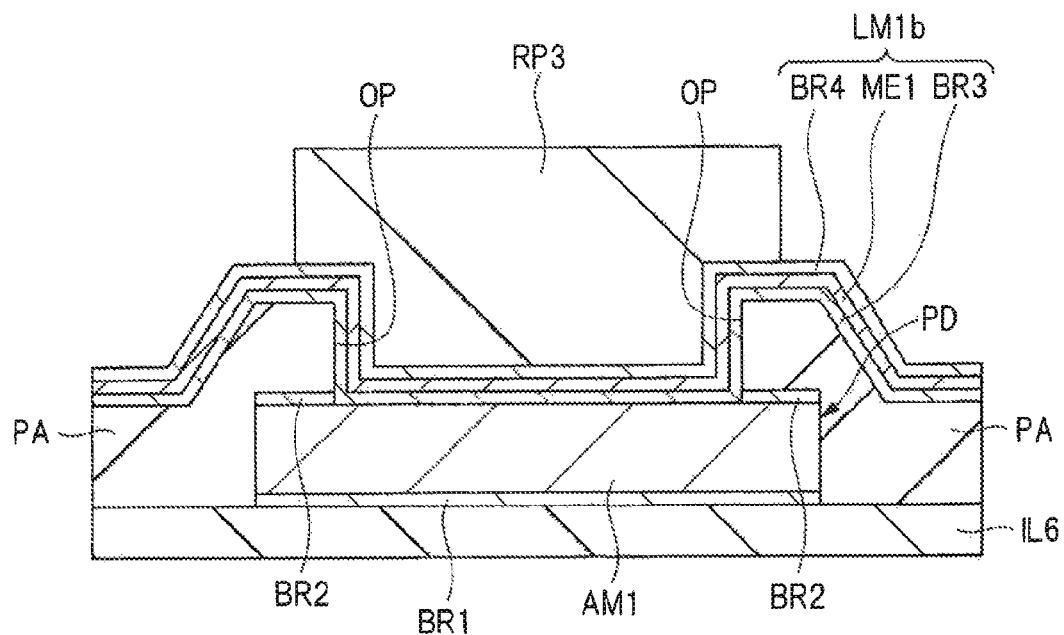
FIG. 35 is a main-portion cross-sectional view of a semiconductor device in a third modification during a manufacturing process thereof.

That is, in the third modification, in Step S25 described above, not only the barrier conductor film BR3 and the metal film ME1 over the barrier conductor film BR3, but also the barrier conductor film BR4 over the metal film ME1 is formed. Preferably, each of the barrier conductor film BR3, the metal film ME1, and the barrier conductor film BR4 is formed using a sputtering method. In the third modification, when Step S25 is performed, as shown in FIG. 35, a laminated film LM1b including the barrier conductor film BR3, the metal film ME1 over the barrier conductor film BR3, and the barrier conductor film BR4 over the metal film ME1 is formed over the entire upper surface of the insulating film PA including the side wall of the opening OP, and the upper surface of the pad PD exposed from the opening OP.

The barrier conductor film BR4 is a film to be used later as an etching mask (hard mask). Preferably, the barrier conductor film BR4 is formed of the same material as that of the barrier conductor film BR3. For example, when the barrier conductor film BR3 is a titanium (Ti) film, it is preferable that the barrier conductor film BR4 is also a titanium (Ti) film.

The manufacturing process in the third modification is different from the manufacturing process shown in FIGS. 10 to 20 described above in Step S25 described above and subsequently performed.

First, over the laminated film LM1b (more specifically, the barrier conductor film BR4 included in the laminated film LM1b), the photoresist pattern RP3 is formed using a photolithographic technique. FIG. 35 shows the resulting stage. Then, using the photoresist pattern RP3 as an etching mask, the barrier conductor film BR4 included in the laminated film LM1b is etched. Thus, the portion of the barrier conductor film BR4 which is uncovered with the photoresist pattern RP3 and exposed is etched and removed, while the portion of the barrier conductor film BR4 which is covered with the photoresist pattern RP3 is not etched and remains. That is, the barrier conductor film BR4 is patterned into substantially the same two-dimensional shape and two-dimensional size as those of the photoresist pattern RP3. In the region uncovered with the photoresist pattern RP3 and exposed, the metal film ME1 is exposed as a result of the removal of the barrier conductor film BR4. Since the etching step is performed under etching conditions under which the metal film ME1 is less likely to be etched than the barrier conductor film BR4, the metal film ME1 can be left in the region uncovered with the photoresist pattern RP3 and exposed.

Figure 36:
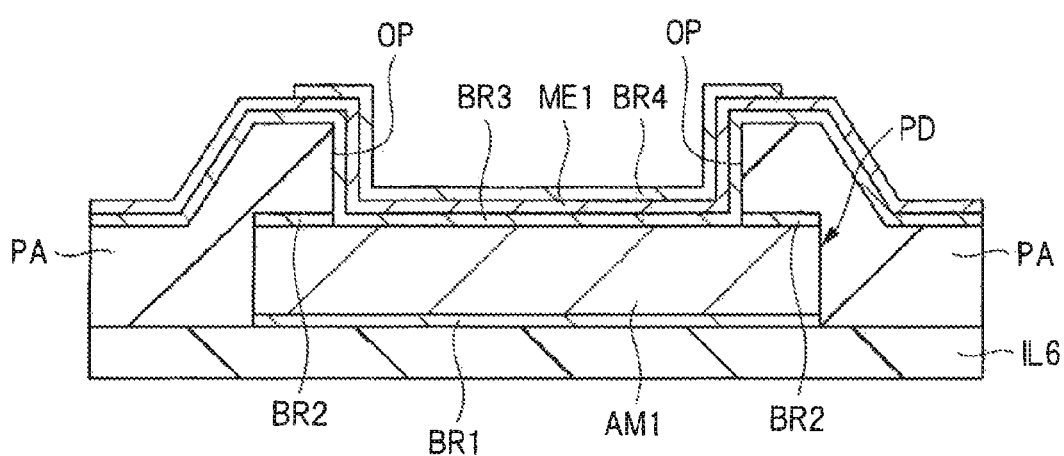
FIG. 36 is a main-portion cross-sectional view of the semiconductor device during the manufacturing process thereof, which is subsequent to FIG. 35.

Next, the photoresist pattern RP3 is removed by asking or the like. FIG. 36 shows the resulting stage. In the region from which the photoresist pattern RP3 has been removed, the barrier conductor film BR4 having substantially the same two-dimensional shape and two-dimensional size as those of the photoresist pattern RP3 remains.

Figure 37:
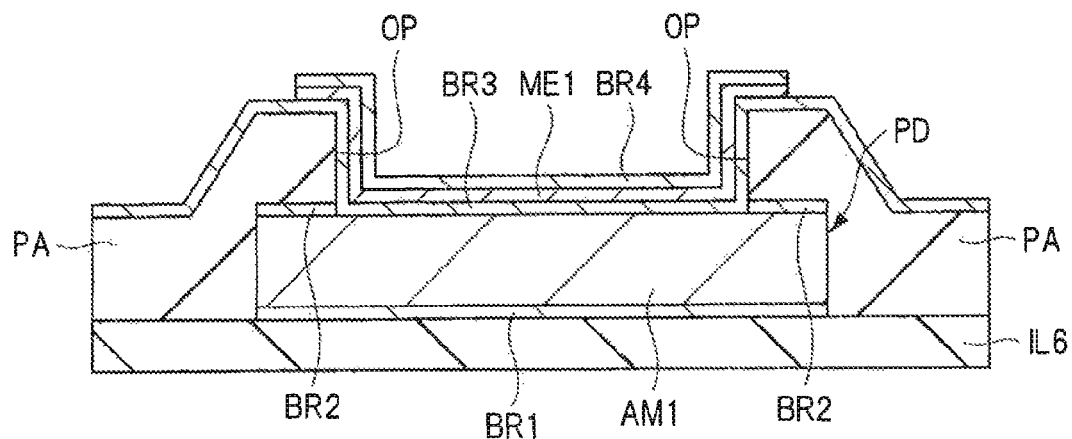
FIG. 37 is a main-portion cross-sectional view of the semiconductor device during the manufacturing process thereof, which is subsequent to FIG. 36.

Next, as shown in FIG. 37, using the barrier conductor film BR4 as an etching mask (hard mask), the metal film ME1 is etched. As a result, the portion of the metal film ME1 which is uncovered with the barrier conductor film BR4 and exposed is etched and removed, while the portion of the metal film ME1 which is covered with the barrier conductor film BR4 is not etched and remains. That is, the metal film ME1 is patterned into the same two-dimensional shape and two-dimensional size as those of the barrier conductor film BR4 (and consequently those of the photoresist pattern RP3). In the region uncovered with the barrier conductor film BR4 and exposed, the barrier conductor film BR3 is exposed as a result of the removal of the metal film ME1. When the metal film ME1 is etched using the barrier conductor film BR4 as an etching mask, wet etching is more preferably used. The etching step is performed under etching conditions under which the barrier conductor films BR3 and BR4 are less likely to be etched than the metal film ME1.

Figure 38:
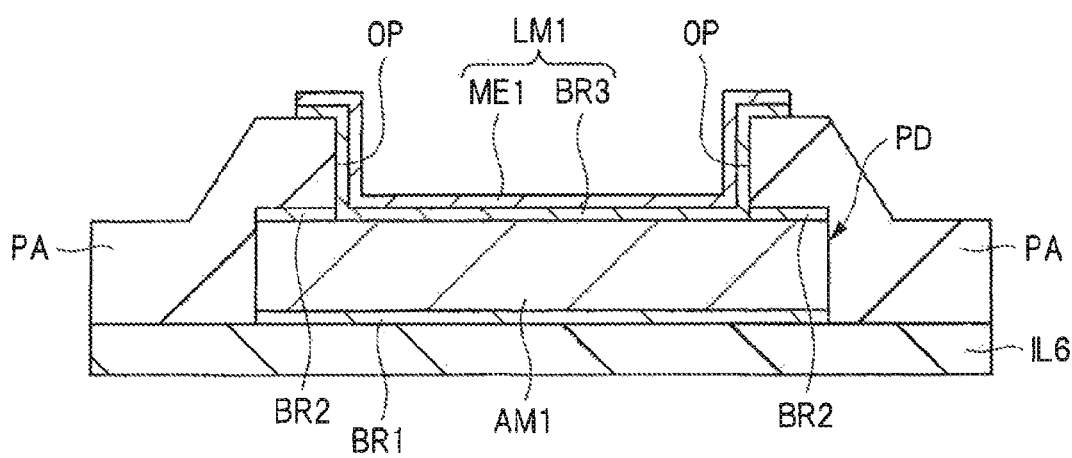
FIG. 38 is a main-portion cross-sectional view of the semiconductor device during the manufacturing process thereof, which is subsequent to FIG. 37.

Next, as shown in FIG. 38, the barrier conductor film BR4 and the portion of the barrier conductor film BR3 which is uncovered with the metal film ME1 are removed by etching. At this time, when the barrier conductor films BR4 and BR3 have been formed of the same material, the barrier conductor films BR4 and BR3 can be etched and removed by the same etching step. The etching step is performed under etching conditions under which the metal film ME1 is less likely to be etched than the barrier conductor films BR3 and BR4. Accordingly, as a result of the etching and removal of the barrier conductor film BR4, the metal film ME1 is exposed, but is not etched and remains. On the other hand, the portion of the barrier conductor film BR3 which is uncovered with the metal film ME1 is etched and removed, while the portion of the barrier conductor film BR3 which is covered with the metal film ME1 is not removed and remains. That is, the barrier conductor film BR3 is patterned into substantially the same two-dimensional shape and two-dimensional size as those of the metal film ME1 (and consequently those of the photoresist pattern RP3).

When the barrier conductor film BR4 is formed of a material different from that of the barrier conductor film BR3, it is also possible to remove the portion of the barrier conductor film BR3 which is uncovered with the laminated film including the metal film ME1, and the barrier conductor film BR4 by etching first, and then selectively remove the barrier conductor film BR4.

Thus, the laminated film LM1 including the metal film ME1, and the barrier conductor film BR3 under the metal film ME1, i.e., the laminated film LM1 including the barrier conductor film BR3, and the metal film ME1 over the barrier conductor film BR3 is formed.

Subsequently, the back surface side of the foregoing semiconductor substrate SB is ground or polished as necessary to reduce the thickness of the semiconductor substrate SB. Then, the semiconductor substrate SB is subjected to dicing together with the laminated structure over the semiconductor substrate SB. In this manner, the semiconductor device CP can be manufactured.

In the third modification, as can also be seen from FIGS. 36 and 37, when the metal film ME1 is etched to be patterned, the etching of the metal film ME1 is performed in the state where no photoresist pattern is formed over the metal film ME1. This can provide the following advantage.

That is, when the step of etching the metal film ME1 and the step of etching the barrier conductor film BR3 are performed in the state where the photoresist pattern RP3 is formed over the metal film ME1, the top surface of the metal film ME1 may be contaminated with an organic material resulting from the photoresist pattern RP3. In the third modification, by performing the step of etching the metal film ME1 and the step of etching the barrier conductor film BR3 in the state where no photoresist pattern is formed over the metal film ME1, it is possible to eliminate the possibility that the top surface of the metal film ME1 is contaminated with an organic material resulting from the photoresist pattern. As a result, the wire bonding step is easily performed. In addition, process control is also easily performed.

When the step of etching the metal film ME1 is performed by wet etching, the metal film ME1 is easily removed. Therefore, the step of etching the metal film ME1 is more preferably performed by wet etching. However, when the wet etching is performed in the state where the photoresist pattern RP3 is formed, the photoresist pattern RP3 may possibly swell/dissolve due to an organic additive in an etching solution in use. The possibility is particularly high in the etching solution used when the metal film ME1 is a palladium film. When the photoresist pattern RP3 has swollen/dissolved, the shape of the processed laminated film LM may be deformed so that the laminated film LM1 in a minute pattern is hard to form. An attempt to prevent this results in a narrower range of options to choose an etching solution and difficult control of the step of etching the metal film ME1.

By contrast, in the third modification, the step of etching the metal film ME1 and the step of etching the barrier conductor film BR3 are performed in the state where no photoresist pattern is formed. Since the step of etching the metal film ME1 is performed in the state where no photoresist pattern is formed, even when wet etching is used in the step of etching the metal film ME1, it is possible to prevent the photoresist pattern from swelling/dissolving due to the etching solution in use. This allows wet etching to be more readily used as the etching of the metal film ME1 and allows the laminated film LM1 to be more reliably formed into an intended shape, while also allowing the laminated film LM1 in a minute pattern to be more easily formed. This also widens the range of options to choose an etching solution to be used in the step of etching the metal film ME1 and allows easy control of the step of etching the metal film ME1.

<About Fourth Modification>

Figure 39:
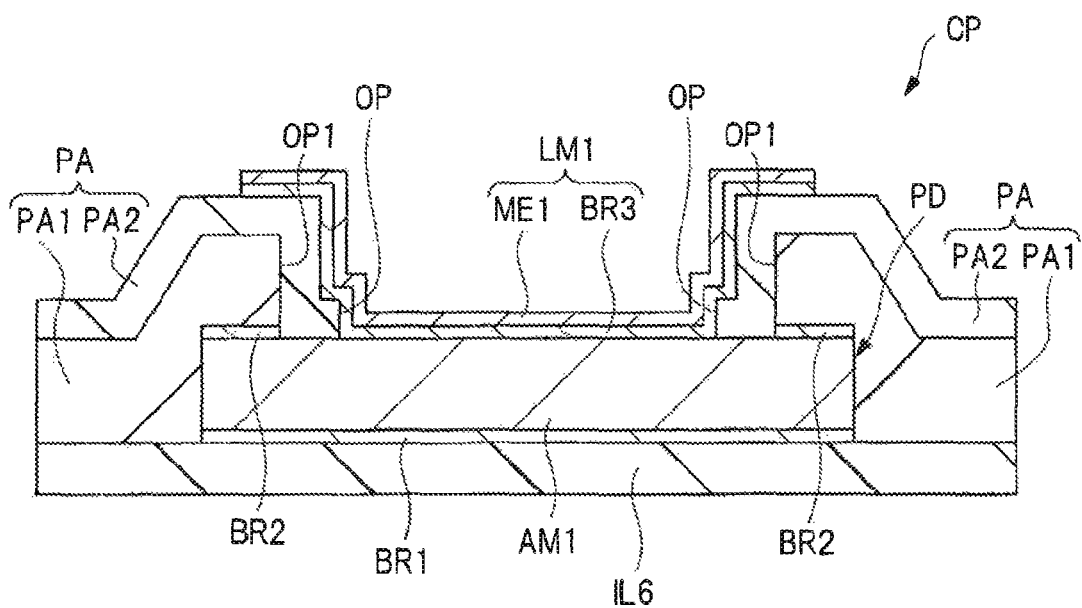
FIG. 39 is a main-portion cross-sectional view of a semiconductor device in a fourth modification.

FIG. 39 is a main-portion cross-sectional view of the semiconductor device CP in a fourth modification of the present embodiment, which corresponds to FIGS. 6, 29, and 32 described above. In the semiconductor device CP in the fourth modification shown in FIG. 39, as the insulating film PA, a laminated film including an insulating film PA1 and an insulating film PA2 is used. The insulating film PA1 is in the lower layer, while the insulating film PA2 is in the upper layer. As the insulating film PA1, e.g., a silicon dioxide film can be used. As the insulating film PA2, e.g., a silicon nitride film can be used.

The manufacturing process of the semiconductor device CP in the fourth modification shown in FIG. 39 is as follows.

That is, after the laminated film SM is patterned in Step S22 described above to form the pad PD as shown in FIG. 14 described above, the insulating film PA1 is formed over the interlayer insulating film IL6 so as to cover the pad PD. Then, an opening OP1 is formed in the insulating film PA1 to expose a part of the pad PD. At this time, the barrier conductor film BR2 is removed from the bottom portion of the opening OP1 to expose the Al-containing conductive film AM1 included in the pad PD from the opening OP1. Then, over the insulating film PA1 including the interior of the opening OP1, the insulating film PA2 is formed, and subsequently the opening OP is formed in the insulating film PA2. The opening OP is included in the opening OP1 in plan view. The two-dimensional size (plane area) of the opening OP is smaller than the two-dimensional size (plane area) of the opening OP1. Thereafter, Steps S25 and S26 described above are performed to form the laminated film LM1 including the barrier conductor film BR3, and the metal film ME1.

In the semiconductor device CP in the fourth modification thus manufactured and shown in FIG. 39, in the portion of the pad PD which is covered with the insulating film PA1, the barrier conductor film BR2 remains over the Al-containing conductive film AM1 and, between the upper surface of the Al-containing conductive film AM1 and the insulating film PA1, the barrier conductor film BR2 is interposed. On the other hand, in the portion of the pad PD which is covered with the insulating film PA2 but uncovered with the insulating film PA1, the barrier conductor film BR2 has been removed from over the Al-containing conductive film AM1. Between the upper surface of the Al-containing conductive film AM1 and the insulating film PA2, the barrier conductor film BR2 is not interposed. The configuration of the semiconductor device CP in the fourth modification shown in FIG. 39 is otherwise basically the same as that of the semiconductor device CP in FIG. 6 described above so that a description thereof is omitted herein.

Note that in each of the first, second, and third modifications of the present embodiment and in each of the second and third embodiments described later, the insulating film PA used in the fourth modification can also be used.

Second Embodiment

Figure 40:
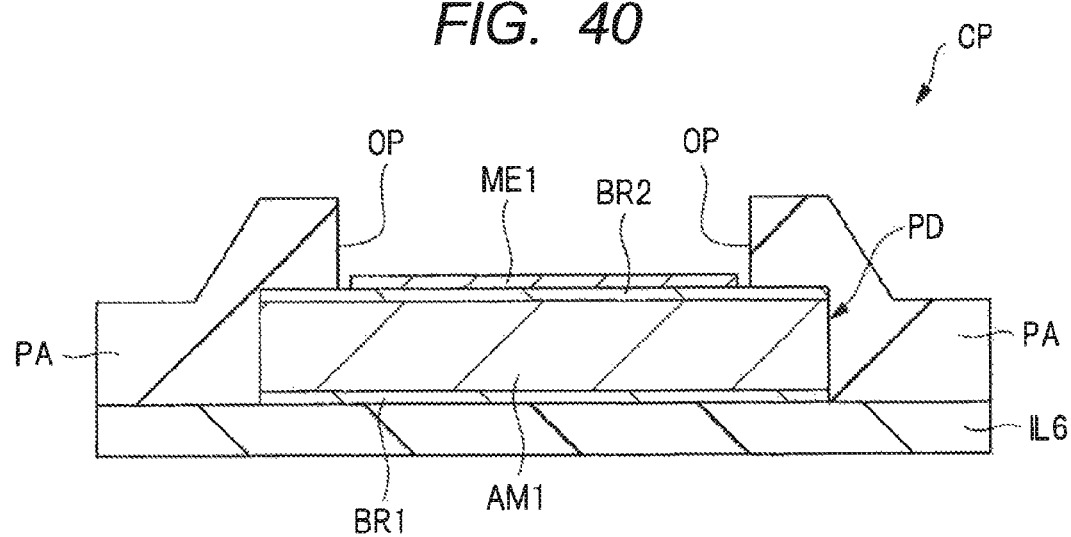
FIG. 40 is a main-portion cross-sectional view of a semiconductor device in another embodiment.
Figure 41:
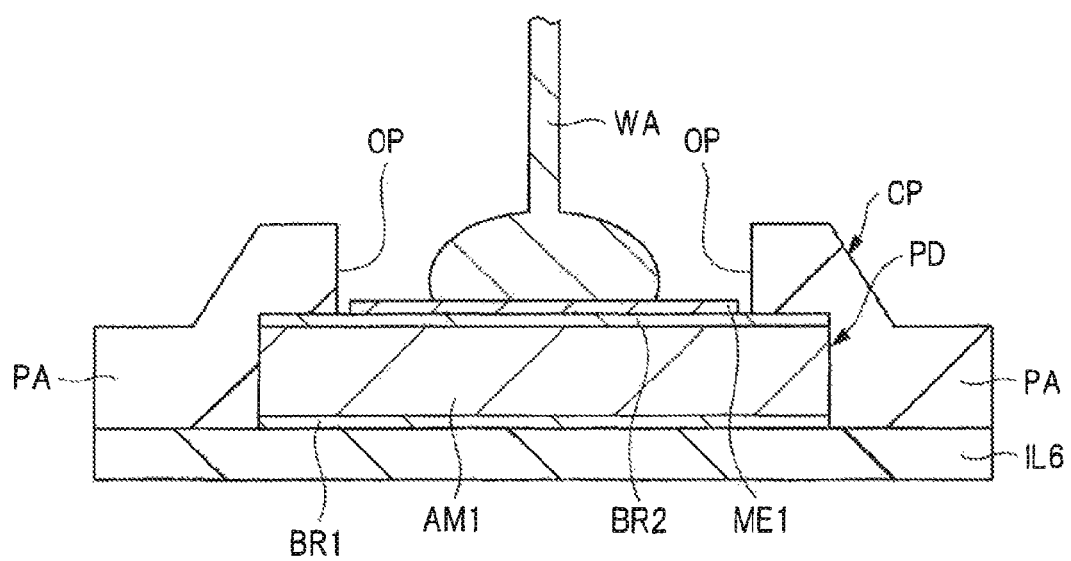
FIG. 41 is a cross-sectional view showing a state where a wire is electrically coupled to the pad shown in FIG. 40.

FIG. 40 is a main-portion cross-sectional view of the semiconductor device CP in the second embodiment, which corresponds to FIG. 6 described above in the first embodiment described above or the like. FIG. 41 is a cross-sectional view showing the state where the wire WA is electrically coupled to the pad PD shown in FIG. 40 described above, which corresponds to FIG. 9 described above in the first embodiment described above or the like.

In the first embodiment described above, the barrier conductor films BR2 and BR3 are separately formed. By contrast, in the second embodiment, the barrier conductive films BR2 and BR3 are formed as a common film. The following will describe the second embodiment with a focus on the difference from The first embodiment described above, while omitting a repeated description of the same portion as in the first embodiment (including the foregoing first and fourth modifications) described above.

In the second embodiment, as shown in FIGS. 40 and 41, the pad PD is formed of a laminated film including the barrier conductor film BR1, the Al-containing conductive film AM1 over the barrier conductor film BR1, and the barrier conductor film BR2 over the Al-containing conductive film AM1. Note that, in the second embodiment, in the pad PD, the barrier conductor film BR2 is formed over the entire upper surface of the Al-containing conductive film AM1. Accordingly, in the second embodiment, each of the portion of the pad PD which is covered with the insulating film PA and the portion of the pad PD which is uncovered with the insulating film PA and exposed from the opening OP of the insulating film PA is formed of the laminated film including the barrier conductor film BR1, the Al-containing conductive film AM1 over the barrier conductor film BR1, and the barrier conductor film BR2 over the Al-containing conductive film AM1. That is, the entire pad PD is formed of the laminated film including the barrier conductor film BR1, the Al-containing conductive film AM1 over the barrier conductor film BR1, and the barrier conductor film BR2 over the Al-containing conductive film AM1.

In the second embodiment, the metal film ME1 is formed, but the foregoing barrier conductor film BR3 is not formed. That is, in the second embodiment, over the portion of the pad which overlaps the opening OP in plan view (over the barrier conductor film BR2 herein), the metal film ME1 is formed. That is, over the portion of the barrier conductor film BR2 which overlaps the opening OP in plan view (i.e., the portion thereof exposed from the opening OP), the metal film ME1 is directly formed. The lower surface of the metal film ME1 is in contact with the upper surface of the barrier conductor film BR2.

In the second embodiment, the foregoing barrier conductor film BR3 is not formed since the barrier conductor film BR2 is provided with the function of the foregoing barrier conductor film BR3. Accordingly, the second embodiment uses, as the barrier conductor film BR2, a material film which is usable as the foregoing barrier conductor film BR3 in the first embodiment described above. That is, in the second embodiment, the barrier conductor film BR2 is a single-layer film or a laminated film including one or more layers of films selected from the group consisting of a titanium (Ti) film, a titanium nitride (TiN) film, a tantalum (Ta) film, a tantalum nitride (TaN) film, a tungsten (W) film, a tungsten nitride (WN) film, a titanium-tungsten (TiW) film, and a tantalum-tungsten (TaW) film. Preferably, the barrier conductor film BR2 includes a titanium (Ti) film and, over the titanium (Ti) film, the metal film ME1 is formed (so as to come in contact with the titanium film). Most preferably, the barrier conductor film BR2 is a titanium (Ti) film.

The material of the metal film ME1 in the second embodiment is the same as in the first embodiment so that a repeated description thereof is omitted herein.

Figure 42:
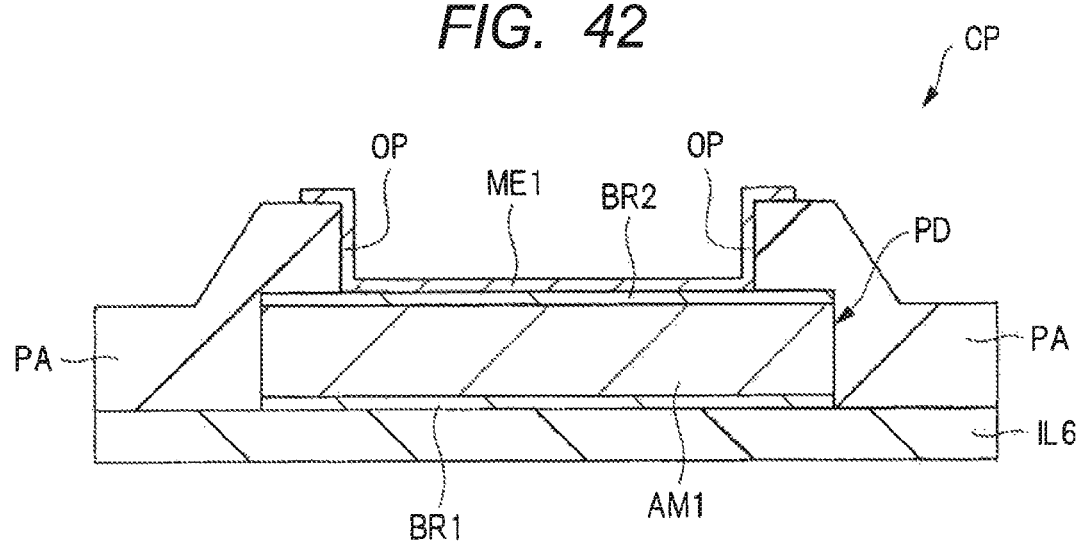
FIG. 42 is a main-portion cross-sectional view of a semiconductor device in a modification of the other embodiment.
Figure 43:
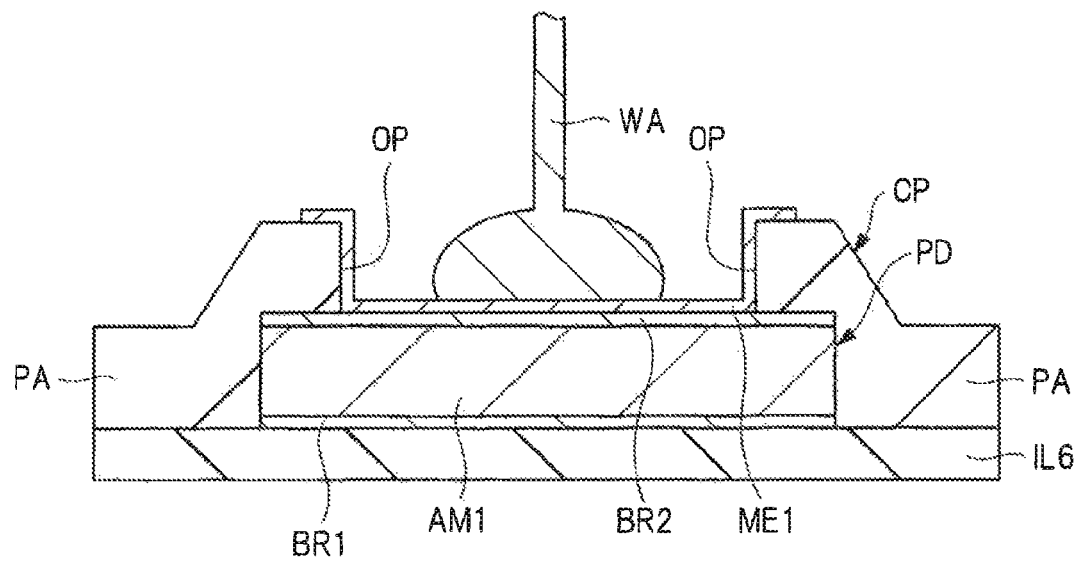
FIG. 43 is a cross-sectional view showing a state where a wire is electrically coupled to the pad shown in FIG. 42.

Note that, in the case in FIGS. 40 and 41, over the side wall of the opening OP of the insulating film PA and over the upper surface of the insulating film PA, the metal film ME1 is not formed. The metal film ME1 is formed locally over the pad PD exposed at the bottom portion of the opening OP (over the barrier conductor film BR2 herein). As a modification of the second embodiment, in the same manner as in FIGS. 6 and 9 described above in the first embodiment described above, the metal film ME1 can also be formed extensively over the pad PD exposed at the bottom portion of the opening OP of the insulating film PA (over the barrier conductor film BR2 herein), the side wall of the opening OP of the insulating film PA, and the insulating film PA around the opening OP, as shown in FIGS. 42 and 43. FIG. 42 is a main-portion cross-sectional view of the modification of the semiconductor device CP in the second embodiment. FIG. 43 is a cross-sectional view showing the state where the wire WA is electrically coupled to the pad PD shown in FIG. 42. However, when the metal film ME1 is not formed over the side wall of the opening OP of the insulating film PA as in FIGS. 40 and 41, the same effect as described in the foregoing second modification (FIGS. 32 to 34) of the first embodiment described above can be obtained.

To the pad PD, the wire WA (copper wire) is electrically coupled. In either of the cases in FIGS. 40 and 42, over the portion of the Al-containing conductive film AM1 which overlaps the opening OP in plan view, the barrier conductor film BR2 and the metal film ME1 over the barrier conductor film BR2 are formed. Accordingly, in the second embodiment also, in wire bonding, the wire WA comes into contact with the outermost metal film ME1 in the same manner as in the first embodiment described above. As shown in FIGS. 41 and 43, the wire WA is coupled to the metal film ME1. As a result, after the wire WA is electrically coupled to the pad PD, as shown in FIGS. 41 and 43, the laminated film including the barrier conductor film BR2, and the metal film ME1 over the barrier conductor film BR2 is interposed between the Al-containing conductive film AM1 included in the pad PD and the wire WA.

Next, a description will be given of the manufacturing process of the semiconductor device in the second embodiment. FIGS. 44 to 47 are main-portion cross-sectional views of the semiconductor device in the second embodiment during the manufacturing process thereof and show cross-sectional views of a region corresponding to FIG. 40 described above.

In the second embodiment also, in the same manner as in the first embodiment described above, the manufacturing process is performed up to Step S23 (step of forming the insulating film PA) described above to obtain the structure in FIG. 15 described above.

Figure 44:
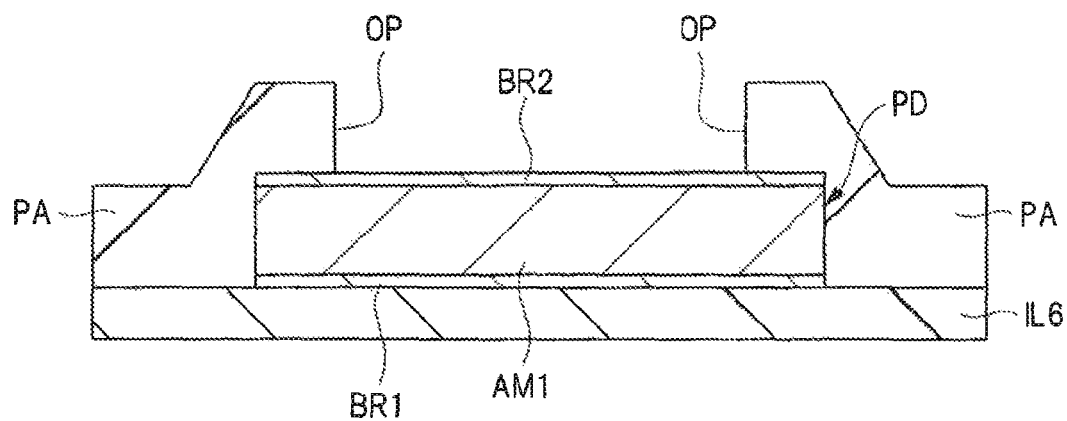
FIG. 44 is a main-portion cross-sectional view of the semiconductor device in the other embodiment during the manufacturing process thereof.

Next, as shown in FIG. 44, in Step S24 described above, the opening OP is formed in the insulating film PA. However, in the second embodiment, in the same manner as in the foregoing first modification of the first embodiment described above, the insulating film PA is etched using the foregoing photoresist pattern RP2 as an etching mask to form the opening OP in the insulating film PA and expose the barrier conductor film BR2 of the pad PD from the opening OP. However, at the stage where the barrier conductor film BR2 of the pad PD is exposed from the opening OP, etching is ended. That is, after the barrier conductor film BR2 is exposed from the opening OP and before the Al-containing conductive film AM1 is exposed from the opening OP1, the etching is ended. Consequently, as can also be seen from FIG. 44, even when the opening OP is formed in Step S24, at the bottom portion of the opening OP, the barrier conductor film BR2 remains over the Al-containing conductive film AM1 so that the Al-containing conductive film AM1 is not exposed.

In the present embodiment, in Step S24, the barrier conductor film BR2 is left at the bottom portion of the opening OP, as shown in FIG. 44. Accordingly, compared to the case where the barrier conductor film BR2 is removed from the bottom portion of the opening OP as shown in FIG. 17 described above, the thickness of the barrier conductor film BR2 formed in Step S21 described above is preferably increased. This allows the barrier conductor film BR2 to easily remain at the bottom portion of the opening OP in Step S24.

Figure 45:
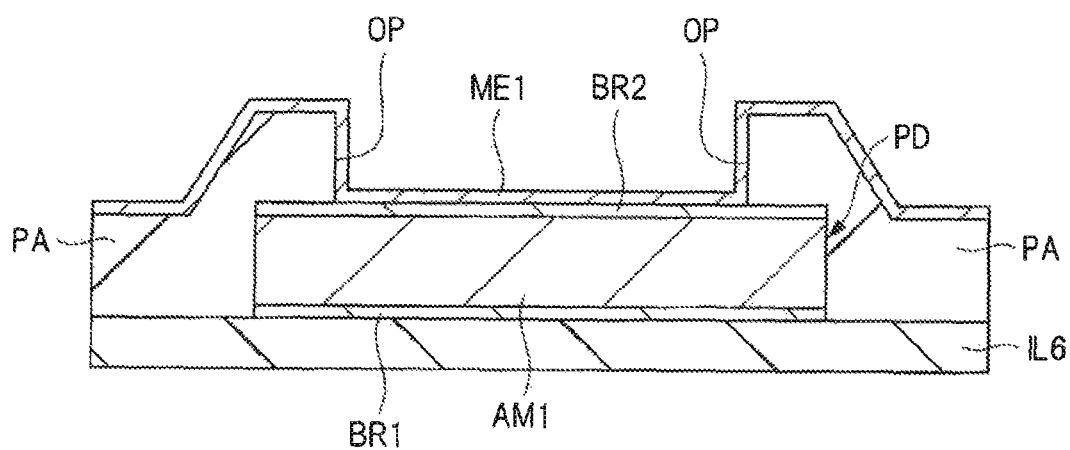
FIG. 45 is a main-portion cross-sectional view of the semiconductor device during the manufacturing process thereof, which is subsequent to FIG. 44.

Next, a step corresponding to Step S25 described above is performed. The step corresponding to Step S25 in the second embodiment is different from Step S25 in the first embodiment described above. That is, in the second embodiment, the step of forming the metal film ME1 is performed without forming the foregoing barrier conductor film BR3. That is, from Step S25 described above, the second embodiment omits the step of forming the barrier conductor film BR3 and performs the step of forming the metal film ME1. As a result, as shown in FIG. 45, over the insulating film PA including the side wall of the opening OP, and the upper surface of the pad PD (which is the upper surface of the barrier conductor film BR2 herein) exposed from the opening OP, the metal film ME1 is formed. Preferably, the metal film ME1 is formed using a sputtering method. At this stage, the metal film ME1 is formed over the entire upper surface of the insulating film PA including the side wall of the opening OP, and the upper surface of the pad PD (which is the upper surface of the barrier conductor film BR2 herein) exposed from the opening OP.

Next, the step corresponding to Step S26 described above is performed. The step corresponding to Step 26 in the second embodiment is different from Step 26 in the first embodiment described above. That is, in the first embodiment described above, the laminated film LM1a including the barrier conductor film BR3, and the Al-containing conductive film AM1 is patterned in Step S26. By contrast, in the second embodiment, the barrier conductor film BR3 is not formed and therefore the metal film ME1 is patterned.

Figure 46:
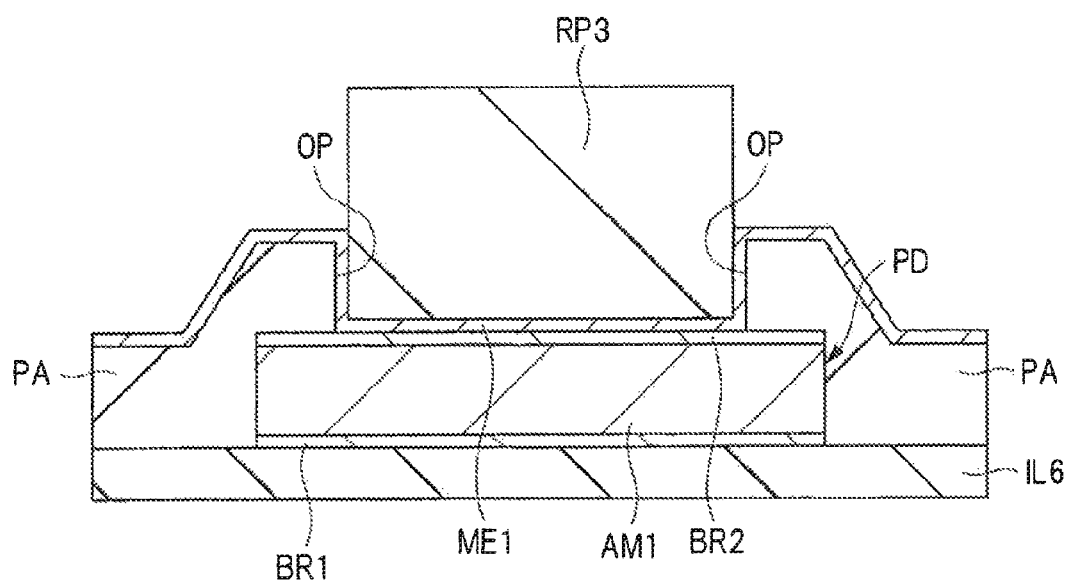
FIG. 46 is a main-portion cross-sectional view of the semiconductor device during the manufacturing process thereof, which is subsequent to FIG. 45.
Figure 47:
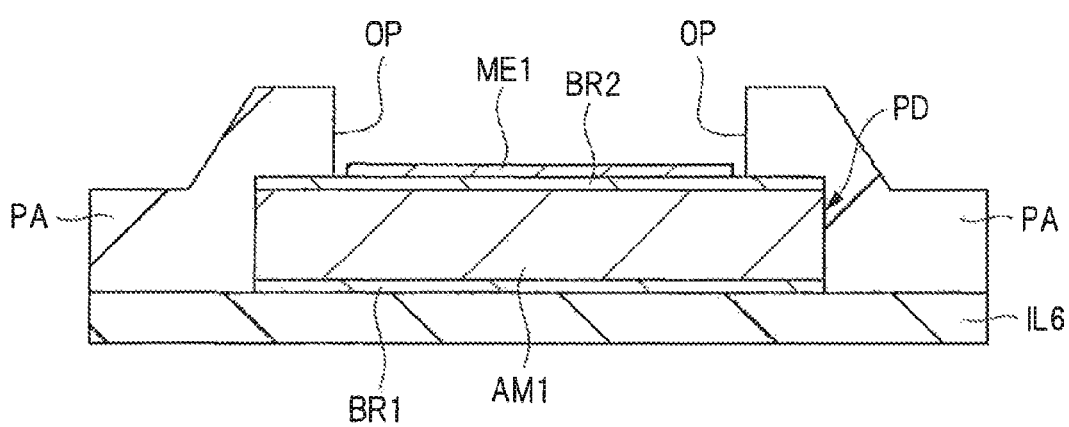
FIG. 47 is a main-portion cross-sectional view of the semiconductor device during the manufacturing process thereof, which is subsequent to FIG. 46.
Figure 48:
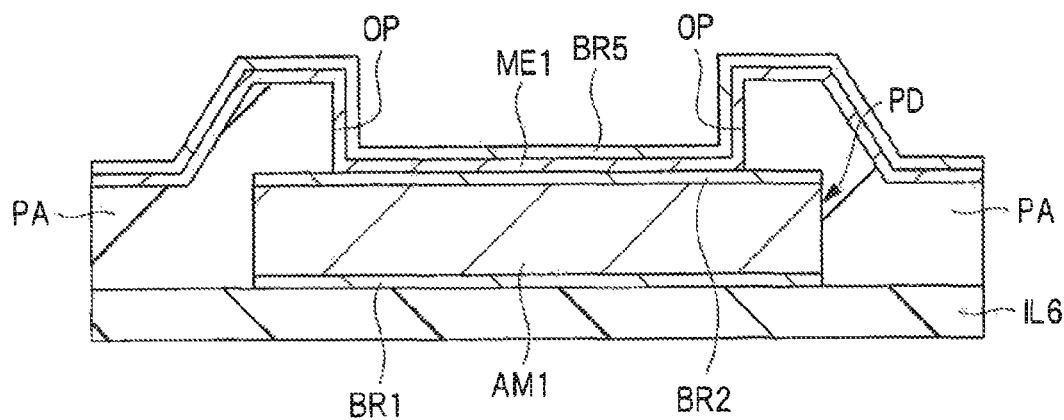
FIG. 48 is a main-portion cross-sectional view of the semiconductor device in the modification of the other embodiment during the manufacturing process thereof.

Specifically, as shown in FIG. 46, over the metal film ME1, the photoresist pattern RP3 is formed using a photolithographic technique. Then, using the photoresist pattern RP3 as an etching mask, the metal film ME1 is etched. As a result, the metal film ME1 is patterned. Thereafter, the photoresist pattern RP3 is removed. FIG. 47 shows the resulting stage.

Subsequent, the back surface side of the foregoing semiconductor substrate SB is ground or polished as necessary to reduce the thickness of the semiconductor substrate SB. Then, the semiconductor substrate SB is subjected to dicing together with the laminated structure over the semiconductor substrate SB. In this manner, the semiconductor device CP can be manufactured.

Next, a description will be given of a modification of the manufacturing process of the semiconductor device in the second embodiment. FIGS. 48 to 52 are main-portion cross-sectional views of the semiconductor device in the modification of the second embodiment during the manufacturing process thereof and show the cross-sectional views of a region corresponding to FIG. 40 described above.

After performing the manufacturing process up to the step of forming the metal film ME1 and obtaining the structure shown in FIG. 45 described above, as shown in FIG. 48, a barrier conductor film BR5 is formed over the metal filmME1. This provides the state where a laminated film including the metal film ME1, and the barrier conductor film BR5 over the metal film ME1 is formed over the entire upper surface of the insulating film PA including the side wall of the opening OP, and the upper surface of the pad PD (which is the upper surface of the barrier conductor film BR2 herein) exposed from the opening OP. The barrier conductor film BR5 is a film to be used later as an etching mask (hard mask). The barrier conductor film BR5 is made of a material different from that of the metal film ME1. Preferably, the barrier conductor film BR5 is made of a material which easily ensures the etching selectivity to the metal film ME1 and is easily removed later by etching. As the barrier conductor film BR5, e.g., a titanium (Ti) film can be used appropriately.

Figure 49:
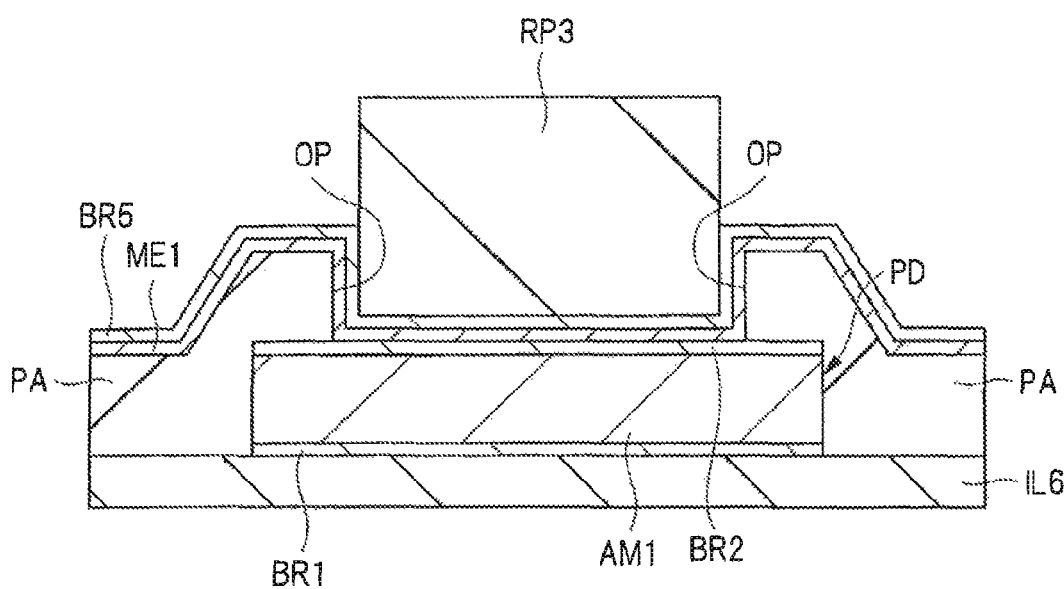
FIG. 49 is a main-portion cross-sectional view of the semiconductor device during the manufacturing process thereof, which is subsequent to FIG. 48.

Next, as shown in FIG. 49, over the barrier conductor film BR5, using a photolithographic technique, the photoresist pattern RP3 is formed. Then, using the photoresist pattern PR3 as an etching mask, the barrier conductor film BR5 is etched. As a result, the portion of the barrier conductor film BR5 which is uncovered with the photoresist pattern RP3 and exposed is etched and removed, while the portion of the barrier conductor film BR5 which is covered with the photoresist pattern RP3 is not etched and remains. That is, the barrier conductor film BR5 is patterned into substantially the same two-dimensional shape and two-dimensional size as those of the photoresist pattern RP3. In the region uncovered with the photoresist pattern RP3 and exposed, the metal film ME1 is exposed as a result of the removal of the barrier conductor film BR5. Since the etching step is performed under etching conditions under which the metal film ME1 is less likely to be etched than the barrier conductor film BR5, in the region uncovered with the photoresist pattern RP3 and exposed, the metal film ME1 can be left.

Figure 50:
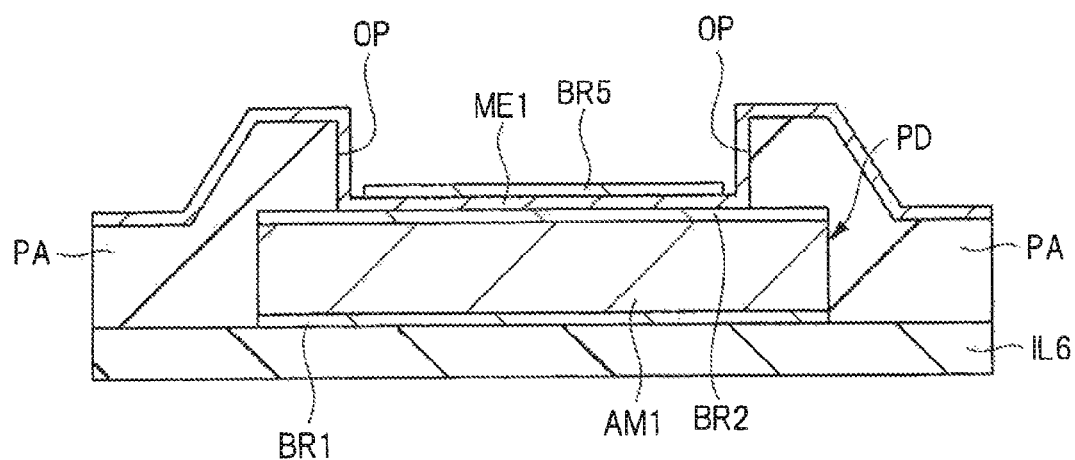
FIG. 50 is a main-portion cross-sectional view of the semiconductor device during the manufacturing process thereof, which is subsequent to FIG. 49.

Next, the photoresist pattern RP3 is removed by asking or the like. FIG. 50 shows the resulting stage. In the region from which the photoresist pattern RP3 has been removed, the barrier conductor film BR5 having substantially the same two-dimensional shape and two-dimensional size as those of the photoresist pattern RP3 remains.

Figure 51:
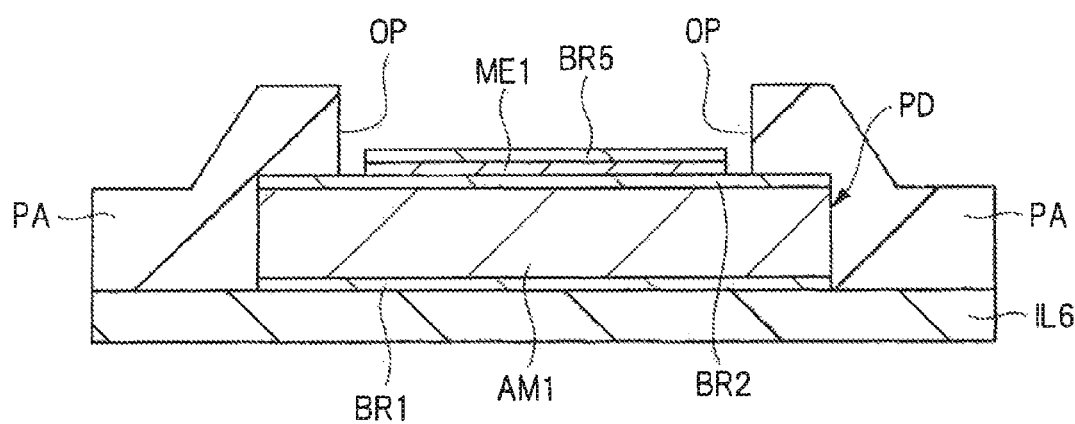
FIG. 51 is a main-portion cross-sectional view of the semiconductor device during the manufacturing process thereof, which is subsequent to FIG. 50.

Next, using the barrier conductor film BR5 as an etching mask (hard mask), the metal film ME1 is etched. As a result, as shown in FIG. 51, the portion of the metal film ME1 which is uncovered with the barrier conductor film BR5 and exposed is etched and removed, while the portion of the metal film ME1 which is covered with the barrier conductor film BR5 is not etched and remains. That is, the metal film ME1 is patterned into substantially the same two-dimensional shape and two-dimensional size of those of the barrier conductor film BR5 (and consequently those of the photoresist pattern RP3). When the metal film ME1 is etched using the barrier conductor film BR5 as an etching mask, wet etching is used preferably. The etching step is performed under etching conditions under which the barrier conductor film BR5 is less likely to be etched than the metal film ME1.

Figure 52:
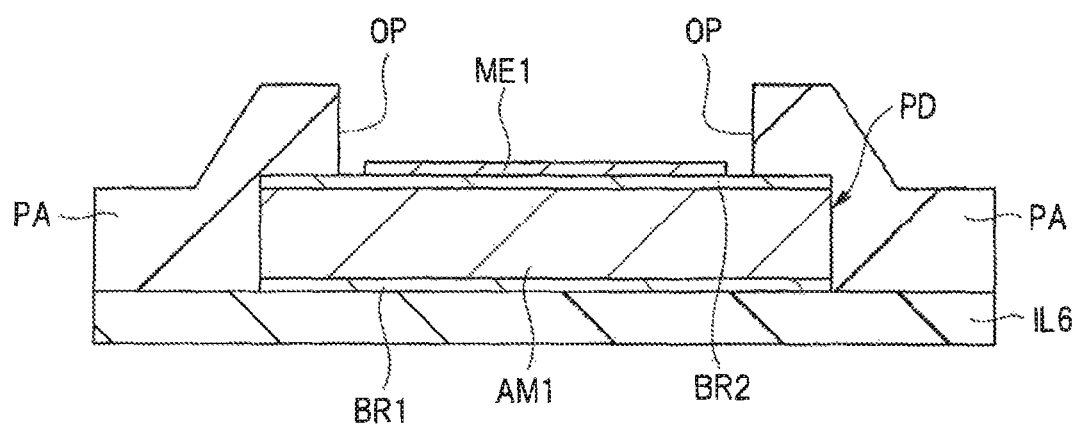
FIG. 52 is a main-portion cross-sectional view of the semiconductor device during the manufacturing process thereof, which is subsequent to FIG. 51.

Next, the barrier conductor film BR5 remaining over the metal film ME1 is removed by etching. FIG. 52 shows the resulting stage. The etching step is performed under etching conditions under which the metal film ME1 is less likely to be etched than the barrier conductor film BR5. Thus, the barrier conductor film BR5 is etched and removed to expose the top surface of the metal film ME1, while the metal film ME1 is not removed and remains.

Subsequently, the back surface side of the foregoing semiconductor substrate SB is ground or polished as necessary to reduce the thickness of the semiconductor substrate SB. Then, the semiconductor substrate SB is subjected to dicing together with the laminated structure over the semiconductor substrate SB. In this manner, the semiconductor device CP can be manufactured.

In the second embodiment also, substantially the same effect as obtained in the first embodiment described above can be obtained.

However, in the second embodiment, the barrier conductor film BR2 included in the pad PD formed in Steps S25 and S26 is provided with the function of the barrier conductor film BR3 in the first embodiment described above. As a result, Embodiment does not need the step of forming the barrier conductor film BR3 and can accordingly reduce the number of the process steps of manufacturing the semiconductor device.

On the other hand, in the first embodiment described above, the barrier conductor film BR3 is formed separately from the barrier conductor film BR2 included in the pad PD formed in Steps S25 and 26. Accordingly, in the first embodiment described above, it is possible to choose, for the barrier conductor film BR2, a material film which is appropriate in terms of patterning a laminated conductive film (which is the foregoing laminated film SM herein) and forming the pad PD without caring about the function required of the barrier conductor film BR3. For example, it is possible to form the barrier conductor films BR2 and BR3 of different materials. This widens the range of options to choose the barrier conductor film BR2 and allows easy formation of the pad PD.

Also, in the first embodiment described above, after the formation of the pad PD, the insulating film PA and the opening OP are formed, and then the laminated film LM1 including the barrier conductor film BR3, and the metal film ME1 is formed. This allows the laminated film LM1 including the barrier conductor film BR3, and the metal film ME1 to be formed only in those of products manufactured by the common manufacturing process to which copper wires are coupled (particularly, those products intended to have higher reliability of the coupling to the copper wires). As a result, it is possible to use a common manufacturing process for products having different specifications and thus reduce the manufacturing cost of the semiconductor devices.

Third Embodiment

Figure 53:
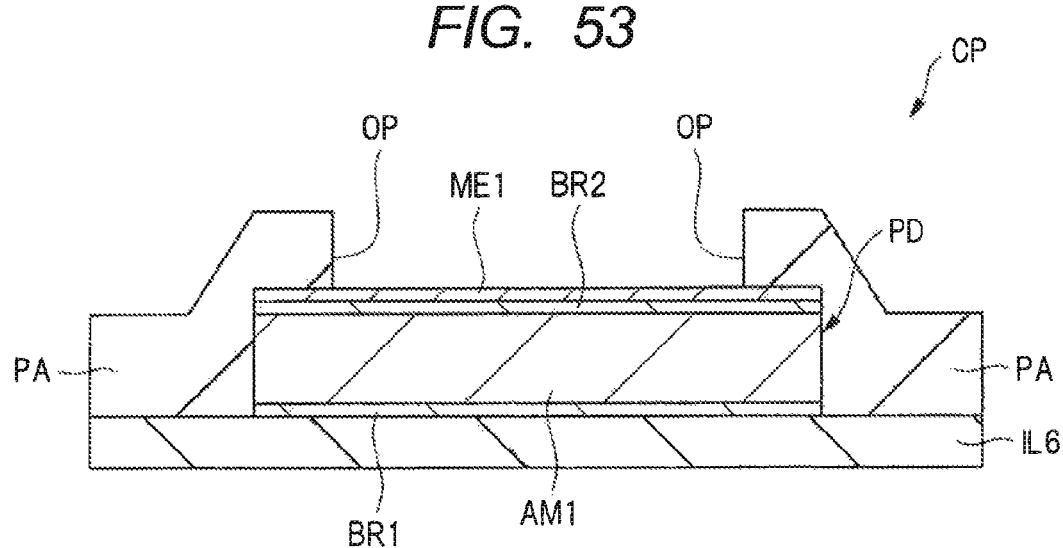
FIG. 53 is a main-portion cross-sectional view of a semiconductor device in still another embodiment.
Figure 54:
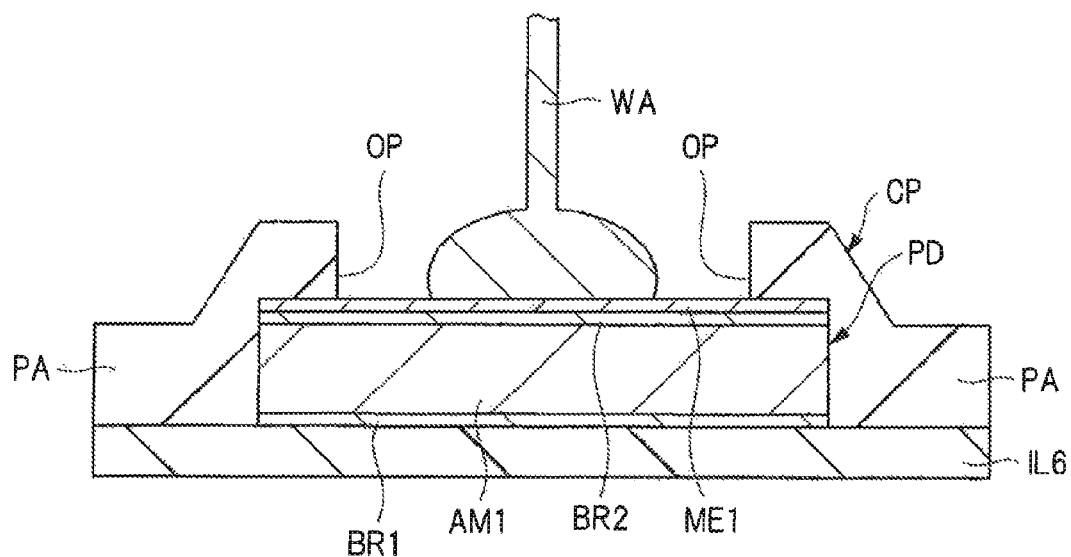
FIG. 54 is a cross-sectional view showing a state where a wire is electrically coupled to the pad shown in FIG. 53.

FIG. 53 is a main-portion cross-sectional view of the semiconductor device CP in the third embodiment, which corresponds to FIG. 6 described above in the first embodiment described above or the like. FIG. 54 is a cross-sectional view showing the state where the wire WA is electrically coupled to the pad PD shown in FIG. 53 described above and corresponds to FIG. 9 described above in the first embodiment described above or the like.

In each of the first and second embodiments described above, the metal film ME1 is formed over the portion of the pad PD which overlaps the opening OP in plan view, while the metal film ME1 is not formed over the portion of the pad which is covered with the insulating film PA. By contrast, in the semiconductor device in the third embodiment, as shown in FIGS. 53 and 54, the metal film ME1 is formed over the entire upper surface of the pad PD.

The following will describe The third embodiment with a focus on the difference from The first embodiment, while omitting a repeated description of the same portion as in the first embodiment (including the foregoing first and fourth modifications) described above.

As shown in FIGS. 53 and 54, in the semiconductor device CP in the third embodiment, the metal film ME1 is formed over the entire upper surface of the pad PD. Specifically, the metal film ME1 is formed over the entire upper surface of the pad PD made of a laminated film including the barrier conductor film BR1, the Al-containing conductive film AM1 over the barrier conductor film BR1, and the barrier conductor film BR2 over the Al-containing conductive film AM1.

The metal film ME1 can also be regarded as a part of the pad PD. Accordingly, in the third embodiment, it can be considered that the pad PD is formed of a laminated film including the barrier conductor film BR1, the Al-containing conductive film AM1 over the barrier conductor film BR1, the barrier conductor film BR2 over the Al-containing conductive film AM1, and the metal film ME1 over the barrier conductor film BR2. That is, the pad PD is made of the patterned laminated film and, in the third embodiment, the laminated film includes the barrier conductor film BR1, the Al-containing conductive film AM1 over the barrier conductor film BR1, the barrier conductor film BR2 over the Al-containing conductive film AM1, and the metal film ME1 over the barrier conductor film BR2.

As a result, in the third embodiment, each of the portion of the pad PD which is covered with the insulating film PA and the portion of the pad PD which is uncovered with the insulating film PA and exposed from the opening OP of the insulating film PA is formed of the laminated film including the barrier conductor film BR1, the Al-containing conductive film AM1 over the barrier conductor film BR1, the barrier conductor film BR2 over the Al-containing conductive film AM1, and the metal film ME1 over the barrier conductor film BR2. That is, the entire pad PD is formed of the laminated film including the barrier conductor film BR1, the Al-containing conductive film AM1 over the barrier conductor film BR1, the barrier conductor film BR2 over the Al-containing conductive film AM1, and the metal film ME1 over the barrier conductor film BR2. Note that, in the third embodiment, over the side wall of the opening OP of the insulating film PA and the upper surface of the insulating film PA, the metal film ME1 is not formed.

In the third embodiment, over the entire upper surface of the Al-containing conductive film AM1 forming the pad PD, the laminated film including the barrier conductor film BR2, and the metal film ME1 over the barrier conductor film BR2 is formed. To the pad PD, the wire WA (copper wire) is electrically coupled and, in the same manner as in the first and second embodiments described above, in the third embodiment also, the wire WA comes in contact with the outermost metal film ME1 in wire bonding to be coupled to the metal film ME1. Consequently, after the wire WA is electrically coupled to the pad PD, between the Al-containing conductive film AM1 included in the pad PD and the wire WA, the laminated film including the barrier conductor film BR2, and the metal film ME1 over the barrier conductor film BR2 is interposed.

In the third embodiment, the foregoing barrier conductor film BR3 is not formed since the barrier conductor film BR2 is provided with the function of the foregoing barrier conductor film BR3. Accordingly, the third embodiment uses, as the barrier conductor film BR2, a material film which is usable as the foregoing barrier conductor film BR3 in the first embodiment described above. That is, in the third embodiment, the barrier conductor film BR2 is a single-layer film or a laminated film including one or more layers of films selected from the group consisting of a titanium (Ti) film, a titanium nitride (TiN) film, a tantalum (Ta) film, a tantalum nitride (TaN) film, a tungsten (W) film, a tungsten nitride (WN) film, a titanium-tungsten (TiW) film, and a tantalum-tungsten (TaW) film. Preferably, the barrier conductor film BR2 includes a titanium (Ti) film and, over the titanium (Ti) film, the metal film ME1 is formed (so as to come in contact with the titanium film). Most preferably, the barrier conductor film BR2 is a titanium (Ti) film.

The material of the metal film ME1 in the third embodiment is the same as in the first embodiment so that a repeated description thereof is omitted here.

Also, in the third embodiment, the pad PD is covered with the insulating film PA except in the region which overlaps the opening OP in plan view. In another embodiment, it may also be possible to omit the formation of the insulating film PA. In the case where the formation of the insulating film PA is omitted, in FIG. 53, the entire upper surface of the pad PD and the side wall (side surface) thereof are consequently exposed. It may also be possible to omit the formation of the insulating film PA in each of the first and second embodiments described above.

Next, a description will be given of the manufacturing process of the semiconductor device in the third embodiment. FIGS. 55 to 59 are main-portion cross-sectional views of the semiconductor device in the third embodiment during the manufacturing process thereof and show cross-sectional views of a region corresponding to FIG. 53 described above.

Figure 55:
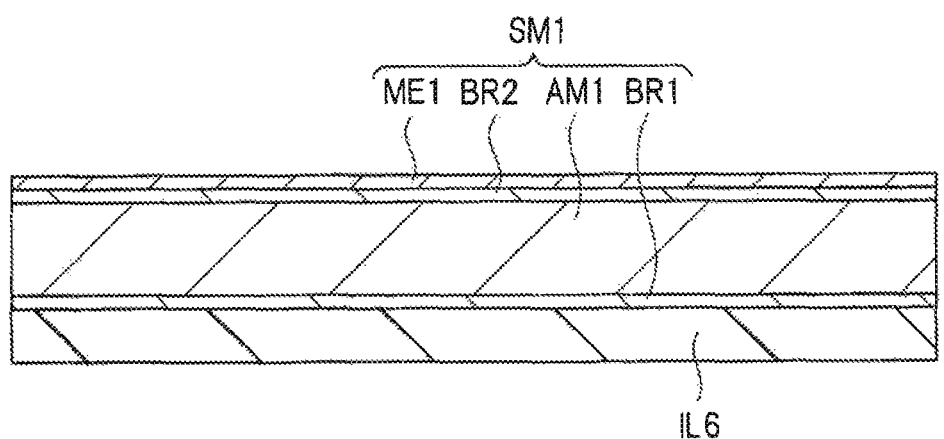
FIG. 55 is a main-portion cross-sectional view of the semiconductor device in the still other embodiment during the manufacturing process thereof.

In the third embodiment, in the same manner as in the first embodiment described above, in Step S21 described above, the barrier conductor film BR1, the Al-containing conductive film AM1, and the barrier conductor film BR2 are successively formed to provide the structure in FIG. 12 described above. Then, in the third embodiment, as shown in FIG. 55, the metal film ME1 is formed over the barrier conductor film BR2. Thus, over the interlayer insulating film IL6 in which the foregoing via portion V5 (not shown in FIG. 55) is embedded, the laminated film SM1 including the barrier conductor film BR1, the Al-containing conductive film AM1 over the barrier conductor film BR1, the barrier conductor film BR2 over the Al-containing conductive film AM1, and the metal film ME1 over the barrier conductor film BR2 is formed. Each of the barrier conductor film BR1, the Al-containing conductive film AM1, the barrier conductor film BR2, and the metal film ME1 can be formed using a sputtering method or the like. The step of forming the metal film ME1 can also be performed continuously after the step of forming the barrier conductor film BR2.

Next, in Step S22 described above, using a photolithographic technique and an etching technique, the laminated film SM1 is patterned to form the pad PD. The third embodiment is different from the first embodiment described above in that the laminated film SM1 to be patterned also includes the metal film ME1.

Figure 56:
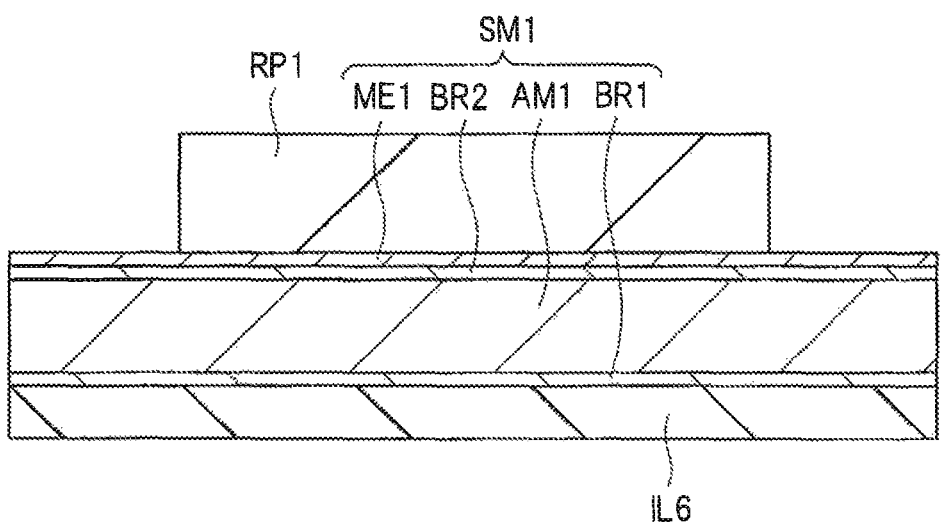
FIG. 56 is a main-portion cross-sectional view of the semiconductor device during the manufacturing process thereof, which is subsequent to FIG. 55.
Figure 57:
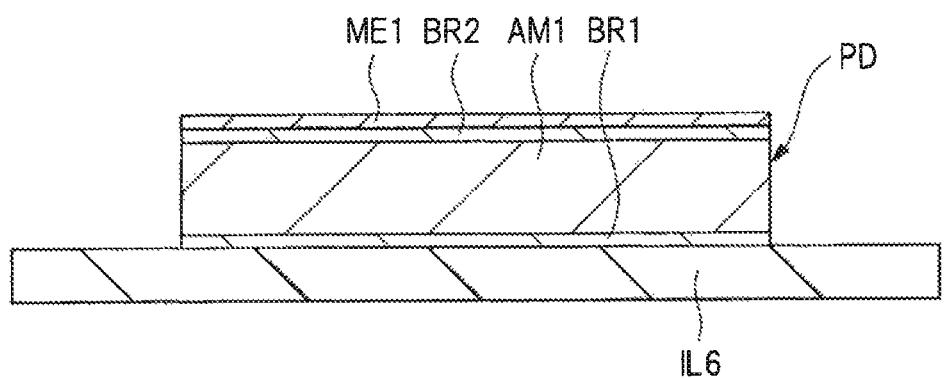
FIG. 57 is a main-portion cross-sectional view of the semiconductor device during the manufacturing process thereof, which is subsequent to FIG. 56.

Specifically, as shown in FIG. 56, over the laminated film SM1, the photoresist pattern RP1 is formed using a photolithographic technique. Then, using the photoresist pattern RP1 as an etching mask, the laminated film SM1 is etched. The step of etching the laminated film SM1 includes the step of etching the metal film ME1, the step of etching the barrier conductor film BR2, the step of etching the Al-containing conductive film AM1, and the step of etching the barrier conductor film BR1. By the etching, the laminated film SM1 is patterned to form the pad PD made of the patterned laminated film SM1. Thereafter, the photoresist pattern RP1 is removed. FIG. 57 shows the resulting stage. Thus, the patterning step in Step S22 is performed. Note that, when the laminated film SM1 is patterned, not only the pad PD, but also the wires in the same layer as that of the pad PD can also be formed.

Figure 58:
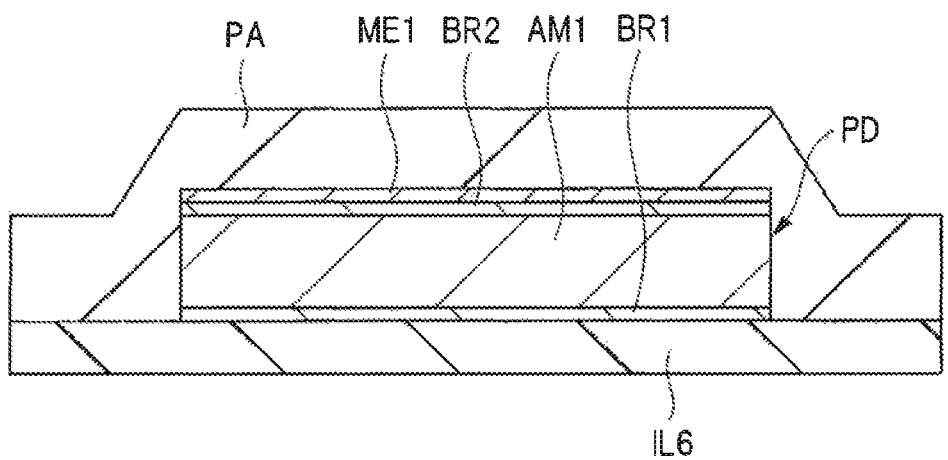
FIG. 58 is a main-portion cross-sectional view of the semiconductor device during the manufacturing process thereof, which is subsequent to FIG. 57.

Next, in Step S23 described above, in the same manner as in the first embodiment described above, in the third embodiment also, the insulating film PA is formed over the interlayer insulating film IL6 so as to cover the pad PD, as shown in FIG. 58.

Figure 59:
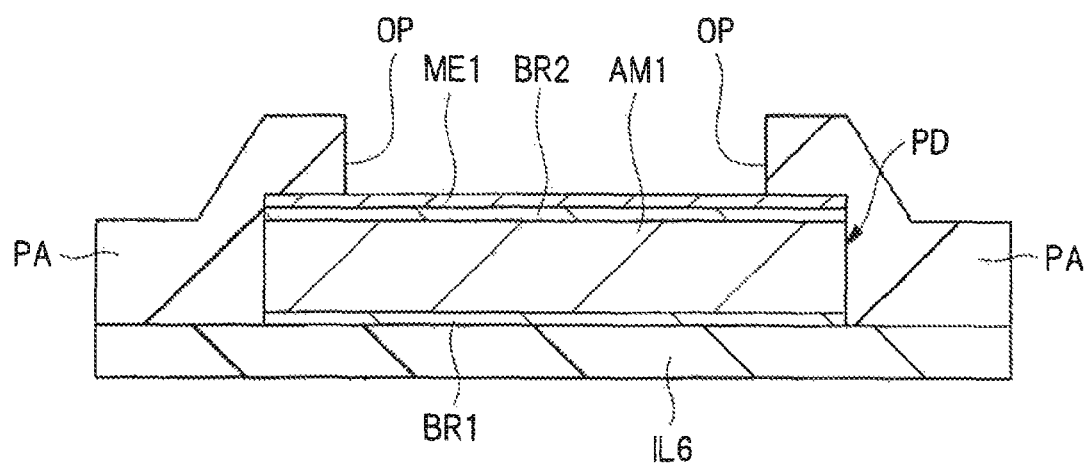
FIG. 59 is a main-portion cross-sectional view of the semiconductor device during the manufacturing process thereof, which is subsequent to FIG. 58.

Next, in Step S24 described above, as shown in FIG. 59, the opening OP is formed in the insulating film PA. However, in the third embodiment, using the foregoing photoresist pattern RP2 (not shown in FIG. 59) formed over the insulating film PA as an etching mask, the insulating film PA is etched such that the opening OP is formed therein to expose the metal film ME1 of the pad PD. At the stage where the metal film ME1 of the pad PD is exposed from the opening OP, the etching is ended. That is, after the metal film ME1 is exposed from the opening OP and before the barrier conductor film BR2 is exposed from the opening OP, etching is ended. Consequently, as shown in FIG. 59, even when the opening OP is formed in Step S24, at the bottom portion of the opening OP, the barrier conductor film BR2 and the metal film ME1 over the barrier conductor film BR2 remain over the Al-containing conductive film AM1 so that the Al-containing conductive film AM1 and the barrier conductor film BR2 are not exposed.

Thereafter, in the third embodiment, Steps S25 and S26 described above are not performed. This is because the pad PD already has the metal film ME1 in the uppermost layer thereof.

Subsequently, the back surface side of the foregoing semiconductor substrate SB is ground or polished as necessary to reduce the thickness of the semiconductor substrate SB. Then, the semiconductor substrate SB is subjected to dicing together with the laminated structure over the semiconductor substrate SB. In this manner, the semiconductor device CP can be manufactured.

Next, a description will be given of a modification of the manufacturing process of the semiconductor device in the third embodiment. FIGS. 60 to 64 are main-portion cross-sectional views of the semiconductor device in the modification of the third embodiment during the manufacturing process thereof and show cross-sectional views of a region corresponding to FIG. 53 described above.

Figure 60:
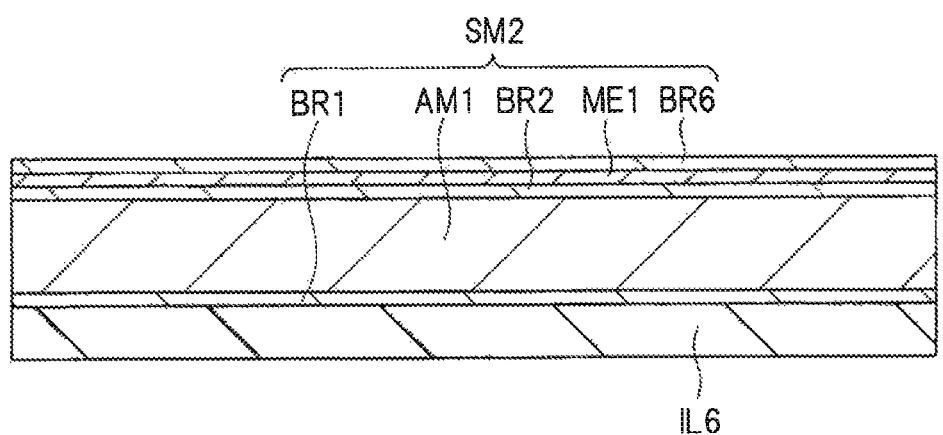
FIG. 60 is a main-portion cross-sectional view of a semiconductor device in a modification of the still other embodiment during the manufacturing process thereof.

In the same manner as in the first embodiment described above, in Step S21 described above, the barrier conductor film BR1, the Al-containing conductive film AM1, and the barrier conductor film BR2 are successively formed to provide the structure in FIG. 12 described above. Then, as shown in FIG. 60, the metal film ME1 is formed over the barrier conductor film BR2, and then a barrier conductor film BR6 is formed over the metal film ME1. Thus, over the interlayer insulating film IL6 in which the foregoing via portion V5 (not shown in FIG. 60) is embedded, a laminated film SM2 including the barrier conductor film BR1, the Al-containing conductive film AM1 over the barrier conductor film BR1, the barrier conductor film BR2 over the Al-containing conductive film AM1, the metal film ME1 over the barrier conductor film BR2, and the barrier conductor film BR6 over the metal film ME1 is formed. Each of the barrier conductor film BR1, the Al-containing conductive film AM1, the barrier conductor film BR2, the metal film ME1, and the barrier conductor film BR6 can be formed using a sputtering method or the like. The step of forming the metal film ME1 can also be performed continuously after the step of forming the barrier conductor film BR2. The step of forming the barrier conductor film BR6 can also be performed continuously after the step of forming the metal film ME1

The barrier conductor film BR6 is a film to be used later as an etching mask (hard mask). The barrier conductor film RR6 is made of a material different from that of the metal film ME1. Preferably, the barrier conductor film RR6 is made of a material which easily ensures the etching selectivity to the metal film ME1 and is easily removed later by etching. As the barrier conductor film RR6, e.g., a titanium nitride (TiN) film can be used appropriately.

Figure 61:
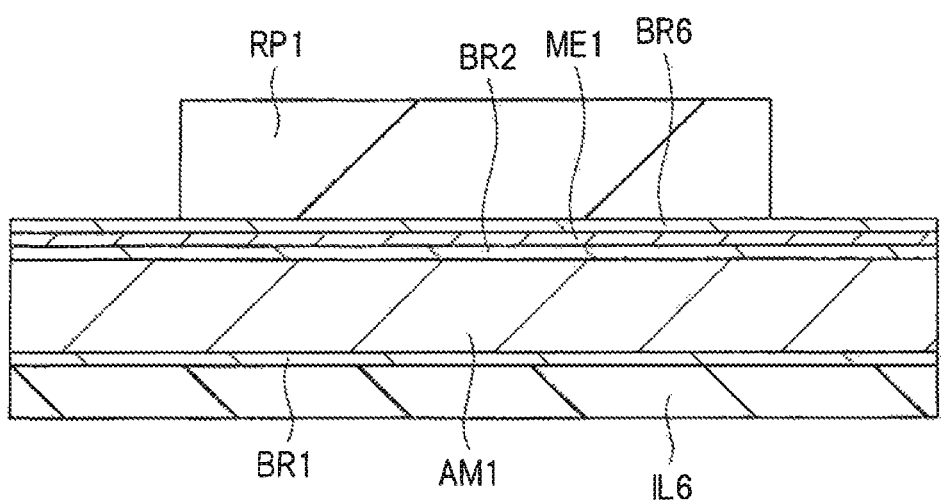
FIG. 61 is a main-portion cross-sectional view of the semiconductor device during the manufacturing process thereof, which is subsequent to FIG. 60.

Next, as shown in FIG. 61, over the barrier conductor film RR6, using a photolithographic technique, the photoresist pattern RP1 is formed. Then, using the photoresist pattern PR1 as an etching mask, the barrier conductor film RR6 is etched. As a result, the portion of the barrier conductor film RR6 which is uncovered with the photoresist pattern RP1 and exposed is etched and removed, while the portion of the barrier conductor film RR6 which is covered with the photoresist pattern RP1 is not etched and remains. That is, the barrier conductor film RR6 is patterned into substantially the same two-dimensional shape and two-dimensional size as those of the photoresist pattern RP1. In the region uncovered with the photoresist pattern RP1 and exposed, the metal film ME1 is exposed as a result of the removal of the barrier conductor film RR6. Since the etching step is performed under etching conditions under which the metal film ME1 is less likely to be etched than the barrier conductor film RR6, in the region uncovered with the photoresist pattern RP1 and exposed, the metal film ME1 can be left.

Figure 62:
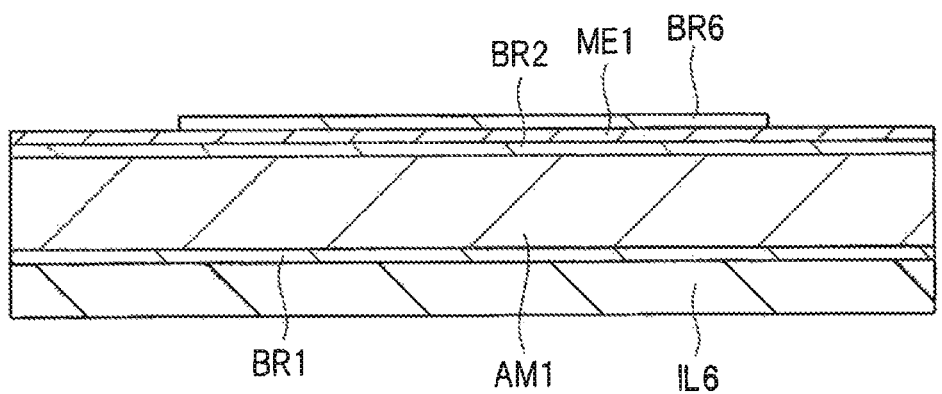
FIG. 62 is a main-portion cross-sectional view of the semiconductor device during the manufacturing process thereof, which is subsequent to FIG. 61.

Next, the photoresist pattern RP1 is removed by asking or the like. FIG. 62 shows the resulting stage. In the region from which the photoresist pattern RP1 has been removed, the barrier conductor film RR6 having substantially the same two-dimensional shape and two-dimensional size as those of the photoresist pattern RP1 remains.

Figure 63:
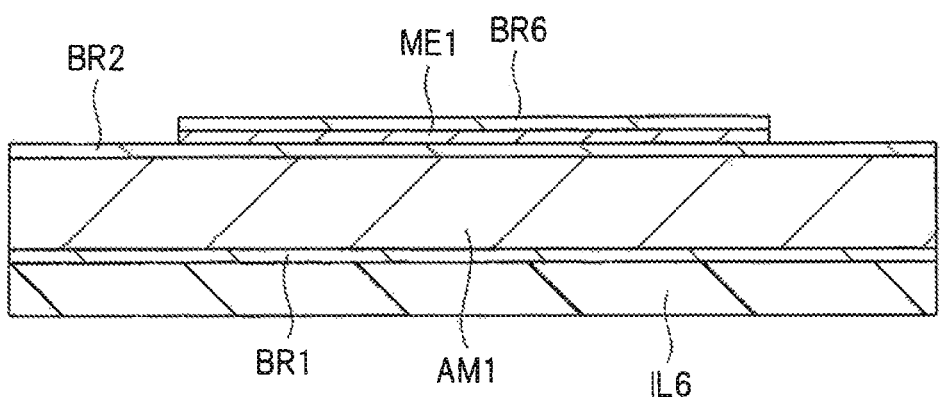
FIG. 63 is a main-portion cross-sectional view of the semiconductor device during the manufacturing process thereof, which is subsequent to FIG. 62.

Next, using the barrier conductor film BR6 as an etching mask (hard mask), the metal film ME1 is etched. As a result, as shown in FIG. 63, the portion of the metal film ME1 which is uncovered with the barrier conductor film BR6 and exposed is etched and removed, while the portion of the metal film ME1 which is covered with the barrier conductor film BR6 is not etched and remains. That is, the metal film ME1 is patterned into substantially the same two-dimensional shape and two-dimensional size of those of the barrier conductor film BR6 (and consequently those of the photoresist pattern RP1). When the metal film ME1 is etched using the barrier conductor film BR6 as an etching mask, wet etching is used preferably. The etching step is performed under etching conditions under which the barrier conductor film BR6 is less likely to be etched than the metal film ME1.

Figure 64:
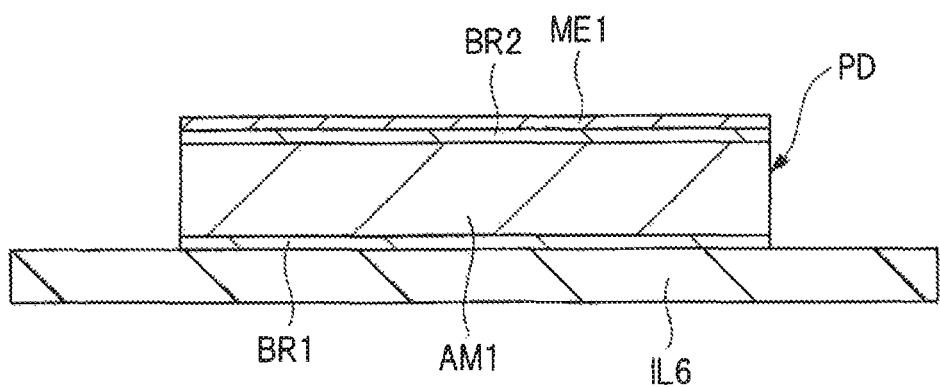
FIG. 64 is a main-portion cross-sectional view of the semiconductor device during the manufacturing process thereof, which is subsequent to FIG. 63.

Next, as shown in FIG. 64, the respective portions of the barrier conductor film BR2, the Al-containing conductive film AM1, and the barrier conductor film BR1 which are uncovered with the metal film ME1 are removed by etching. At this time, at the stage where the barrier conductor film BR6 remains over the metal film ME1, the barrier conductor film BR6 functions as an etching mask (hard mask). However, when the barrier conductor film BR6 is removed by etching, the metal film ME1 can function as an etching mask (hard mask). Accordingly, while the portion of the barrier conductor film BR2 which is uncovered with the metal film ME1 is etched, the etching is performed under etching conditions under which the metal film ME1 is less likely to be etched than the barrier conductor film BR2. While the portion of the Al-containing conductive film AM1 which is uncovered with the metal film ME1 is etched, the etching is performed under etching conditions under which the metal film ME1 is less likely to be etched than the Al-containing conductive film AM1. While the portion of the barrier conductor film BR1 which is uncovered with the metal film ME1 is etched, the etching is performed under etching conditions under which the metal film ME1 is less likely to be etched than the barrier conductor film BR1.

The barrier conductor film BR6 is etched and removed while the respective portions of the barrier conductor film BR2, the Al-containing conductive film AM1, and the barrier conductor film BR1 which are uncovered with the metal film ME1 are etched. After the respective portions of the barrier conductor film BR2, the Al-containing conductive film AM1, and the barrier conductor film BR1 which are uncovered with the metal film ME1 are etched, when the barrier conductor film BR6 remains over the metal film ME1, the step of selectively removing the barrier conductor film BR6 may appropriately be performed additionally thereafter. Of the metal film ME1 and the barrier conductor film BR2, the Al-containing conductive film AM1, and the barrier conductor film BR1 each remaining under the metal film ME1, the pad PD is formed.

In this manner, the laminated film SM2 is patterned to form the pad PD.

The subsequent steps are the same as those described above with reference to FIGS. 58 and 59 so that a repeated description thereof is omitted herein.

In the third embodiment also, substantially the same effects as those obtained in the first and second embodiments described above can be obtained.

However, in the third embodiment, at the stage where the laminated conductive film (which is the foregoing laminated film SM1 herein) is patterned to form the pad PD, the metal film ME1 is formed in the uppermost layer of the pad PD. This eliminates the need to form the barrier conductor film BR3 and the metal film ME1 again after the formation of the pad PD. Thus, it is possible to simplify the manufacturing process of the semiconductor device. Accordingly, in terms of maximally simplifying the manufacturing process of the semiconductor device, the third embodiment is advantageous. In the third embodiment, it is possible to simplify the manufacturing process of the semiconductor device and reduce the number of manufacturing process steps. This can reduce the manufacturing cost of the semiconductor device. This can also reduce the time required for manufacturing the semiconductor device and improve the throughput thereof.

Also, in the third embodiment, in the portion of the pad PD which is covered with the insulating film PA, the metal film ME1 is in the uppermost layer. Consequently, the insulating film PA comes in contact with the upper surface of the metal film ME1. On the other hand, in the first and second embodiments described above, in the portion of the pad PD which is covered with the insulating film PA, the barrier conductor film BR2 is in the uppermost layer. Consequently, the insulating film PA comes in contact with the upper surface of the barrier conductor film BR2. Accordingly, in terms of improving the adhesion of the insulating film PA to the pad PD, the first and second embodiments described above are advantageous. In the first and second embodiments described above, it is possible to improve the adhesion of the insulating film PA to the pad PD and thus more reliably prevent the insulating film PA from peeling.

The first to third embodiments (including the modifications of each thereof) described above can be described as follows when viewed in a comprehensive perspective.

That is, the semiconductor device CP has the pad PD to which a copper wire (corresponding to the wire WA) is to be electrically coupled. The pad PD has the Al-containing conductive film AM1 containing aluminum as a main component. In the region to which the copper wire is coupled (from another perspective, the region overlapping the opening OP in plan view), over the Al-containing conductive film AM1, a first laminated film including a first conductor film, and a second conductive film over the first conductor film is formed. The second conductor film is in the uppermost layer. Here, the second conductor film corresponds to the foregoing metal film ME1. The first conductor film corresponds to the foregoing barrier conductor film BR3 (or the laminated film including the barrier conductor films BR2 and BR3) in the first embodiment described above, while corresponding to the foregoing barrier conductor film BR2 in the second and third embodiments described above.

The semiconductor device PKG (PKG1 or PKG2) includes the semiconductor device (semiconductor chip) CP having the pad PD, the wire WA (copper wire) electrically coupled to the pad PD of the semiconductor device CP, and the sealing resin portion (sealing portion MR1 or MR2) sealing therein the semiconductor device CP and the wire WA. The pad PD includes the Al-containing conductive film AM1 containing aluminum as a main component. Between the wire WA and the Al-containing conductive film AM1, the first laminated film including the first conductor film, and the second conductor film over the first conductor film is interposed. The wire WA is bonded to the second conductor film. Here, the second conductor film corresponds to the foregoing metal film ME1. The first conductor film corresponds to the foregoing barrier conductor film BR3 (or the laminated film including the barrier conductor films BR2 and BR3) in the first embodiment described above, while corresponding to the foregoing barrier conductor film BR2 in the second and third embodiments described above.

The first conductor film is a single-layer film or a laminated film including one or more layers of films selected from the group consisting of a titanium film, a titanium nitride film, a tantalum film, a tantalum nitride film, a tungsten film, a tungsten nitride film, a titanium-tungsten film, and a tantalum-tungsten film. The second conductor film (i.e., the metal film ME1) is made of one or more metals selected from the group consisting of palladium (Pd), gold (Au), ruthenium (Ru), rhodium (Rh), platinum (Pt), and iridium (Ir).

Most preferably, the second conductor film (metal film ME1) is a palladium (Pd) film. Preferably, the first conductor film includes a titanium film and, over the titanium film, the second conductor film (metal film ME1) is formed. Most preferably, the first conductor film is a titanium film. The titanium film has an excellent barrier property (diffusion preventing function) against Al and also has excellent adhesion to a palladium film. Accordingly, the palladium film as the second conductor film (metal film ME1) is preferably formed on the titanium film (so as to come in contact with the titanium film).

In each of the first and second embodiments described above, over the portion of the Al-containing conductive film AM1 which is covered with the insulating film PA (second insulating film), the laminated film including the first conductor film, and the second conductor film over the first conductor film is not formed. In the third embodiment described above, the laminated film including the first conductor film, and the second conductor film over the first conductor film is formed over the entire upper surface of the Al-containing conductive film AM1 included in the pad PD.

The manufacturing process of the semiconductor device in each of the first to third embodiments (including the modifications of each thereof) described above can be described as follows when viewed in a comprehensive perspective.

The method of manufacturing the semiconductor device includes the steps of: (a) providing the semiconductor substrate SB; (b) forming, over the main surface the semiconductor substrate SB, a first insulating film (corresponding to the interlayer insulating film IL6); and (c) forming, over the first insulating film, the Al-containing conductive film AM1 containing aluminum as a main component. The method of manufacturing the semiconductor device further includes the steps of: (d) patterning the Al-containing conductive film AM1 to form the pad PD; (e) forming, over the first insulating film, a second insulating film (corresponding to the insulating film PA) so as to cover the pad PD therewith; (f) forming the opening OP in the second insulating film; and (g) electrically coupling a copper wire (corresponding to the wire WA) to the pad PD exposed from the opening OP. The method of manufacturing the semiconductor device further includes the steps of: (h) after the step (c) and before the step (g), forming a first conductor film over the Al-containing conductive film AM1; and (i) after the step (h) and before the step (g), forming a second conductor film over the first conductor film. Here, the second conductor film corresponds to the foregoing metal film ME1. The first conductor film corresponds to the foregoing barrier conductor film BR3 in the first embodiment described above, while corresponding to the foregoing barrier conductor film BR2 in the second and third embodiments described above. The first conductor film is a single-layer film or a laminated film including one or more layers of films selected from the group consisting of a titanium film, a titanium nitride film, a tantalum film, a tantalum nitride film, a tungsten film, a tungsten nitride film, a titanium-tungsten film, and a tantalum-tungsten film. The second conductor film is made of one or more metals selected from the group consisting of palladium, gold, ruthenium, rhodium, platinum, and iridium.

In the case in the first embodiment described above, the steps (h) and (i) are performed after the step (f) and before the step (g). In the case in the second embodiment described above, the step (h) is performed after the step (c) and before the step (d). In the step (d), the laminated film including the Al-containing conductive film AM1, and the first conductor film (corresponding to the barrier conductor film BR2) over the Al-containing conductive film AM1 is patterned to form the pad PD, and the step (i) is performed after the step (f) and before the step (g). In the case in the third embodiment described above, the steps (h) and (i) are performed after the step (c) and before the step (d). In the step (d), the laminated film including the Al-containing conductive film AM1, the first conductor film (corresponding to the barrier conductor film BR2) over the Al-containing conductive film AM1, and the second conductor film (corresponding to the metal film ME1) over the first conductor film is patterned to form the pad PD.

(About Further Modifications of First to Third Embodiments)

Herein, further modifications of the above-described first to third embodiments will be explained. When "the first embodiment" is referred to herein, it also includes the modifications (above described first to fourth modifications) explained in the section of "(First Embodiment)". Moreover, when "the second embodiment" is referred to herein, it also includes the modifications explained in the section of "(Second Embodiment)". Moreover, when "the third embodiment" is referred to herein, it also includes the modifications explained in the section of "(Third Embodiment)".

As already described, a titanium (Ti) film, a titanium nitride (TiN) film, a tantalum (Ta) film, a tantalum nitride (TaN) film, a tungsten (W) film, a tungsten nitride (WN) film, a titanium tungsten (TiW) film, and a tantalum tungsten (TaW) film are suitable as the barrier conductor film which prevents reactions with Cu in the copper wire (WA) and Al in the Al-containing conductive film AM1. Other than them, a nickel (Ni) film and a cobalt (Co) film are also effective as the barrier conductor film which prevents reactions with Cu in the copper wire (WA) and Al in the Al-containing conductive film AM1. Note that the barrier conductor film which prevents reactions with Cu in the copper wire (WA) and Al in the Al-containing conductive film AM1 corresponds to the barrier conductor film formed below the metal film ME1, corresponds to the above-described barrier conductor film BR3 in the case of the above described first embodiment, and corresponds to the above-described barrier conductor film BR2 in the case of the above-described second and third embodiments.

Therefore, as further modification of the above-described first embodiment, in the above-described first embodiment, the barrier conductor film BR3 may contain one or both of a nickel (Ni) film and a cobalt (Co) film, and the barrier conductor film BR3 may be a single-layer film composed of a nickel (Ni) film or a cobalt (Co) film. Moreover, as a further modification of the above-described second embodiment, in the above described second embodiment, the barrier conductor film BR2 may contain one or both of a nickel (Ni) film and a cobalt (Co) film, and the barrier conductor film BR2 may be a single-layer film composed of a nickel (Ni) film or a cobalt (Co) film. Moreover, as a further modification of the above-described third embodiment, in the above-described third embodiment, the barrier conductor film BR2 may contain one or both of a nickel (Ni) film and a cobalt (Co) film, and the barrier conductor film BR2 may be a single-layer film composed of a nickel (Ni) film or a cobalt (Co) film.

Therefore, the barrier conductor film (corresponding to the above-described barrier conductor film BR3 in the case of the above-described first embodiment and corresponding to the above-described barrier conductor film BR2 in the case of the above-described second and third embodiments) which prevents reactions with Cu in the copper wire (WA) and Al in the Al-containing conductive film. AM1 may be a single-layer film or a laminated film composed of one or more layer (s) selected from: a titanium (Ti) film, a titanium nitride (TiN) film, a tantalum (Ta) film, a tantalum nitride (TaN) film, a tungsten (W) film, a tungsten nitride (WN) film, a titanium tungsten (TiW) film, a tantalum tungsten (TaW) film, a nickel (Ni) film, and a cobalt (Co) film.

Note that, in the above-described first embodiment, as already described, the thickness of the barrier conductor film BR3 is suitable in the range of 5 to 200 nm and is the most suitable in the range of 5 to 80 nm, and the thickness of the metal film ME1 is suitable in the range of 10 to 200 nm. However, if a nickel (Ni) film, a cobalt (Co) film, or a laminated film thereof (a nickel film and a cobalt film) is employed as the barrier conductor film BR3, the range of the preferred thickness of the barrier conductor film BR3 becomes different from the range described in the above-described first embodiment.

Specifically, if a nickel (Ni) film, a cobalt (Co) film, or a laminated film thereof is employed as the barrier conductor film BR3, the thickness of the barrier conductor film BR3 is preferred to be in the range of 100 to 500 nm and is more preferred to be in the range of 250 to 500 nm.

On the other hand, if a nickel (Ni) film, a cobalt (Co) film, or a laminated film thereof is employed as the barrier conductor film BR3, the thickness of the metal film ME1 can be reduced since the thickness of the barrier conductor film BR3 is increased. Therefore, different from the range described in the above-described first embodiment, the thickness of the metal film ME1 is in the range of 10 to 100 nm, in other words, 100 nm or less can be employed as an upper limit of the thickness of the metal film ME1.

If the nickel (Ni) film, the cobalt (Co) film, or a laminated film thereof is employed as the barrier conductor film BR3, the preferred range of the thickness of the barrier conductor film BR3 is shifted to the larger side than the range described in the above-described first embodiment, and this is for below reasons.

Specifically, the barrier conductor film BR3 has the function to prevent reactions with Cu in the copper wire (WA) and Al in the Al-containing conductive film AM1. More specifically, the barrier conductor film BR3 has the function to prevent Al constituting the Al-containing conductive film AM1 from diffusing to the metal-film-ME1 side (hereinafter, referred to as "Al-diffusion preventing function"), and the function to prevent Cu constituting the wire WA from diffusing to the Al-containing-conductive-film-AM1 side (hereinafter, referred to as "Cu-diffusion preventing function"). Such functions are excellent in a titanium (Ti) film, a titanium nitride (TiN) film, a tantalum (Ta) film, a tantalum nitride (TaN) film, a tungsten (W) film, a tungsten nitride (WN) film, a titanium tungsten (TiW) film, and a tantalum tungsten (TaW) film than in a nickel (Ni) film and a cobalt (Co) film.

Therefore, even in a high-temperature environment such as a high-temperature storage test, from the viewpoint of preventing Al constituting the Al-containing conductive film AM1 from being reacted with Cu constituting the copper wire as much as possible and of improving the reliability of the semiconductor device as much as possible, it is advantageous to select the materials of the barrier conductor films BR3 and BR2 in the manner described in the above-described first to third embodiments.

However, although somewhat inferior to a titanium (Ti) film, a titanium nitride (TiN) film, a tantalum (Ta) film, a tantalum nitride (TaN) film, a tungsten (W) film, a tungsten nitride (WN) film, a titanium tungsten (TiW) film, and a tantalum tungsten (TaW) film, a nickel (Ni) film and a cobalt (Co) film also have the Al-diffusion preventing function and the Cu-diffusion preventing function. Therefore, the barrier conductor film BR3 may include one or both of a nickel (Ni) film and a cobalt (Co) film, and the barrier conductor film BR3 may be a single-layer film composed of a nickel (Ni) film or a cobalt (Co) film. If a nickel (Ni) film, a cobalt (Co) film, or a laminated film thereof is employed as the barrier conductor film BR3, it is desired to somewhat increase the thickness of the barrier conductor film BR3 in order to compensate for (increase) the Al-diffusion preventing function and the Cu-diffusion preventing function. Therefore, if a nickel (Ni) film, a cobalt (Co) film, or a laminated film thereof is employed as the barrier conductor film BR3, the preferred range of the thickness of the barrier conductor film BR3 is shifted to the larger side than the range described in the above-described first embodiment, is specifically preferred to be in the range of 100 to 500 nm, and is more preferred to be in the range of 250 to 500 nm.

Moreover, a nickel (Ni) film and a cobalt (Co) film are softer compared with a titanium (Ti) film, a titanium nitride (TiN) film, a tantalum (Ta) film, a tantalum nitride (TaN) film, a tungsten (W) film, a tungsten nitride (WN) film, a titanium tungsten (TiW) film, and a tantalum tungsten (TaW) film, and therefore readily play the role of a cushion in wire bonding. Moreover, if the nickel (Ni) film, the cobalt (Co) film, or the laminated film thereof is employed as the barrier conductor film BR3, the barrier conductor film BR3 is comparatively soft, and the thickness of the barrier conductor film BR3 is increased as described above; therefore, the function as a cushion is further enhanced. When the barrier conductor film BR3 plays the role as a cushion in wire bonding, even if the thickness of the metal film ME1 is reduced, failure (for example, a phenomenon in which the wire WA penetrates through the metal film ME1) does not easily occur, so that the thickness of the metal film ME1 can be reduced. Therefore, if a nickel (Ni) film, a cobalt (Co) film, or a laminated film thereof is employed as the barrier conductor film BR3, the thickness of the metal film ME1 can be reduced. For example, the upper limit of the thickness of the metal film ME1 which is 200 nm in the above-described first embodiment can be reduced to 100 nm or less. In this case, the thickness of the metal film ME1 can be reduced to be smaller than the thickness of the barrier conductor film BR3. Since the metal film ME1 is composed of one or more metal (s) selected from a group consisting of palladium (Pd), gold (Au), ruthenium (Ru), rhodium (Rh), platinum (Pt), and iridium (Ir), the material for the metal film ME1 is expensive, and increasing the thickness of the metal film ME1 leads to increase in the manufacturing cost of the semiconductor device. If a nickel (Ni) film, a cobalt (Co) film, or a laminated film thereof is employed as the barrier conductor film BR3, the thickness of the expensive metal film ME1 can be reduced; therefore, the manufacturing cost of the semiconductor device can be reduced.

Similarly, if the nickel (Ni) film, the cobalt (Co) film, or the laminated film thereof is employed as the barrier conductor film BR2 in the above-described second and third embodiments, the thickness of the barrier conductor film BR2 is preferred to be in the range of 100 to 500 nm and is more preferred to be in the range of 250 to 500 nm, and the thickness of the metal film ME1 is preferred to be in the range of 10 to 100 nm. In this case, the thickness of the metal film ME1 can be reduced to be smaller than the thickness of the barrier conductor film BR2.

Moreover, nickel (electrical resistivity $6.99 \times 10^{-8}$ Ωm) and cobalt (electrical resistivity $5.81 \times 10^{-8}$ Ωm) have lower electrical resistivity compared with palladium (electrical resistivity $1.0 \times 10^{-7}$ Ωm). Therefore, if a nickel (Ni) film is used as the barrier conductor film formed below the metal film ME1 and if a palladium (Pd) film is used as the metal film ME1, the thickness of the barrier conductor film BR3 (nickel film) is increased, while the thickness of the metal film ME1 (palladium film) can be reduced; therefore, the electrical conductivity between the wire WA and the Al-containing conductive film AM1 can be improved. Moreover, since cobalt (Co) has lower electric resistivity than nickel (Ni), if a cobalt (Co) film is used as the barrier conductor film formed below the metal film ME1, the electrical conductivity between the wire WA and the Al-containing conductive film AM1 can be further improved.

If a nickel (Ni) film, a cobalt (Co) film, or a laminated film thereof is employed as the barrier conductor film (the above-described barrier conductor film BR3 in the case of the above-described first embodiment, the above-described barrier conductor film BR2 in the case of the above described second and third embodiments) which prevents reactions with Cu in the copper wire (WA) and Al in the Al-containing conductive film AM1, it is desired to increase the thickness of the barrier conductor film as described above. Even in such a case, as well as the above-described first to third embodiments, the height (distance) from the upper surface of the Al-containing conductive film AM1 constituting the pad PD to the upper surface (surface) of the metal film ME1 formed in the opening OP of the insulating film PA is lower than the height (distance) from the upper surface (surface) of the Al-containing conductive film AM1 constituting the pad PD to the upper surface (surface) of the insulating film PA formed on the Al-containing conductive film AM1. In other words, also in the above-described first to third embodiments and also in the further modifications of the first to third embodiments explained herein, based on the upper surface (surface) of the Al-containing conductive film AM1 constituting the pad PD, the height position of the upper surface (surface) of the metal film ME1 formed in the opening OP of the insulating film PA is lower than the height position of the upper surface (surface) of the insulating film PA formed on the Al-containing conductive film AM1. Note that the upper surface (surface) of the metal film ME1 formed in the opening OP of the insulating film PA corresponds to the upper surface (surface) of the metal film ME1 formed at the bottom portion of the opening OP instead of the surface of the metal film ME1 formed on the lateral surface of the opening OP. In other words, it corresponds to the surface (ME1$a$) joined with the copper wire (WA). Therefore, the upper surface (surface) of the metal film ME1 formed in the opening OP of the insulating film PA is approximately parallel to the upper surface (surface) of the Al-containing conductive film AM1.

Figure 65:
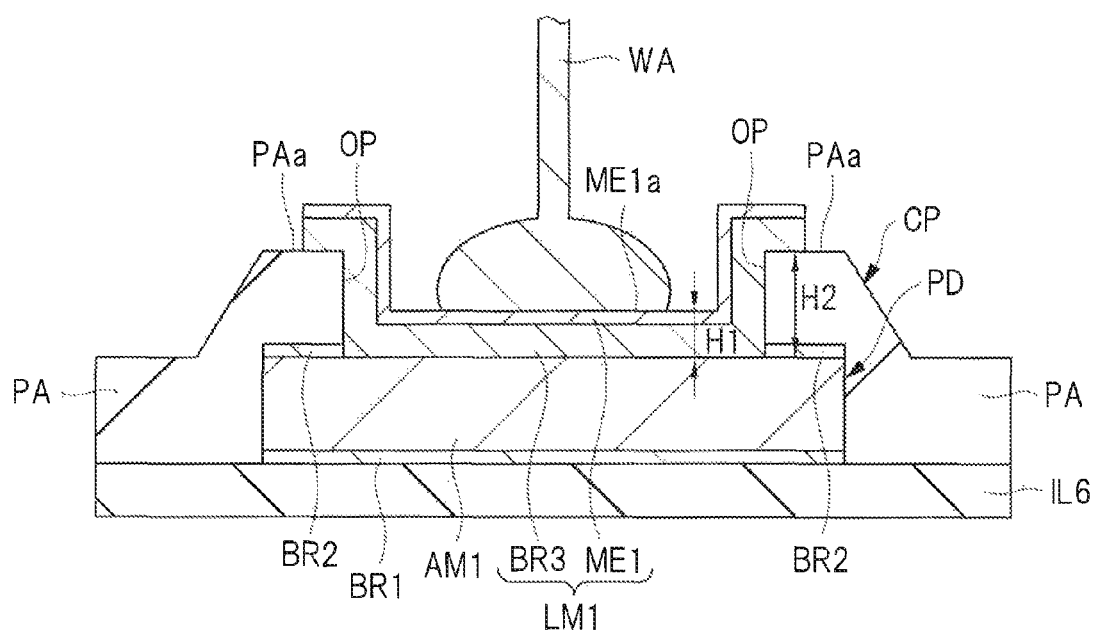
FIG. 65 is an explanatory view of a case in which a nickel film is used as a barrier conductor film.

FIG. 65 is an explanatory view of a case in which a nickel (Ni) film is used as the barrier conductor film BR3 in the structure of above described FIG. 6. In the case of FIG. 65, as a result of using a nickel (Ni) film as the barrier conductor film BR3, the thickness of the barrier conductor film BR3 is larger than that in the case of above described FIG. 6. Also in such a structure of FIG. 65, as well as the above-described FIG. 6, the height H1 from the upper surface of the Al-containing conductive film AM1 constituting the pad PD to the upper surface (surface) of the metal film ME1 formed in the opening OP of the insulating film PA is lower than the height H2 from the upper surface (surface) of the Al-containing conductive film AM1 constituting the pad PD to an upper surface (surface) PAa of the insulating film PA formed on the Al-containing conductive film AM1 (in other words, H1<H2). Such a height relation (the relation of H1<H2) is satisfied also in the above-described first to third embodiments and also in the further modifications of the first to third embodiments explained herein, and it is obvious also from FIG. 6, FIG. 9, FIG. 29, FIG. 30, FIG. 32, FIG. 33, FIG. 40, FIG. 41, FIG. 42, FIG. 43, FIG. 53, FIG. 54, FIG. 65, etc. described above. Note that, in FIG. 65, in order to facilitate understanding, the upper surface (surface) of the insulating film PA formed on the Al-containing conductive film AM1 is shown with a sign PAa. Thus, in the insulating film PA, the upper surface PAa of the insulating film PA referred to herein corresponds to the upper surface of the part covering the peripheral part of the pad PD (more specifically, the region of the pad PD in which the barrier conductor film BR2 referred to in FIG. 65 is formed).

Such a height relation (the relation of H1<H2) is satisfied because both of the metal film ME1 and the barrier conductor film formed below the metal film ME1 are formed by a sputtering method. For example, in the structure of above described FIG. 65, if one or both of the metal film ME1 and the barrier conductor film BR3 is (are) formed by a plating method, the height position of the upper surface (surface) of the metal film ME1 formed in the opening OP of the insulating film PA becomes higher than the height position of the upper surface (surface) of the insulating film PA formed on the Al-containing conductive film AM1; therefore, the relation of H1<H2 is not satisfied. Also in the above-described first to third embodiments and also in the further modifications of the first to third embodiments explained herein, the metal film ME1 and the barrier conductor film BR3 (and the barrier conductor film BR2) are formed by a sputtering method; therefore, the metal film ME1 and the barrier conductor film BR3 (and the barrier conductor film BR2) can be formed to be thin, and the above-described height relation (the relation of H1<H2) can be satisfied. Therefore, as well as the above-described first to third embodiments, also in the further modifications of the first to third embodiments explained herein, a plating film is not interposed (present) between the wire WA and the Al-containing conductive film AM1.

In FIG. 65, as examples of the thicknesses of the films, the thickness of the barrier conductor film BR1 is about 50 to 200 nm, the thickness of the Al-containing conductive film AM1 is for example about 0.7 to 1.5 µm, the thickness of the barrier conductor film BR2 is about 20 to 100 nm, and the thickness of the insulating film PA is about 0.8 to 2 µm. In FIG. 65, if the barrier conductor film BR3 is composed of a nickel (Ni) film, the thickness of the barrier conductor film BR3 composed of the nickel (Ni) film is preferred to be in the range of 100 to 500 nm, is more preferred to be in the range of 250 to 500 nm, and the thickness of the metal film ME1 is preferred to be in the range of 10 to 100 nm.

Next, the diffusion mechanism of Cu in aluminum (Al) and the diffusion mechanism of Ti, Ni, and Co in aluminum (Al) will be explained.

In aluminum (Al), while Cu diffuses by a hole mechanism, Ti, Ni, and Co undergo short-path diffusion along transitions. Therefore, Cu and Ti, Ni, and Co have different diffusion mechanisms in aluminum (Al), Cu is a hole mechanism, and Ti, Ni, and Co undergo transition diffusion. In the hole mechanism, the holes in crystals generated due to thermal excitation, addition of impurities, etc. are randomly moved while exchanging positions with adjacent atoms. In transition diffusion, atoms are diffused along the transitions which are defects in the crystals (defects that disturbance in the atomic arrangement or crystal lattices is generated along one line). Compared with the hole mechanism, in the transition diffusion, atoms are not readily diffused, and the diffusion coefficient of atoms becomes small.

Therefore, the diffusion coefficient in aluminum (Al) becomes a considerably small value in Ti, Ni, and Co compared with Cu. Therefore, all of a titanium (Ti) film, a nickel (Ni) film, and a cobalt (Co) film can be used as the barrier conductor film (corresponding to the above-described barrier conductor film BR3 in the case of the above-described first embodiment and corresponding to the above-described barrier conductor film BR2 in the case of the above-described second and third embodiments) which prevents reactions with Cu in the copper wire and Al in the Al-containing conductive film AM1.

The readiness of transition diffusion in aluminum (Al) will be described below about Ti, Ni, and Co. Regarding the respective metal bonding radii of Ni, Co, Ti, and Al, Ni is 1.25 angstrom, Co is 1.25 angstrom, Ti is 1.45 angstrom, and Al is 1.43 angstrom. Note that the metal bonding radius of Cu is 1.28 angstrom. Since the metal bonding radii of Ti and Al are approximately the same, distortion energy is comparatively small even when transitions occur between an Al region and a Ti region. On the other hand, since the metal bonding radii of Ni and Co are considerably small compared with the metal bonding radius of Ti, if transitions occur between an Al region and a Ni region (or a Co region), distortion energy becomes large, and Ni and Co are readily diffused compared with Ti.

Therefore, in aluminum (Al), Ni and Co are readily diffused compared with Ti. Therefore, as the barrier conductor film (corresponding to the above-described barrier conductor film BR3 in the case of the above-described first embodiment and corresponding to the above-described barrier conductor film BR2 in the case of the above-described second and third embodiments) which prevents reactions with Cu in the copper wire and Al in the Al-containing conductive film AM1, a titanium (Ti) film is more advantageous than a nickel (Ni) film or a cobalt (Co) film.

Therefore, if a nickel (Ni) film, a cobalt (Co) film, or a laminated film thereof is employed as the barrier conductor film which prevents reactions with Cu in the copper wire and Al in the Al-containing conductive film AM1, it is desired to increase the thickness of the barrier conductor film and to thereby increase (compensate for) the barrier function. Therefore, the thickness ranges as described above (preferably 100 to 500 nm, more preferably 250 to 500 nm) are employed.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

In addition, a part of the details described in the above-described embodiments is described below.

[Additional Note 1]

A semiconductor device having:

a semiconductor chip having a pad and an insulating film having an opening exposing a part of the pad;

a copper wire electrically connected to the pad of the semiconductor chip; and a sealing resin portion sealing the semiconductor chip and the copper wire;

wherein the pad has an Al-containing conductive film containing aluminum as a main component;

in the opening, a first laminated film having a first conductor film and a second conductor film on the first conductor film is interposed between the copper wire and the Al-containing conductive film, and the copper wire is joined with the second conductor film;

the first conductor film is a single-layer film or a laminated film composed of one or more layer (s) selected from a titanium film, a titanium nitride film, a tantalum film, a tantalum nitride film, a tungsten film, a tungsten nitride film, a titanium tungsten film, a tantalum tungsten film, a nickel film, and a cobalt film;

the second conductor film is composed of one or more metal (s) selected from a group consisting of palladium, gold, ruthenium, rhodium, platinum, and iridium; and a height from an upper surface of the Al-containing conductive film to an upper surface of the second conductor film formed in the opening is lower than a height from the upper surface of the Al-containing conductive film to an upper surface of the insulating film formed on the Al-containing conductive film.

[Additional Note 2]

A method of manufacturing a semiconductor device including:

(a) a step of preparing a semiconductor substrate;

(b) a step of forming a first insulating film on a principal surface of the semiconductor substrate;

(c) a step of forming an Al-containing conductive film containing aluminum as a main component on the first insulating film;

(d) a step of patterning the Al-containing conductive film to form a pad;

(e) a step of forming a second insulating film on the first insulating film so as to cover the pad;

(f) a step of forming an opening in the second insulating film; and (g) a step of electrically connecting a copper wire to the pad exposed from the opening; wherein, after the step (c) and before the step (g), the method further includes (h) a step of forming a first conductor film on the Al-containing conductive film by a sputtering method;

after the step (h) and before the step (g), the method further includes (i) a step of forming a second conductor film on the first conductor film by a sputtering method;

the first conductor film is a single-layer film or a laminated film composed of one or more layer (s) selected from a titanium film, a titanium nitride film, a tantalum film, a tantalum nitride film, a tungsten film, a tungsten nitride film, a titanium tungsten film, a tantalum tungsten film, a nickel film, and a cobalt film;

the second conductor film is composed of one or more metal (s) selected from a group consisting of palladium, gold, ruthenium, rhodium, platinum, and iridium; and, in the step (g), the copper wire is joined with the second conductor film.

What is claimed is:

1. A semiconductor device, comprising:

a semiconductor substrate;

a first insulating film formed over the semiconductor substrate;

a pad formed over the first insulating film;

a second insulating film formed over the first insulating film so as to cover the pad; and an opening formed in the second insulating film to expose a part of the pad, wherein the pad comprises a pad to which a copper wire is to be electrically coupled and which includes an Al-containing conductive film containing aluminum as a main component, and wherein, over the Al-containing conductive film in a region overlapping the opening in a plan view, a first laminated film including a first conductor film, and a second conductor film over the first conductor film is formed, wherein the second conductor film is in an uppermost layer of the first laminated film, wherein the copper wire is bonded to the second conductor film, wherein the first conductor film is a single-layer film or a laminated film including one or more layers of films selected from a group consisting of a titanium film, a titanium nitride film, a tantalum film, a tantalum nitride film, a tungsten film, a tungsten nitride film, a titanium-tungsten film, and a tantalum-tungsten film, wherein the second conductor film comprises a palladium film, and wherein a height from an upper surface of the Al-containing conductive film to an upper surface of the second conductor film in the opening is less than a height from the upper surface of the Al-containing conductive film to an upper surface of the second insulating film formed over the Al-containing conductive film.

2. The semiconductor device according to claim 1, wherein the first conductor film includes a titanium film and, over the titanium film, the second conductor film is formed.

3. The semiconductor device according to claim 1, wherein the first conductor film comprises a titanium film.

4. The semiconductor device according to claim 1, wherein the second conductor film is formed by a sputtering method.

5. The semiconductor device according to claim 1, wherein, over a portion of the Al-containing conductive film which is covered with the second insulating film, the laminated film including the first conductor film, and the second conductor film over the first conductor film is not formed.

6. The semiconductor device according to claim 1, wherein the laminated film including the first conductor film, and the second conductor film over the first conductor film is formed over an entire upper surface of the Al-containing conductive film included in the pad.

* * * * *